(12) United States Patent
Shiraiwa et al.

(10) Patent No.: US 10,690,814 B2
(45) Date of Patent: Jun. 23, 2020

(54) LENS SUBSTRATE, SEMICONDUCTOR DEVICE, AND ELECTRONIC APPARATUS

(71) Applicant: SONY SEMICONDUCTOR SOLUTIONS CORPORATION, Kanagawa (JP)

(72) Inventors: Toshiaki Shiraiwa, Kanagawa (JP); Masaki Okamoto, Kanagawa (JP); Hiroyasu Matsugai, Kanagawa (JP); Hiroyuki Itou, Kanagawa (JP); Suguru Saito, Kanagawa (JP); Keiji Ohshima, Tokyo (JP); Nobutoshi Fujii, Kanagawa (JP); Hiroshi Tazawa, Kanagawa (JP); Minoru Ishida, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 77 days.

(21) Appl. No.: 15/747,302

(22) PCT Filed: Jul. 19, 2016

(86) PCT No.: PCT/JP2016/003372
§ 371 (c)(1),
(2) Date: Jan. 24, 2018

(87) PCT Pub. No.: WO2017/022193
PCT Pub. Date: Feb. 9, 2017

(65) Prior Publication Data
US 2018/0246258 A1     Aug. 30, 2018

(30) Foreign Application Priority Data
Jul. 31, 2015    (JP) .................................. 2015-152922

(51) Int. Cl.
*G02B 3/00* (2006.01)
*B29D 11/00* (2006.01)
(Continued)

(52) U.S. Cl.
CPC ...... *G02B 3/0062* (2013.01); *B29D 11/00307* (2013.01); *B29D 11/00375* (2013.01);
(Continued)

(58) Field of Classification Search
CPC ............ G02B 7/02–16; G02B 13/0085; G02B 26/00; G02B 26/08; G02B 26/0816;
(Continued)

(56) References Cited

U.S. PATENT DOCUMENTS 8,013,289 B2 * 9/2011 Chang .................. H04N 5/2253
250/208.1
8,294,229 B2 * 10/2012 Kang ................ H01L 27/14618
257/432

(Continued)

FOREIGN PATENT DOCUMENTS

CN    104319337    1/2015
JP    H05-077577   3/1993
(Continued)

OTHER PUBLICATIONS

International Search Report and Written Opinion prepared by the European Patent Office dated Nov. 2, 2016, for International Application No. PCT/JP2016/003372.
(Continued)

*Primary Examiner* — Nicholas R. Pasko
(74) *Attorney, Agent, or Firm* — Sheridan Ross P.C.

(57) ABSTRACT

Influence of chipping in case of dicing a plurality of stacked substrates is reduced. Provided is a semiconductor device where a substrate, in which a groove surrounding a pattern configured with a predetermined circuit or part is formed, is
(Continued)

stacked. The present technology can be applied to, for example, a stacked lens structure where through-holes are formed in each substrate and lenses are disposed in inner sides of the through-holes, a camera module where a stacked lens structure and a light-receiving device are incorporated, a solid-state imaging device where a pixel substrate and a control substrate are stacked, and the like.

20 Claims, 72 Drawing Sheets

(51) Int. Cl.
  *G02B 13/00* (2006.01)
  *H04N 5/225* (2006.01)
  *H01L 27/146* (2006.01)
(52) U.S. Cl.
  CPC ......... *G02B 3/0031* (2013.01); *G02B 3/0068* (2013.01); *G02B 3/0075* (2013.01); *G02B 13/0085* (2013.01); *H04N 5/2254* (2013.01); *B29D 11/00009* (2013.01); *H01L 27/14627* (2013.01)
(58) Field of Classification Search
  CPC ............ G02B 26/0825; G02B 26/0833; G02B 26/0875; G02B 3/0031; G02B 3/0062; G02B 3/0068; G02B 3/0075; B29D 11/0073; Y10T 156/1052; Y10T 156/1056; Y10T 156/1057
  USPC .................................. 359/703, 704, 819–830
  See application file for complete search history.

(56) References Cited

U.S. PATENT DOCUMENTS

| | | | | |
|---|---|---|---|---|
| 8,405,756 B2* | 3/2013 | Yano | ........................ | B26D 3/08 348/335 |
| 8,482,926 B2* | 7/2013 | Yano | .................... | G02B 3/0062 361/728 |
| 8,520,137 B2* | 8/2013 | Lee | .................... | G02B 13/0035 257/432 |
| 8,547,470 B2* | 10/2013 | Yano | ................ | B29D 11/00432 348/335 |
| 2004/0212719 A1* | 10/2004 | Ikeda | .................... | H04N 5/2254 348/340 |
| 2007/0221613 A1 | 9/2007 | Gutsche et al. | | |
| 2009/0159200 A1* | 6/2009 | Rossi | ................ | H01L 27/14618 156/292 |
| 2010/0073533 A1* | 3/2010 | Yano | ................ | B29D 11/00432 348/294 |
| 2010/0079635 A1 | 4/2010 | Yano et al. | | |
| 2010/0321802 A1 | 12/2010 | Kim et al. | | |
| 2011/0050978 A1* | 3/2011 | Yano | ........................ | B32B 37/12 348/335 |
| 2011/0050988 A1* | 3/2011 | Yano | .................... | G02B 13/001 348/374 |
| 2011/0063722 A1 | 3/2011 | Shyu et al. | | |
| 2011/0115058 A1 | 5/2011 | Mieczkowski et al. | | |
| 2011/0211105 A1* | 9/2011 | Yamada | ........... | B29D 11/00298 348/340 |
| 2011/0316108 A1* | 12/2011 | Nihei | ................ | H01L 27/14618 257/435 |
| 2013/0003199 A1 | 1/2013 | Jeong et al. | | |
| 2018/0203164 A1* | 7/2018 | Yamamoto | ....... | B29D 11/00307 |
| 2018/0217361 A1* | 8/2018 | Yoshioka | ............... | G02B 7/021 |

FOREIGN PATENT DOCUMENTS

| | | |
|---|---|---|
| JP | 2006-140404 | 6/2006 |
| JP | 2007-049066 | 2/2007 |
| JP | 2009-186686 | 8/2009 |
| JP | 2009-279790 | 12/2009 |
| JP | 2010-204635 | 9/2010 |
| JP | 2011-138089 | 7/2011 |
| JP | 2012-104753 | 5/2012 |
| JP | 2014-006329 | 1/2014 |
| JP | 2014-110279 | 6/2014 |

OTHER PUBLICATIONS

Official Action (with English translation) for Chinese Patent Application No. 201680043359.4, dated Jul. 4, 2019, 17 pages.
Official Action (no English translation available) for Japanese Patent Application No. 2015-152922, dated Aug. 1, 2019, 7 pages.
Official Action (with English translation) for Chinese Patent Application No. 201680043359.4, dated Jan. 17, 2020, 16 pages.
Official Action (no English translation available) for Japanese Patent Application No. 2015-152922, dated Mar, 3, 2020, 5 pages.

* cited by examiner

FIG. 1
A
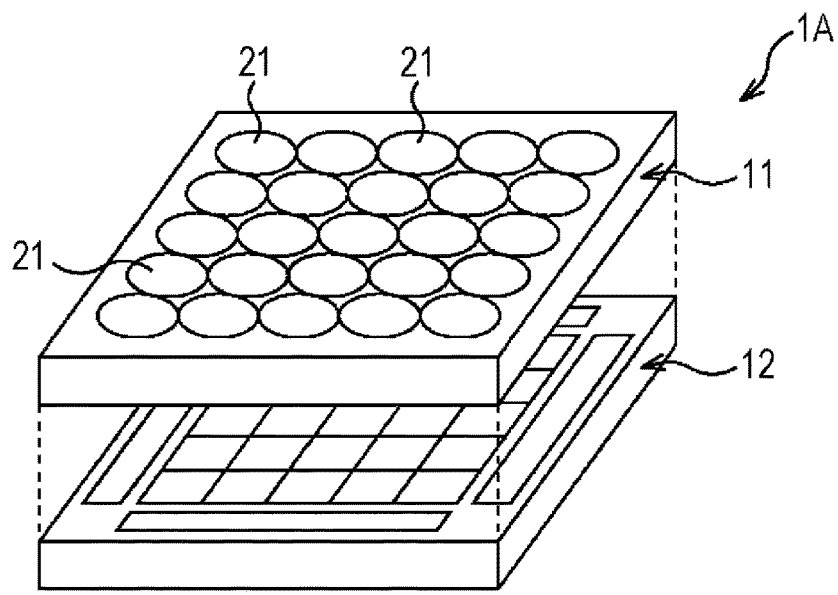
B
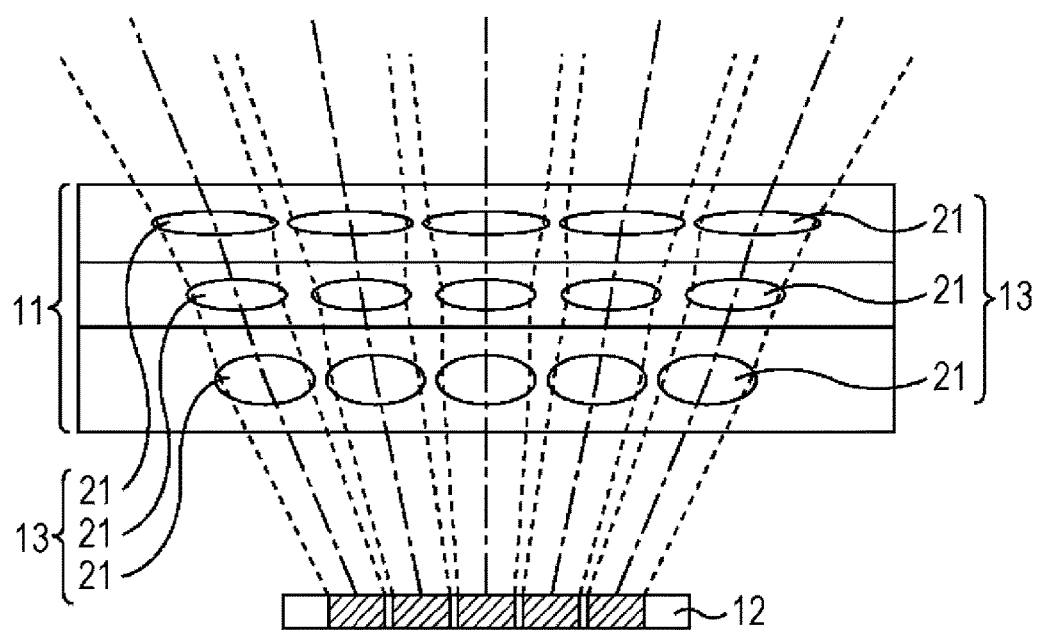

FIG. 46
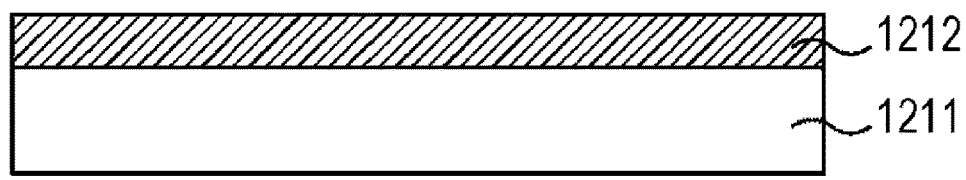
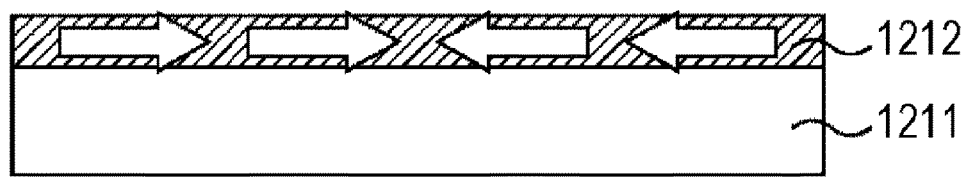
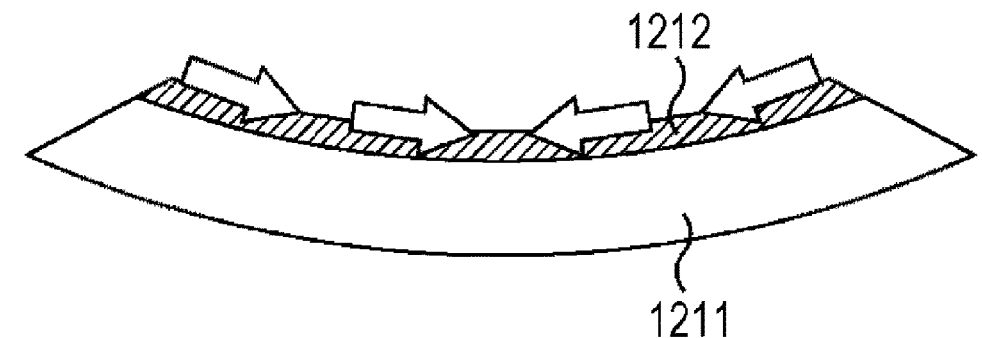

FIG. 47
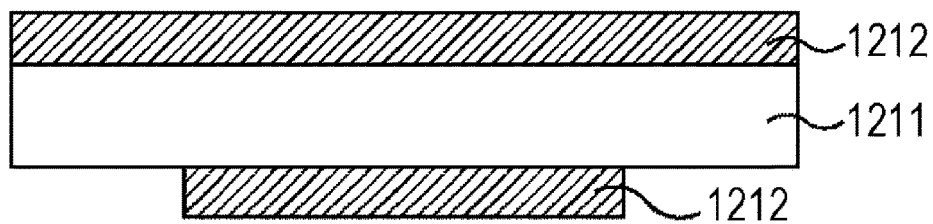
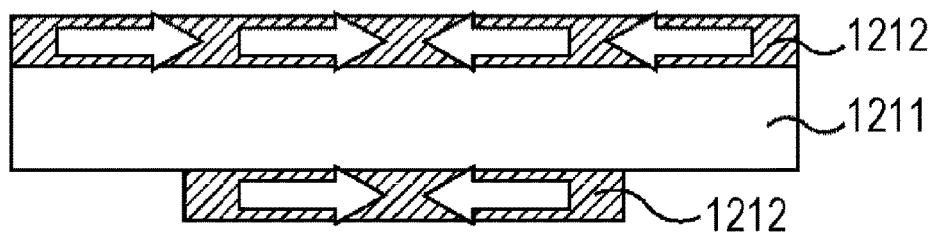
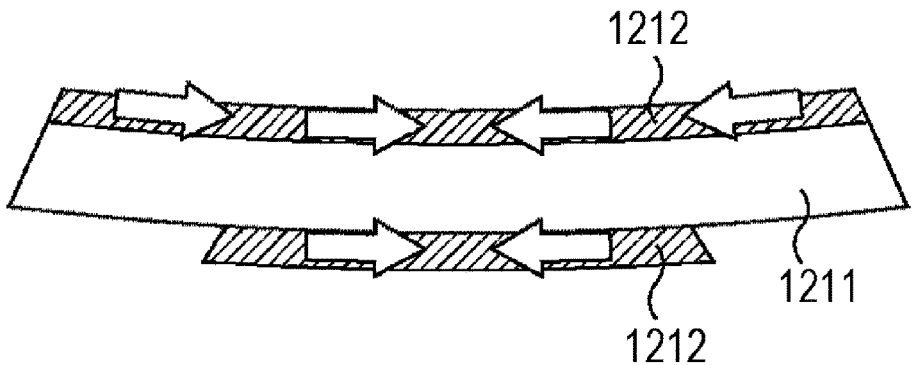

FIG. 48
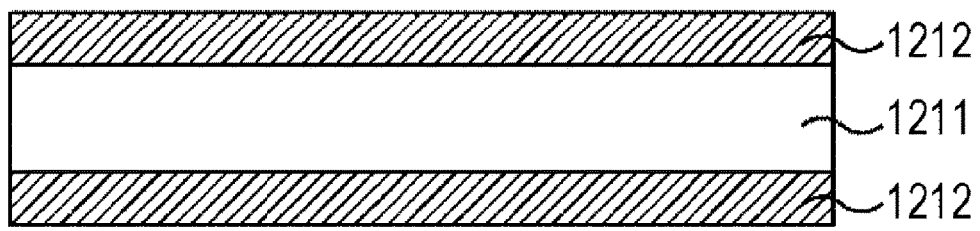
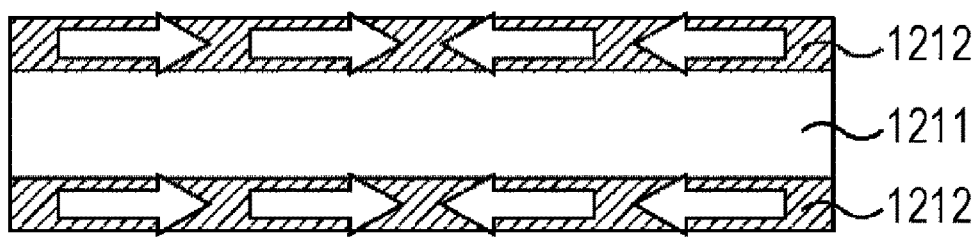
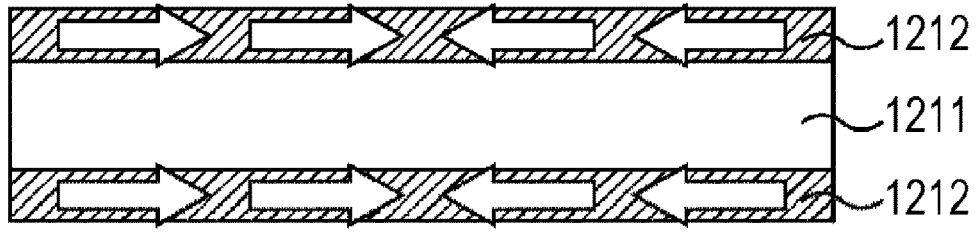

FIG. 68
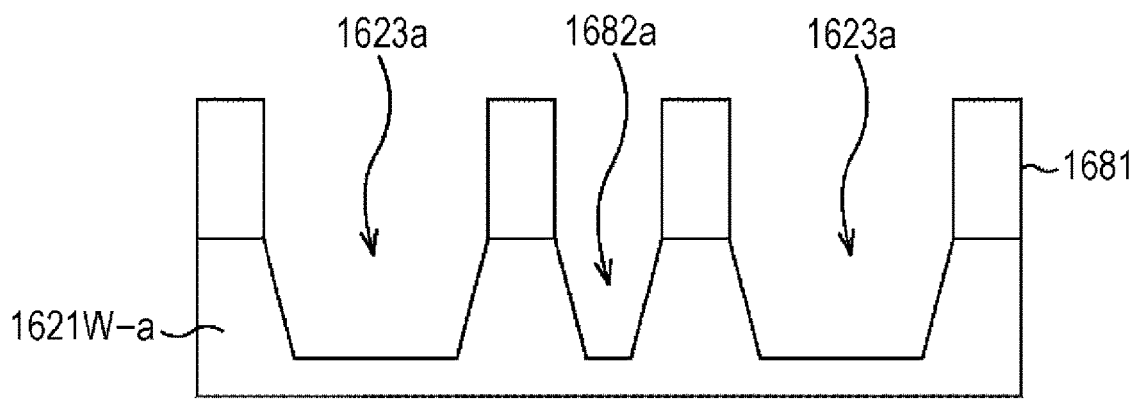
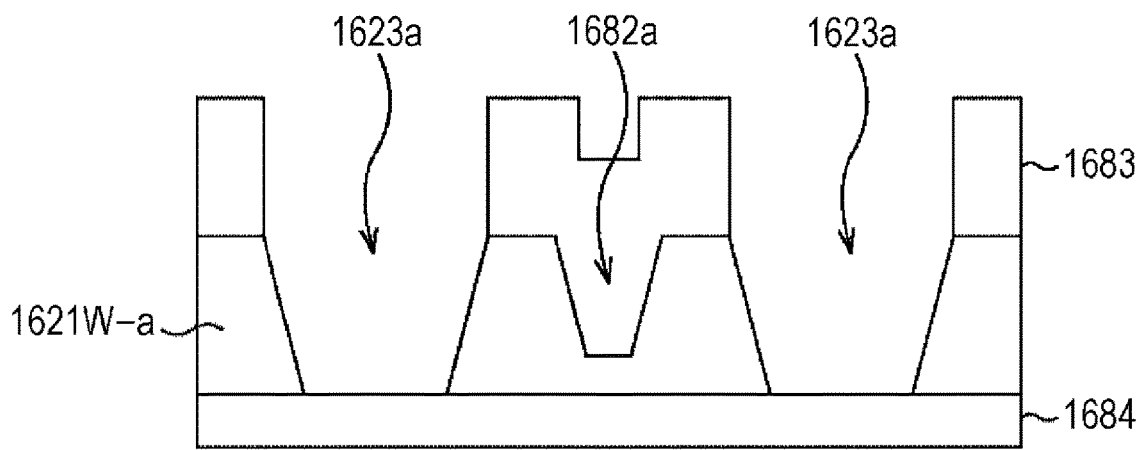

[Fig. 70]

LENS SUBSTRATE, SEMICONDUCTOR DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2016/003372 having an international filing date of 19 Jul. 2016, which designated the United States, which PCT application claimed the benefit of Japan Patent Application No. 2015-152922 filed 31 Jul. 2015, the disclosures of each of which are incorporated herein by reference.

TECHNICAL FIELD

The present technology relates to a semiconductor device, a manufacturing method therefor, and an electronic apparatus, and more particularly, to a semiconductor device suitable to be used in case of dicing a plurality of stacked substrates, a manufacturing method therefor, and an electronic apparatus.

CROSS REFERENCE TO RELATED APPLICATIONS

This application claims the benefit of Japanese Priority Patent Application JP 2015-152922 filed on Jul. 31, 2015, the entire contents of which are incorporated herein by reference.

Background Art

In a wafer-level lens process of arranging a plurality of lenses in planar directions of a wafer substrate, requirements for shape accuracy and position accuracy at the time of forming the lenses are strict. Particularly, a degree of difficulty of a process of manufacturing a stacked lens structure by stacking wafer substrates is very high, and in a mass production level, stacking of three or more layers has not been realized.

With respect to a wafer-level lens process, up to now, various technologies have been contrived and proposed. For example, PTL 1 discloses a method of stacking wafer substrates by using a lens material itself as an adhesive at the time of forming lenses by filling through-holes formed in the substrates with the lens material.

CITATION LIST

Patent Literature

PTL 1: JP 2009-279790 A

SUMMARY OF INVENTION

Technical Problem

However, in case of dicing wafer substrates after the stacking of the wafer substrates, there is a problem in that chipping generated in each wafer substrate reaches a through-hole to cause breakage of a stacked lens structure.

The present technology has been made in view of the foregoing, and it is desirable to reduce influence of chipping in case of dicing a plurality of stacked substrates.

Solution to Problem

According to a first aspect of the present technology, there is provided a lens substrate comprising: a substrate having a through-hole; a lens disposed in the through-hole; and a groove disposed adjacent to the through-hole in a cross-section view.

According to the first aspect of the present technology, there is provided a method of manufacturing a semiconductor device, the method comprising: forming a through-hole in a substrate; forming a lens in the through-hole; and forming a groove adjacent to the through-hole in a cross-section view.

According to the first aspect of the present technology, there is provided an electronic apparatus comprising: a camera module including a stacked lens structure, the stacked lens structure including: a plurality of substrates, each substrate of the plurality of substrates including: a through-hole with a lens disposed therein; and a groove disposed adjacent to the through-hole in a cross-section view.

In addition, the effects described herein are not necessarily limited, but any of the effects of the present disclosure may be available.

BRIEF DESCRIPTION OF DRAWINGS

FIG. 1 is a diagram illustrating an embodiment of a camera module using a stacked lens structure employing the present technology.

FIG. 46 is a diagram for explaining an effect obtained from a resin which is to be a lens.

FIG. 47 is a diagram for explaining an effect obtained from a resin which is to be a lens.

FIG. 48 is a schematic diagram illustrating a lens array substrate as Comparative Structure Example 6.

FIG. 68 is a diagram for explaining a second modified example of the manufacturing method for the stacked lens structure of FIG. 63.

DESCRIPTION OF EMBODIMENTS

Figure 2:
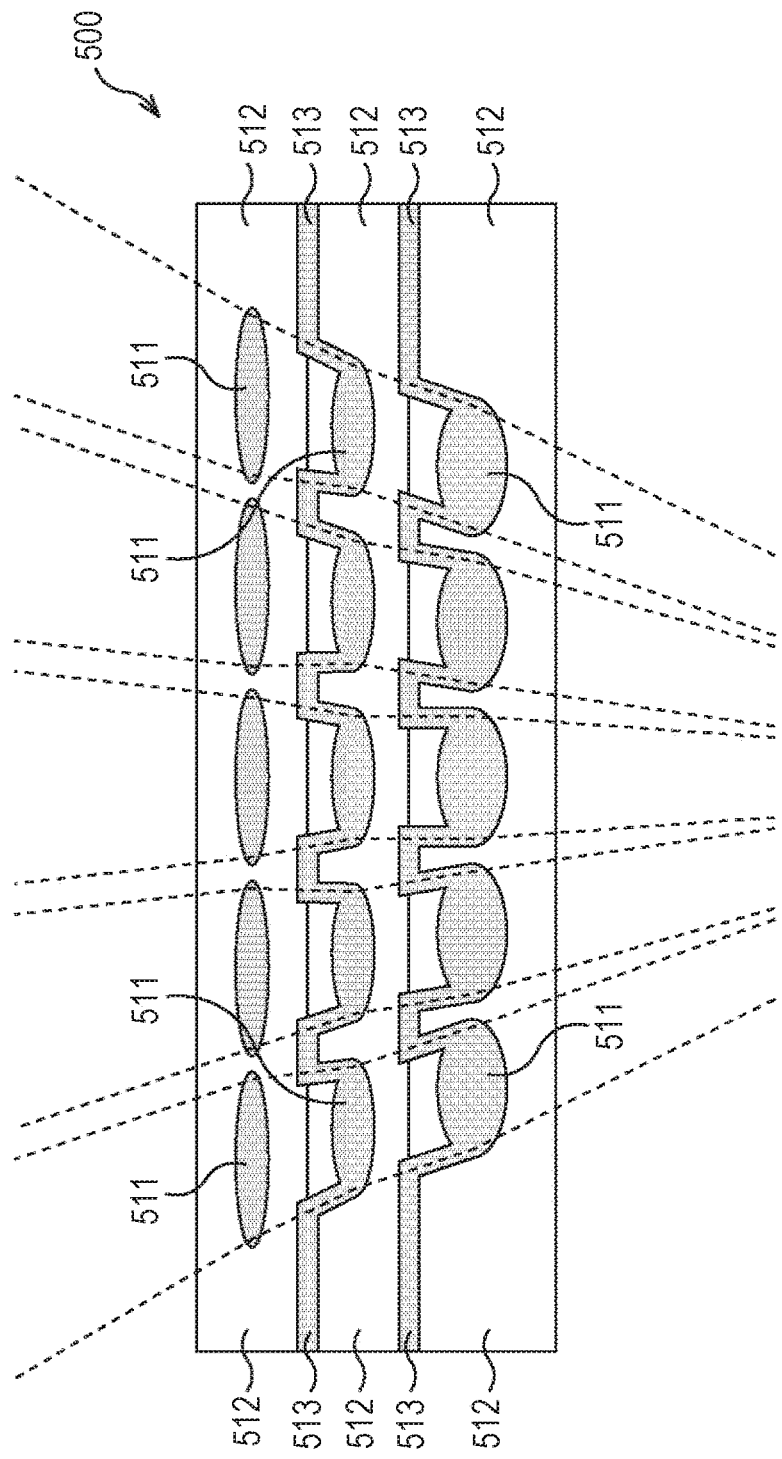
FIG. 2 is a cross-sectional structure diagram of a stacked lens structure disclosed in PTL 1.

Hereinafter, aspects (hereinafter, referred to embodiments) for embodying the present technology will be described. In addition, the description will be made in the following order.

1. First Embodiment of Camera Module
2. Second Embodiment of Camera Module

3. Third Embodiment of Camera Module
4. Fourth Embodiment of Camera Module
5. Fifth Embodiment of Camera Module
6. Detailed Configuration of Camera Module of Fourth Embodiment
7. Sixth Embodiment of Camera Module
8. Seventh Embodiment of Camera Module
9. Detailed Configuration of Lens-Attached Substrate
10. Manufacturing Method for Lens-Attached Substrate
11. Joining of Lens-Attached Substrates
12. Eighth and Ninth Embodiments of Camera Module
13. Tenth Embodiment of Camera Module
14. Eleventh Embodiment of Camera Module
15. Effects of Structure According to Embodiment of the Present Technology in Comparison with Other Structures
16. Various Modified Examples
17. Example of Application to Electronic Apparatus
18. Example of Use of Image Sensor 1. First Embodiment of Camera Module FIGS. 1A and 1B are diagrams illustrating a first embodiment of a camera module using a stacked lens structure employing the present technology.

FIG. 1A is a schematic diagram illustrating a configuration of a camera module 1A as the first embodiment of a camera module 1. FIG. 1B is a schematic cross-sectional diagram of the camera module 1A.

The camera module 1A is configured to include a stacked lens structure 11 and a light-receiving device 12. The stacked lens structure 11 is configured to include five optical units in each of the horizontal and vertical directions, namely, to include a total of twenty-five optical units 13. The optical unit 13 is configured to a plurality of lenses 21 in one optical axis direction. The camera module 1A is a compound-eye camera module including a plurality of optical units 13.

As illustrated in FIG. 1B, optical axes of a plurality of the optical units 13 provided to the camera module 1A are disposed so as to spread toward the outside of the module, so that it is possible to capture a wide-angle image.

In addition, in FIG. 1B, for the simplification, the stacked lens structure 11 is configured as a structure where only three layers of the lenses 21 are stacked, but it is obvious that more layers of the lenses 21 are preferably stacked.

The camera module 1A of FIGS. 1A and 1B can produce one wide-angle image by joining a plurality of images captured through a plurality of optical units 13. In order to join a plurality of the images, high accuracy is preferred for formation and arrangement of each optical unit 13 capturing each image. In addition, particularly, with respect to the optical unit 13 of the wide angle side, since an incident angle of light on the lens 21 is small, high accuracy is preferred for position relationship and arrangement of each lens 21 in the optical unit 13.

FIG. 2 is a cross-sectional structure diagram of the stacked lens structure using a fixing technique by a resin disclosed in PTL 1.

In a stacked lens structure 500 illustrated in FIG. 2, as a means of fixing substrates 512 provided with lenses 511, a resin 513 is used. The resin 513 is an energy curable resin such as a UV curable resin.

Before the substrates 512 are adhered to each other, a layer of the resin 513 is formed on the entire front surface of each substrate 512. After that, the substrates 512 are adhered to each other, and next, the resin 513 is cured. Therefore, the adhered substrates 512 are fixed to each other.

However, when the resin 513 is cured, the resin 513 is curing-contracted. In case of the structure illustrated in FIG. 2, since the resin 513 is cured after the layer of the resin 513 is formed on the entire substrate 512, an amount of shift of the resin 513 becomes large.

In addition, even after the stacked lens structure 500 formed by adhering the substrates 512 is diced and the camera module is formed by combining imaging devices thereto, as illustrated in FIG. 2, in the stacked lens structure 500 included in the camera module, the resin 513 exists in the all portions between the substrates 512 provided with the lenses 511. For this reason, when the camera module is installed in the case of the camera and is actually used, there is a possibility that the resin between the substrates of the stacked lens structure 500 is thermally expanded due to an increase in temperature according to heat releasing of the apparatus.

Figure 3:
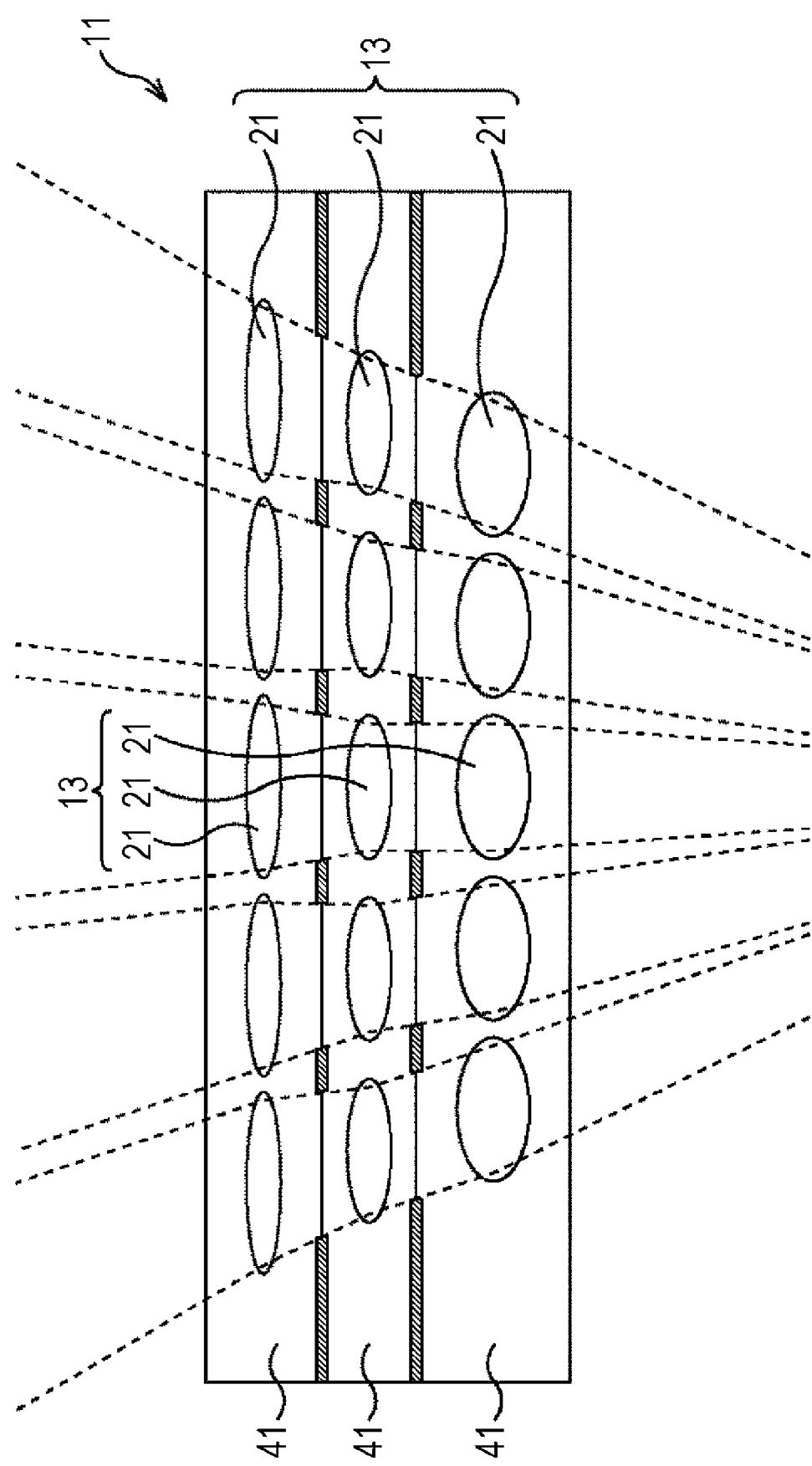
FIG. 3 is a cross-sectional structure diagram of the stacked lens structure of the camera module of FIG. 1.

FIG. 3 is a cross-sectional structure diagram illustrating only the stacked lens structure 11 of the camera module 1A of FIG. 1.

The stacked lens structure 11 of the camera module 1A is also formed by stacking a plurality of the lens-attached substrates 41 provided with the lenses 21.

In the stacked lens structure 11 of the camera module 1A, as a means for fixing the lens-attached substrates 41 provided with the lenses 21, used is a fixing unit entirely different from the stacked lens structure 500 of FIG. 2 or other stacked lens structures indicated in Citation List.

Figure 4:
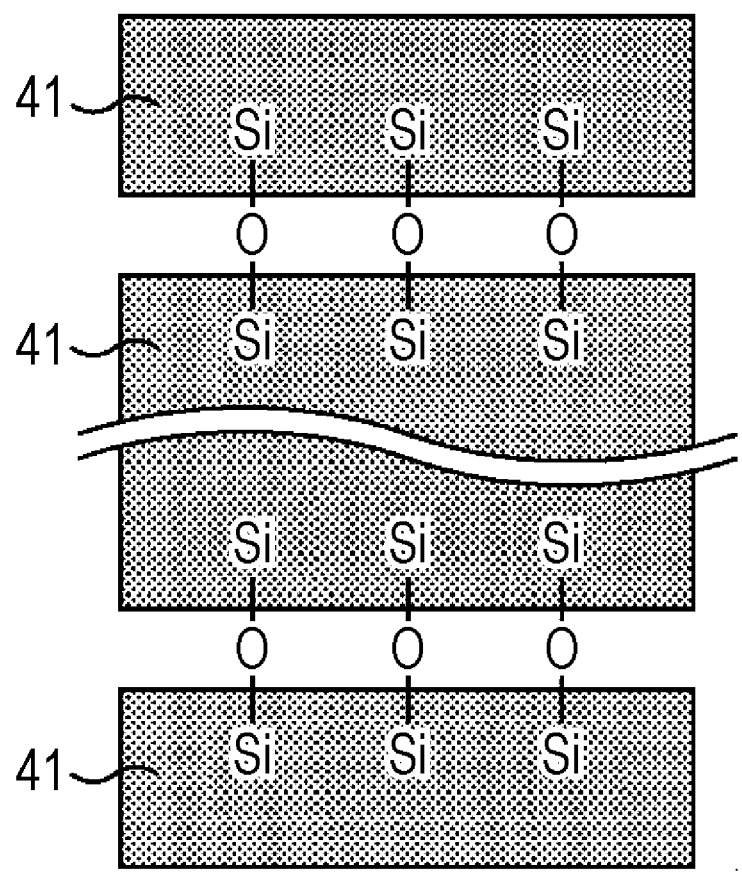
FIG. 4 is a diagram for explaining direct joining of lens-attached substrates.

Namely, the two lens-attached substrates 41 which are to be stacked are directly joined to each other by covalent bonds between a surface layer of an oxide or a nitride formed on a surface of the one substrate and a surface layer of an oxide or nitride formed on a surface of the other substrate. As a specific example, as illustrated in FIG. 4, silicon oxide films or silicon nitride films as surface layers are formed on the surfaces of the two lens-attached substrates 41 which are to be stacked, and hydroxyl groups are bonded thereto. After that, the two lens-attached substrates 41 are adhered to each other, and dehydration condensation is performed by increasing temperature. As a result, silicon-oxygen covalent bonds are formed between the surface layers of the two lens-attached substrates 41. Therefore, the two lens-attached substrates 41 are directly joined to each other. In addition, as a result of the condensation, covalent bonds may be directly formed between elements included in the two surface layers.

In this specification, in this manner, fixing of the two lens-attached substrates 41 through an inorganic film disposed between the two lens-attached substrates 41, fixing of the two lens-attached substrates 41 by chemically bonding inorganic films disposed on the surfaces of the two lens-attached substrates 41, fixing of the two lens-attached substrates 41 by forming bonds according to dehydration condensation between inorganic films disposed on the surfaces of the two lens-attached substrates 41, fixing of the two lens-attached substrates 41 by forming covalent bonds through oxygen or covalent bonds between elements included in inorganic films between the inorganic films disposed on the surfaces of the two lens-attached substrates 41, or fixing of the two lens-attached substrates 41 forming silicon-oxygen covalent bonds or silicon-silicon covalent bonds between silicon oxide layers or silicon nitride layers disposed on the surfaces of the two lens-attached substrates 41 are referred to as direct joining.

In order to perform the adhesion and the dehydration condensation by increasing temperature, in the embodiment, substrates used for a semiconductor device or a flat display device are used, lenses in a substrate state are formed, adhesion and dehydration condensation by increasing temperature are performed in a substrate state, and joining by covalent bonds is performed in a substrate state. Due to the structure obtained by joining the inorganic films formed on the surfaces of the two lens-attached substrates 41 by the covalent bonds, it is possible to obtain a function or an effect that deformation of the resin 513 over the entire substrates by curing-contraction or deformation of the resin 513 by thermal expansion in actual use, which is are problems in case of using the technology described with reference to FIG. 2 disclosed in PTL 1, is suppressed.

Figure 5:
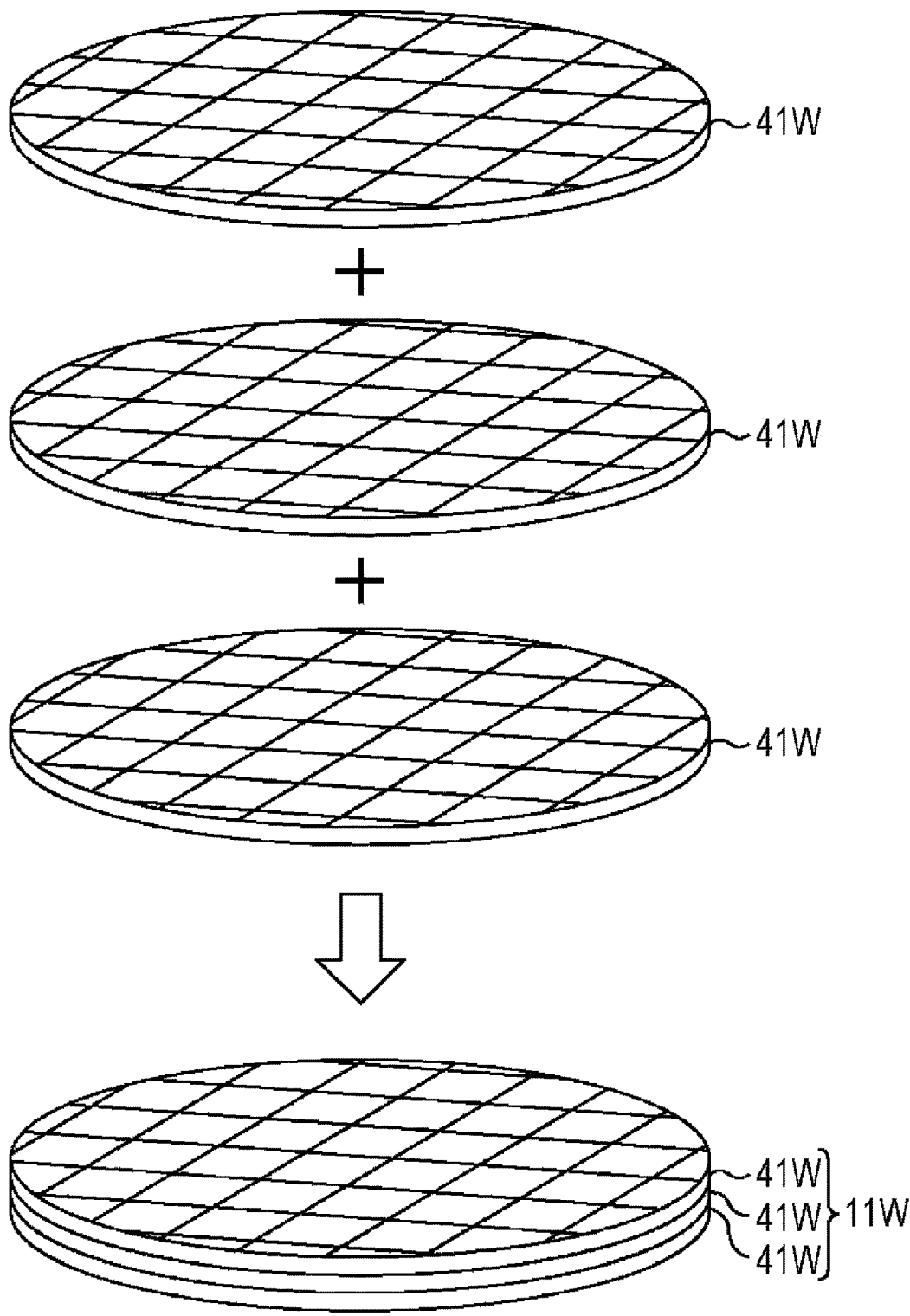
FIG. 5 is a diagram illustrating a process of forming a camera module of FIG. 1.
Figure 6:
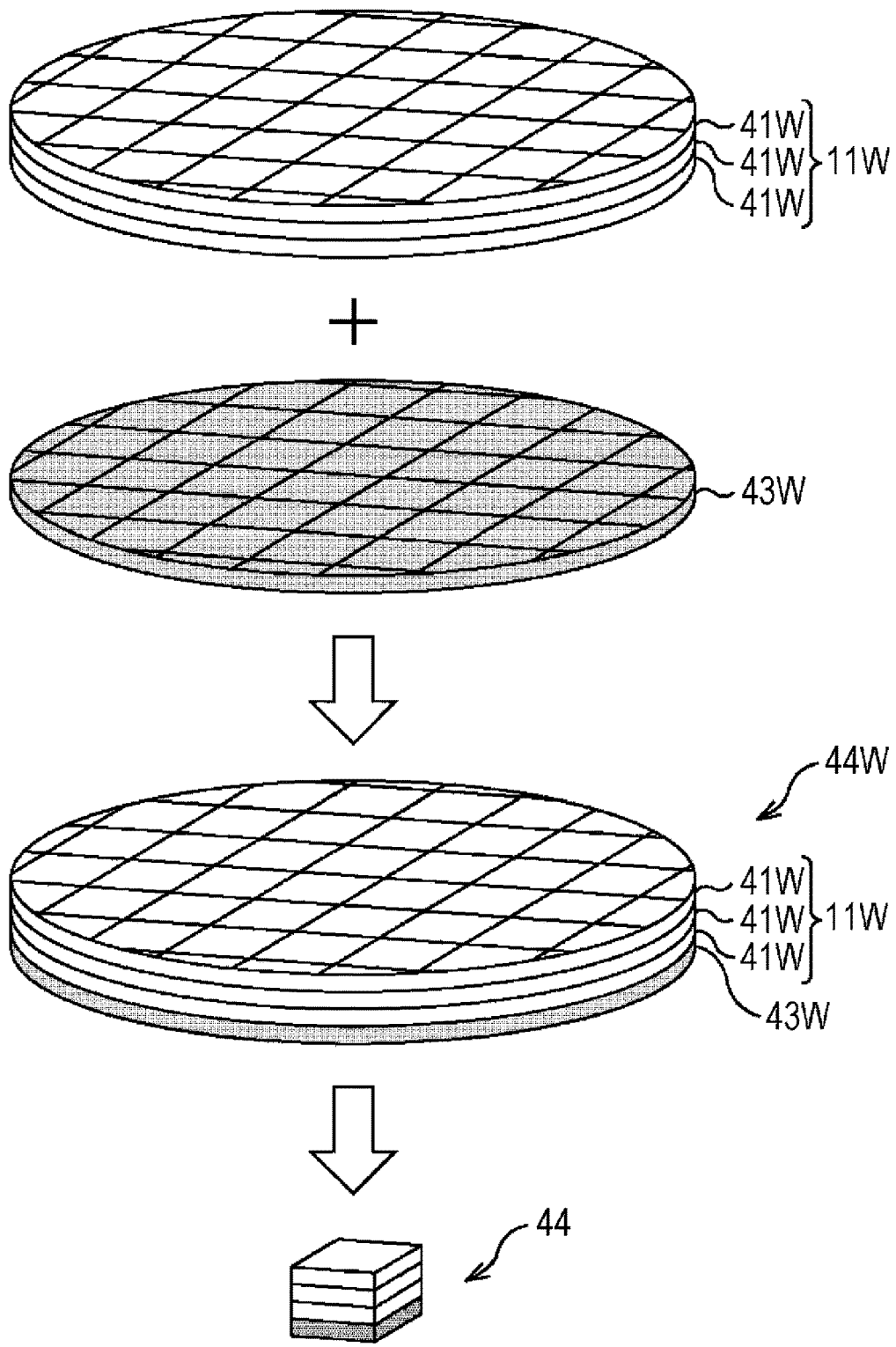
FIG. 6 is a diagram illustrating a process of forming the camera module of FIG. 1.

FIGS. 5 and 6 are diagrams illustrating a process of forming the camera module 1A of FIGS. 1A and 1B by combining the stacked lens structure 11 and the light-receiving device 12.

First, as illustrated in FIG. 5, a plurality of lens-attached substrates 41W where a plurality of lenses 21 (not shown) are formed in planar directions are prepared, and the lens-attached substrates are stacked. Therefore, the substrate-state stacked lens structure 11W where a plurality of the substrate-state lens-attached substrates 41W are stacked is obtained.

Next, as illustrated in FIG. 6, a substrate-state sensor substrate 43W where a plurality of the light-receiving devices 12 is formed in planar directions are manufactured separately from the substrate-state stacked lens structure 11W illustrated in FIG. 5 and are prepared.

Next, the substrate-state sensor substrate 43W and the substrate-state stacked lens structure 11W are stacked, and an external terminal is connected to each module of the adhered substrates, so that the substrate-state camera module 44W is obtained.

Finally, the substrate-state camera module 44W is diced in units of a module or a chip. The diced camera module 44 is sealed in a case (not shown) which is separately prepared, so that the camera module 44 as a final product is obtained.

In addition, in this specification and drawings, components such as the lens-attached substrate 41W of which reference numerals are attached with "W" denote that the components are in the substrate state (wafer state), and components such as the lens-attached substrate 41 of which reference numerals are not attached with "W" denote that the components are in the state that the components are diced in units of a module or a chip. These notations are similarly applied to the sensor substrate 43W, the camera module 44W, and the like.

Figure 7:
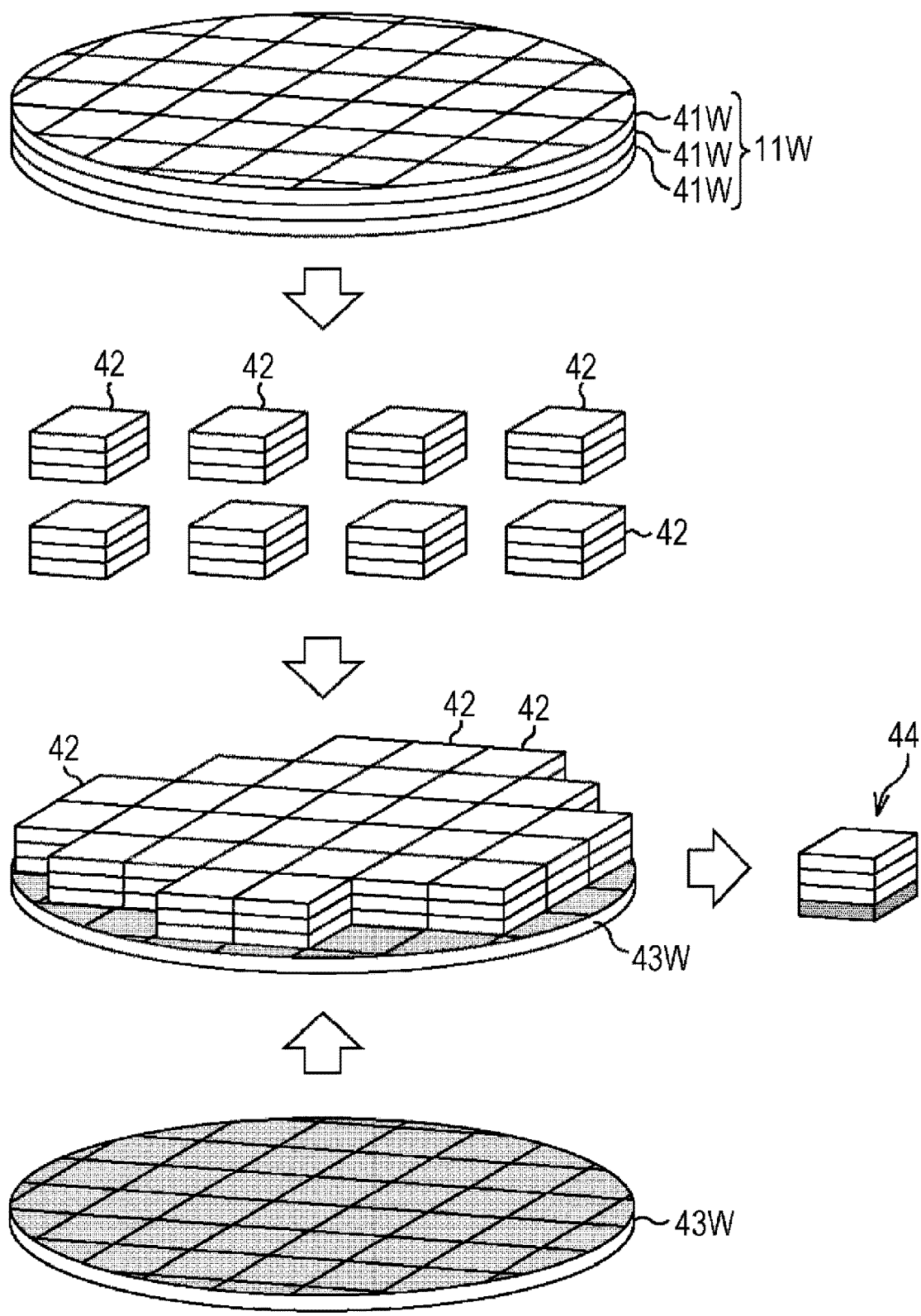
FIG. 7 is a diagram illustrating another process of forming the camera module of FIG. 1.

FIG. 7 is a diagram illustrating another process of forming camera module 1A of FIGS. 1A and 1B by combining the stacked lens structure 11 and the light-receiving device 12.

First, similarly to the above-described process, the substrate-state stacked lens structure 11W where a plurality of substrate-state lens-attached substrates 41W are stacked is manufactured.

Next, the substrate-state stacked lens structure 11W is diced.

In addition, separately from the substrate-state stacked lens structure 11W, the substrate-state sensor substrate 43W is manufactured and prepared.

Next, the diced stacked lens structure 11 is mounted one by one on each light-receiving device 12 of the substrate-state sensor substrate 43W.

Finally, the substrate-state sensor substrate 43W where the diced stacked lens structure 11 is mounted is diced in units of a module or a chip. The diced sensor substrate 43 where the stacked lens structure 11 is mounted is sealed in a case (not shown) which is separately prepared, and an external terminal is further connected thereto, so that the camera module 44 as a final product is obtained.

In addition, as an example of another process of forming the camera module 1A of FIGS. 1A and 1B by combining the stacked lens structure 11 and the light-receiving device 12, the substrate-state sensor substrate 43W illustrated in FIG. 7 is diced, the individual light-receiving devices 12 obtained as the result thereof are mounted on the diced stacked lens structures 11, so that the diced camera modules 44 may be obtained.

FIGS. 8A to 8H are diagrams for explaining a configuration of a lens-attached substrate 41 in the camera module 1A.

Figure 8:
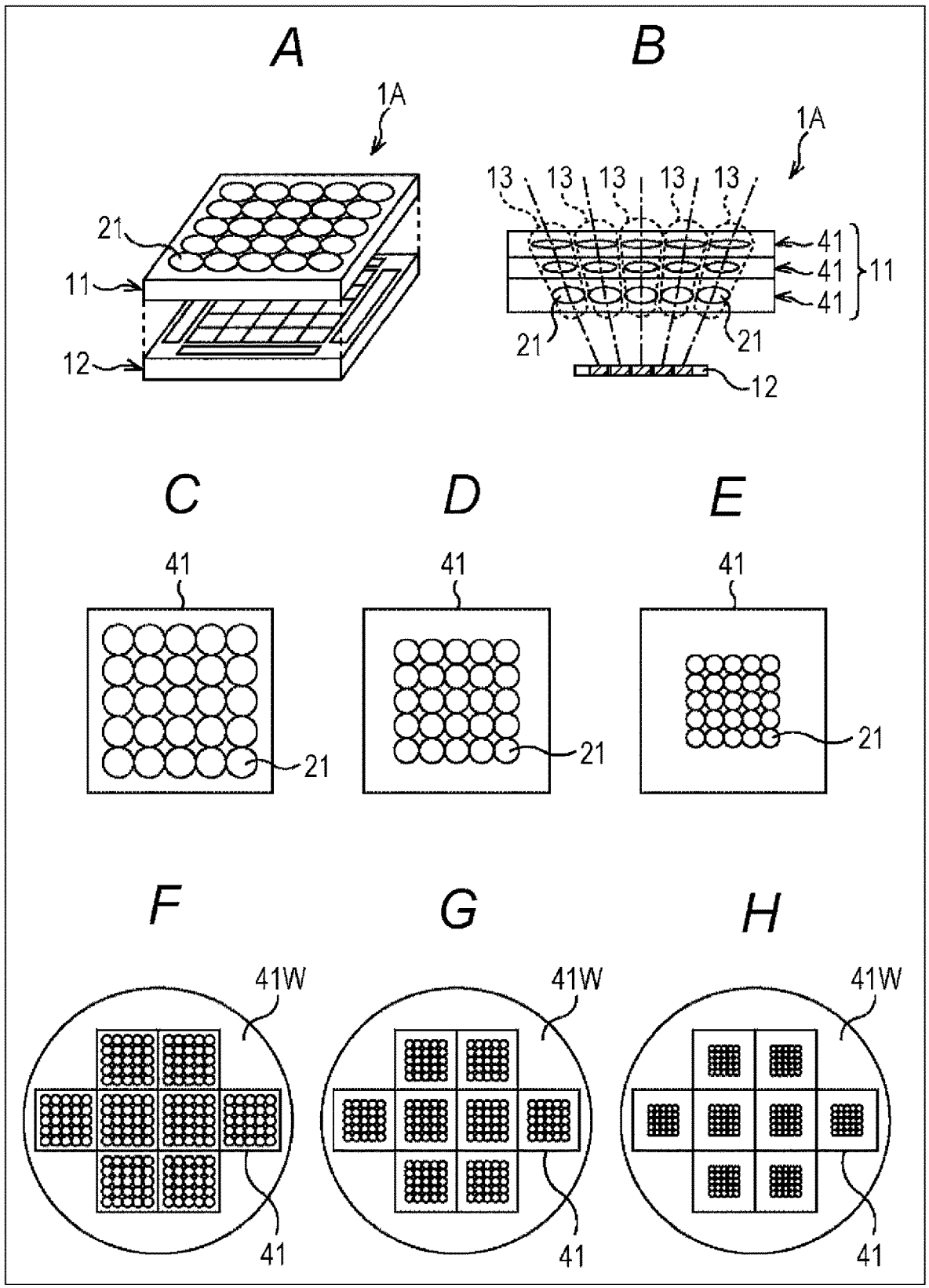
FIG. 8 is a diagram for explaining a configuration of a lens-attached substrate.

FIG. 8A is a schematic diagram illustrating the camera module 1A similarly to that of FIG. 1A.

FIG. 8B is a schematic cross-sectional diagram of the camera module 1A similarly to FIG. 1B.

As illustrated in FIG. 8B, the camera module 1A is a compound-eye camera module including a plurality of optical units 13 having one optical axis and being formed by combining a plurality of lenses 21. The stacked lens structure 11 is configured to include five optical units in each of the horizontal and vertical directions, namely, to include a total of twenty-five optical units 13.

In the camera module 1A, the optical axes of a plurality of the optical units 13 are disposed so as to spread toward the outside of the module, so that it is possible to capture a wide-angle image. In FIG. 8B, for the simplification, the stacked lens structure 11 is configured as a structure where only three layers of the lens-attached substrates 41 are stacked, but it is obvious that more layers of the lens-attached substrates 41 are preferably stacked.

FIGS. 8C to 8E are diagrams illustrating planar shapes of three layers of the lens-attached substrates 41 constituting the stacked lens structure 11.

FIG. 8C is a plan diagram of the lens-attached substrate 41 of the uppermost layer among the three layers, FIG. 8D is a plan diagram of the lens-attached substrate 41 of the middle layer, and FIG. 8E is a plan diagram of the lens-attached substrate 41 of the lowermost layer. Since the camera module 1 is a compound-eye wide-angle camera module, as it goes to the upper layer, the diameter of the lens 21 is increased, and the pitch between the lenses is spread.

FIGS. 8F to 8H are plan diagrams of the substrate-state lens-attached substrate 41W for obtaining the lens-attached substrates 41 illustrated in FIGS. 8C to 8E.

The lens-attached substrate 41W illustrated in FIG. 8F illustrates the substrate state corresponding to the lens-attached substrate 41 illustrated in FIG. 8C, the lens-attached substrate 41W illustrated in FIG. 8G illustrates the substrate state corresponding to the lens-attached substrate 41 illustrated in FIG. 8D, and the lens-attached substrate 41W illustrated in FIG. 8H illustrates the substrate state corresponding to the lens-attached substrate 41 illustrated in FIG. 8E.

The substrate-state lens-attached substrates 41W illustrated in FIGS. 8F to 8H are configured so that the eight camera modules 1A illustrated in FIG. 8A are obtained from one substrate.

It can be understood that, among the lens-attached substrates 41W illustrated in FIGS. 8F to 8H, the pitch between the lenses in the module-unit lens-attached substrate 41 is different between the upper-layer lens-attached substrate 41W and the lower-layer lens-attached substrate 41W, and on the other hand, in each of the lens-attached substrates 41W, the pitch of arranging the module-unit lens-attached substrates 41 is constant from the upper-layer lens-attached substrate 41W to the lower-layer lens-attached substrate 41W.

2. Second Embodiment of Camera Module

FIGS. 9A to 9H are diagrams illustrating a second embodiment of a camera module using a stacked lens structure employing the present technology.

FIG. 9A is a schematic diagram illustrating an outer appearance of a camera module 1B as the second embodiment of the camera module 1. FIG. 9B is a schematic cross-sectional diagram illustrating the camera module 1B.

The camera module 1B is configured to include two optical units 13. The two optical units 13 are provided with an aperture stop plate 51 on the uppermost layer of the stacked lens structure 11. Aperture portions 52 are installed in the aperture stop plate 51.

Although the camera module 1B includes the two optical units 13, the two optical units 13 have different optical parameters. Namely, the camera module 1B includes two types of optical units 13 having different optical performance. The two types of the optical units 13 may be, for example, a short-focal-length optical unit 13 for imaging a near view and a long-focal-length optical unit 13 for imaging a distant view.

In the camera module 1B, since the optical parameters of the two optical units 13 are different, for example, as illustrated in FIG. 9B, the number of lenses 21 is different between the two optical units 13. In addition, the lenses 21 of the same layer of the stacked lens structure 11 including the two optical units 13 may be configured so that one of a diameter, a thickness, a surface shape, a volume, and a distance to an adjacent lens is different. For this reason, for example, the planar shape of the lens 21 of the camera module 1B may have a structure as illustrated in FIG. 9C where the two optical units 13 have the lenses 21 having the same diameter, may have a structure as illustrated in FIG. 9D where the two optical units have the lenses 21 having different shapes, and may have a structure as illustrated in FIG. 9E where the one optical unit has no lens 21, that is, an empty cavity 21X.

FIGS. 9F to 9H are plan diagrams of the substrate-state lens-attached substrate 41W for obtaining the lens-attached substrates 41 illustrated in FIGS. 9C to 9E.

The lens-attached substrate 41W illustrated in FIG. 9F illustrates the substrate state corresponding to the lens-attached substrate 41 illustrated in FIG. 9C, the lens-attached substrate 41W illustrated in FIG. 9G illustrates the substrate state corresponding to the lens-attached substrate 41 illustrated in FIG. 9D, and the lens-attached substrate 41W illustrated in FIG. 9H illustrates the substrate state corresponding to the lens-attached substrate 41 illustrated in FIG. 9E.

The substrate-state lens-attached substrates 41W illustrated in FIGS. 9F to 9H are configured so that sixteen camera modules 1B illustrated in FIG. 9A are obtained from one substrate.

As illustrated in FIGS. 9F to 9H, in order to form the camera module 1B, on the entire substrate surface of the substrate-state lens-attached substrate 41W, the lenses having the same shape may be formed, the lenses having different shapes may be formed, or the lenses may or may not be formed.

3. Third Embodiment of Camera Module

FIGS. 10A to 10F are diagrams illustrating a third embodiment of a camera module using a stacked lens structure employing the present technology.

Figure 10:
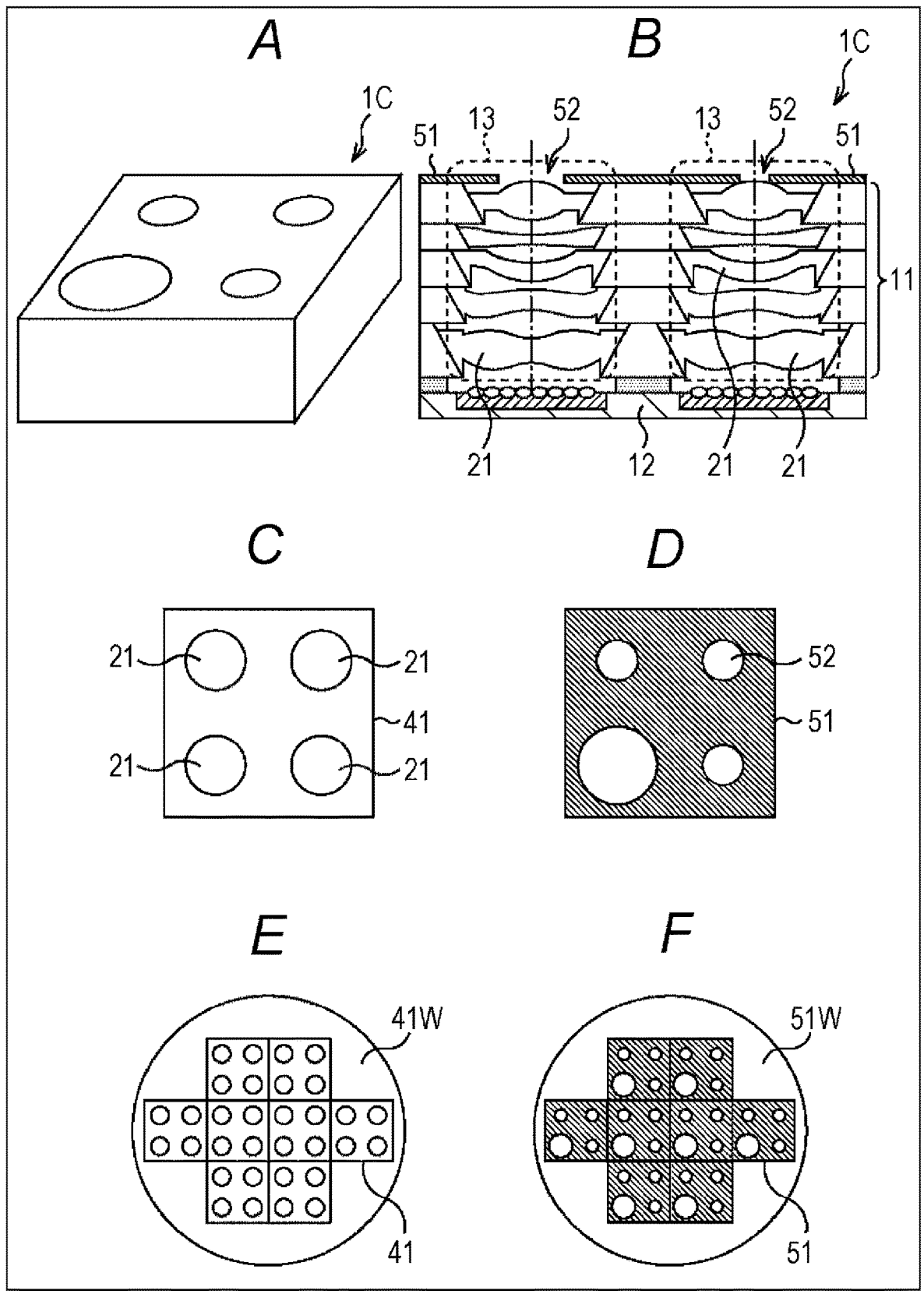
FIG. 10 is a diagram illustrating a third embodiment of a camera module using a stacked lens structure employing the present technology.

FIG. 10A is a schematic diagram illustrating an outer appearance of a camera module 1C as a third embodiment of the camera module 1. FIG. 10B is a schematic cross-sectional diagram of the camera module 1C.

The camera module 1C is configured to include two optical units 13 in each of the horizontal and vertical directions on a light incident surface, namely, to include a total of four optical units. Among the four optical units 13, the shapes of the lenses 21 are set to be the same.

Although the four optical units 13 have the aperture stop plates 51 on the uppermost layer of the stacked lens structure 11, the sizes of the aperture portions 52 of the aperture stop plates 51 are different among the four optical units 13. Therefore, with respect to the camera module 1C, it is possible to implement, for example, the following camera module 1C. Namely, for example, in a surveillance camera for crime prevention, in a camera module 1C using a light-receiving device 12 including light-receiving pixels for daytime color image surveillance which are provided with three types of R, G, and B color filters to receive three types of R, G, and B light beams and light-receiving pixels for nighttime black-and-white image surveillance which are not provided with R, G, and B color filters, with respect to only pixels capturing white-and-black images in the nighttime when illuminance is low, the size of the aperture of the aperture stop can be increased. For this reason, for example, the planar shape of the lenses 21 in the one camera module 1C is configured so that, as illustrated in FIG. 10C, the diameters of the lenses 21 provided to the four optical units 13 are the same, and as illustrated in FIG. 10D, the sizes of the aperture portions 52 of the aperture stop plates 51 are different among the optical units 13.

FIG. 10E is a plan diagram of the substrate-state lens-attached substrate 41W for obtaining the lens-attached substrate 41 illustrated in FIG. 10C. FIG. 10F is a plan diagram of the substrate-state aperture stop plates 51W for obtaining the aperture stop plate 51 illustrated in FIG. 10D.

The substrate-state lens-attached substrates 41W of FIG. 10E and the substrate-state aperture stop plates 51W of FIG. 10F are configured so that the eight camera modules 1C illustrated in FIG. 10A are obtained from one substrate.

As illustrated in FIG. 10F, in the substrate-state aperture stop plates 51W, in order to form the camera module 1C, the sizes of the aperture portions 52 are set to be different among the optical units 13 provided to the camera module 1C.

4. Fourth Embodiment of Camera Module

FIGS. 11A to 11D illustrate a fourth embodiment of a camera module using a stacked lens structure employing the present technology.

Figure 11:
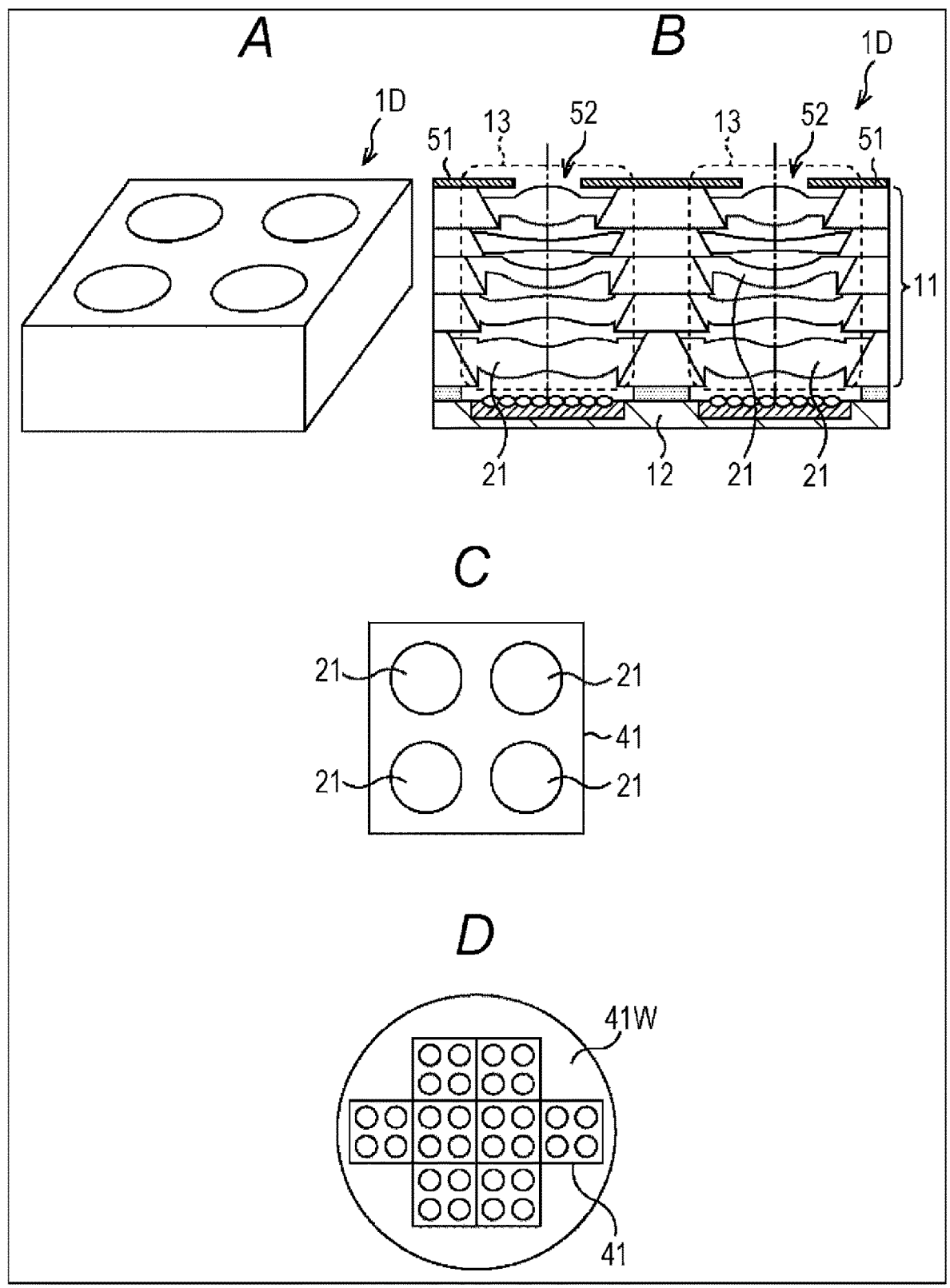
FIG. 11 is a diagram illustrating a fourth embodiment of a camera module using a stacked lens structure employing the present technology.

FIG. 11A is a schematic diagram illustrating an outer appearance of a camera module 1D as a fourth embodiment of the camera module 1. FIG. 11B is a schematic cross-sectional diagram of the camera module 1D.

Similarly to the camera module 1C, the camera module 1D is configured to include two optical units 13 in each of the horizontal and vertical directions on a light incident surface, namely, to include a total of four optical units. Among the four optical units 13, the shapes of the lenses 21 and the sizes of the aperture portions 52 of the aperture stop plates 51 are set to be the same.

The camera module 1D is configured so that the optical axes of the two optical units 13 disposed in each of the horizontal and vertical directions of the light incident surface extend in the same direction. The one-dotted dash lines illustrated in FIG. 11B indicate the optical axes of the optical units 13. The camera module 1D having such a configuration is appropriate for capturing a high-resolution image in comparison with capturing by one optical unit 13 using ultra-resolution technique.

In the camera module 1D, while the optical axes in each of the horizontal and vertical directions are directed toward the same direction, images can be captured by a plurality of the light-receiving devices 12 disposed at different positions, or images can be captured by light-receiving pixels of different regions in the one light-receiving device 12, so that it is possible to obtain a plurality of images which are not necessarily the same while the optical axes are directed toward the same direction. By matching image data at each of the positions of a plurality of images which are not the same, it is possible to obtain a high-resolution image. For this reason, it is preferable that the planar shapes of the lenses 21 in the one camera module 1D are the same among the four optical units 13 as illustrated in FIG. 11C.

FIG. 11D is a plan diagram of the substrate-state lens-attached substrate 41W for obtaining the lens-attached substrate 41 illustrated in FIG. 11C. The substrate-state lens-attached substrate 41W is configured so that the eight camera modules 1D illustrated in FIG. 11A are obtained from one substrate.

As illustrated in FIG. 11D, in the substrate-state lens-attached substrate 41W, in order form the camera module 1D, the camera module 1D is configured to include a plurality of lenses 21, and a plurality of lens groups for one module are disposed on the substrate with a certain pitch.

5. Fifth Embodiment of Camera Module

FIGS. 12A to 12D are diagrams illustrating a fifth embodiment of a camera module using a stacked lens structure employing the present technology.

Figure 12:
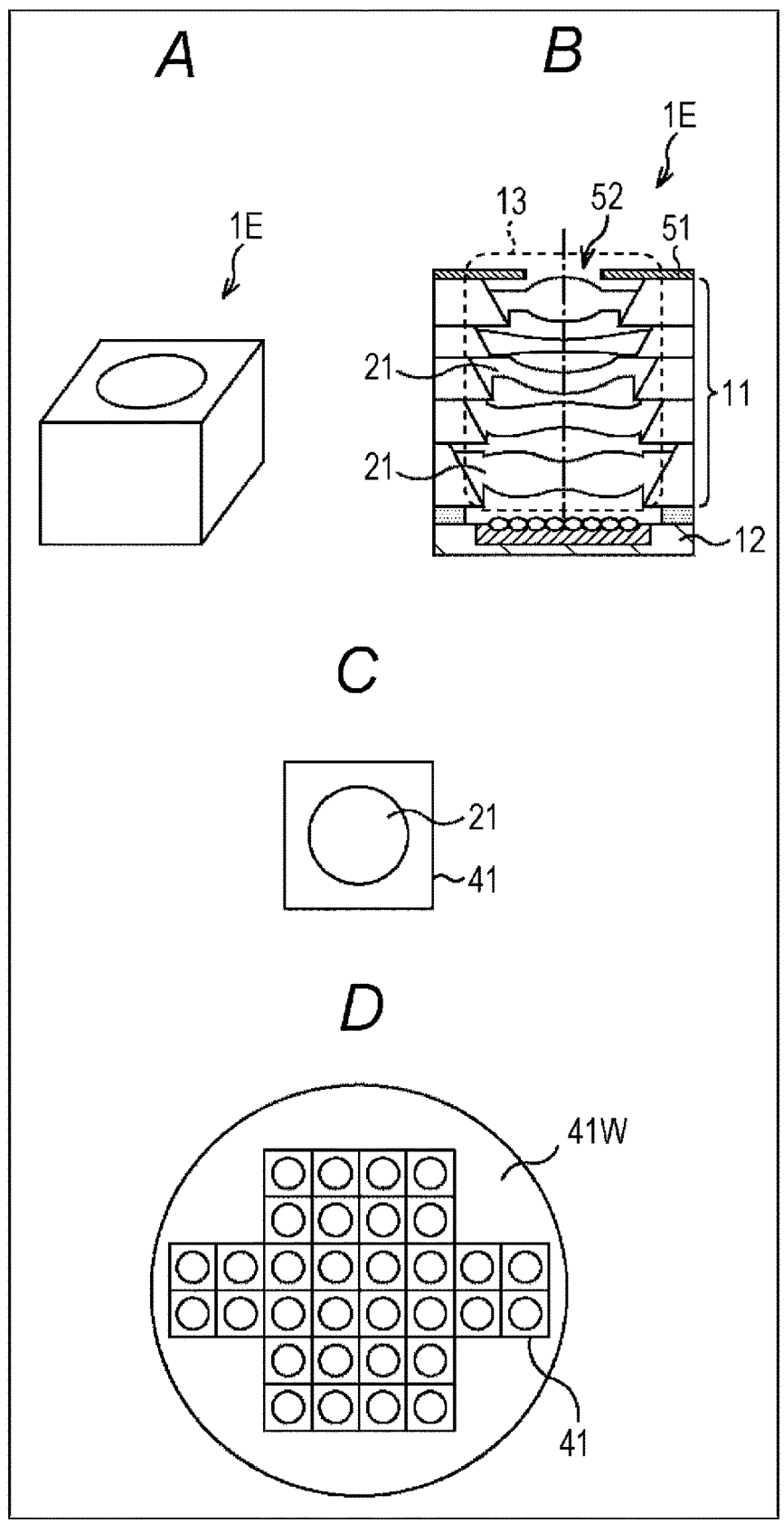
FIG. 12 is a diagram illustrating a fifth embodiment of a camera module using a stacked lens structure employing the present technology.

FIG. 12A is a schematic diagram illustrating an outer appearance of a camera module 1E as a fifth embodiment of the camera module 1. FIG. 12B is a schematic cross-sectional diagram of the camera module 1E.

The camera module 1E is a monoscopic camera module where an optical unit 13 having one optical axis is provided to one camera module 1E.

FIG. 12C is a plan diagram of a lens-attached substrate 41 illustrating a planar shape of a lens 21 in the camera module 1E. The camera module 1E is configured to include one optical unit 13.

FIG. 12D is a plan diagram of the substrate-state lens-attached substrate 41W for obtaining the lens-attached substrate 41 illustrated in FIG. 12C. The substrate-state lens-attached substrate 41W is configured so that the thirty-two camera modules 1E illustrated in FIG. 12A are obtained from one substrate.

As illustrated in FIG. 12D, in the substrate-state lens-attached substrate 41W, a plurality of the lenses 21 for the camera modules 1E are disposed on the substrate with a certain pitch.

6. Detailed Configuration of Camera Module According to Fourth Embodiment

Next, detailed configuration of the camera module 1D according to the fourth embodiment illustrated in FIGS. 11A to 11D will be described with reference to FIG. 13.

Figure 13:
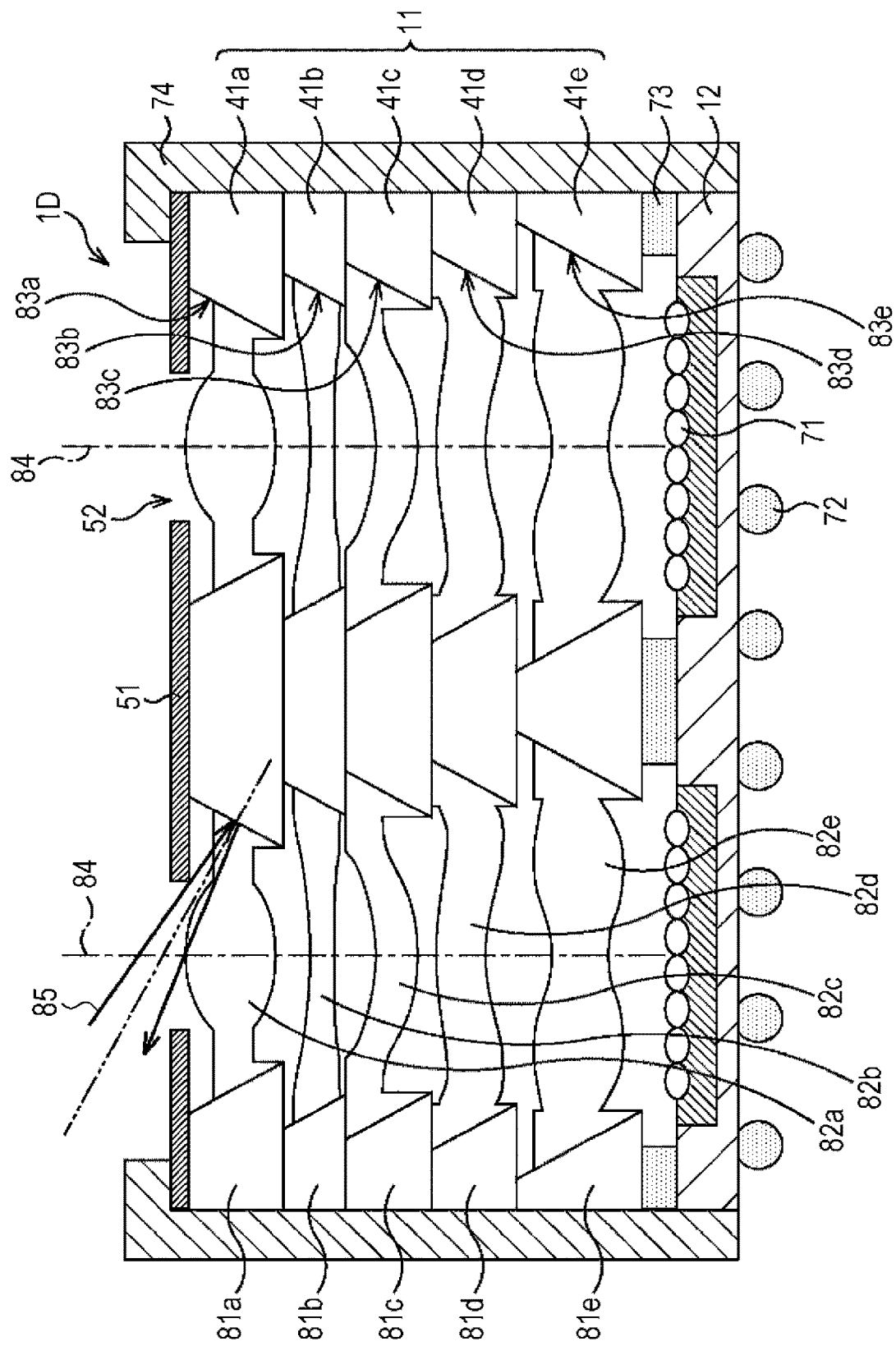
FIG. 13 is a diagram for explaining a detailed configuration of the camera module according to the fourth embodiment.

FIG. 13 is a cross-sectional diagram of the camera module 1D illustrated in FIG. 11B.

The camera module 1D is configured to include a stacked lens structure 11 where a plurality of the lens-attached substrates 41a to 41e are stacked and the light-receiving device 12. The stacked lens structure 11 includes a plurality of the optical units 13. The one-dotted dash lines 84 indicate the optical axes of the optical units 13. The light-receiving device 12 is disposed under the stacked lens structure 11. In the camera module 1D, light incident from the upper side into the camera module 1D transmits the stacked lens structure 11 and is received by the light-receiving device 12 disposed under the stacked lens structure 11.

The stacked lens structure 11 includes the five stacked lens-attached substrates 41a to 41e. If not particularly distinguished from each other, the five lens-attached substrates 41a to 41e is simply indicated as the lens-attached substrate 41 in the description.

The cross-section shape of the through-hole 83 of each of the lens-attached substrates 41 constituting the stacked lens structure 11 is the so-called tapered-down shape where the opening width is decreased toward the lower side (the side where the light-receiving device 12 is disposed).

The aperture stop plate 51 is disposed on the stacked lens structure 11. The aperture stop plate 51 is configured to include a layer formed with, for example, a material having light absorbing property or light-shielding property. The aperture portion 52 is installed in the aperture stop plate 51.

The light-receiving device 12 is configured with, for example, a front-side illumination type or back-side illumination type CMOS (Complementary Metal Oxide Semiconductor) image sensor. An on-chip lens 71 is formed on the upper surface of the light-receiving device 12 which is closer to the stacked lens structure 11, and external terminals 72 of inputting and outputting signals are formed on the lower surface of the light-receiving device 12.

The stacked lens structure 11, the light-receiving device 12, the aperture stop plate 51, and the like are accommodated in a lens barrel 74.

A structural material 73 is disposed on the upper side of the light-receiving device 12. The stacked lens structure 11 and the light-receiving device 12 are fixed to each other through the structural material 73. The structural material 73 is, for example, an epoxy-based resin.

In the embodiment, although the stacked lens structure 11 is configured to include the five stacked lens-attached substrates 41a to 41e, the number of stacked lens-attached substrates 41 is not particularly limited if the number is two or more.

Each lens-attached substrate 41 constituting the stacked lens structure 11 is configured so that a lens resin portion 82 is added to a carrier substrate 81. The carrier substrate 81 has a through-hole 83, and the lens resin portion 82 is formed inside the through-hole 83. The lens resin portion 82 includes the above-described lenses 21 and represents the portion extending to the carrier substrate 81 to support the lenses 21 and the portion integrated with the material constituting the lenses 21.

In addition, in case of distinguishing the carrier substrates 81, the lens resin portions 82, or the through-holes 83 of the lens-attached substrates 41a to 41e, as illustrated in FIG. 13, these are indicated as carrier substrates 81a to 81e, lens resin portions 82a to 82e, or through-holes 83a to 83e to correspond to the lens-attached substrates 41a to 41e in the description.

<Detailed Description of Lens Resin Portion>

Next, a shape of the lens resin portion 82 will be described by exemplifying the lens resin portion 82a of the lens-attached substrate 41a.

Figure 14:
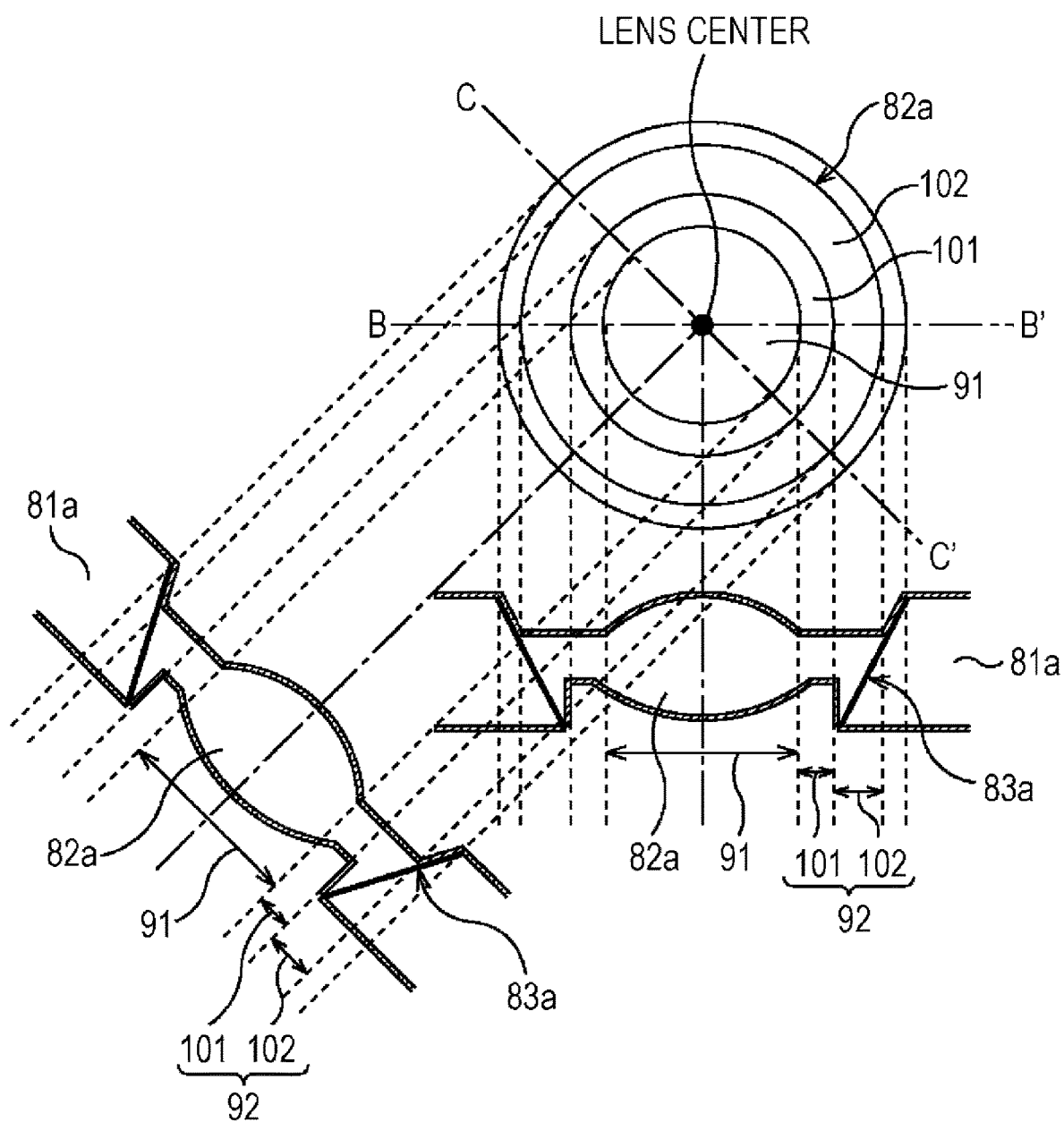
FIG. 14 illustrates a plan diagram and cross-sectional diagrams of a carrier substrate and a lens resin portion.

FIG. 14 illustrates a plan diagram and cross-sectional diagrams of the carrier substrate 81a and the lens resin portion 82a constituting the lens-attached substrate 41a.

The cross-sectional diagrams of the carrier substrate 81a and the lens resin portion 82a illustrated in FIG. 14 are cross-sectional diagrams taken along lines B-B' and C-C' illustrated in the plan diagram.

The lens resin portion 82a is a portion formed to be integrated with the material constituting the lens 21 and includes a lens portion 91 and a carrying portion 92. In the above description, the lens 21 corresponds to the lens portion 91 or the entire lens resin portion 82a.

The lens portion 91 is a portion having performance as a lens, in other words, a "portion of refracting light to converge or diverge" or a "portion having a curved surface such as a convex plane, a concave plane, or an aspherical plane or a portion formed by consecutively arranging a plurality of polygons used as lenses using a Fresnel screen or a diffraction grating".

The carrying portion 92 is a portion extending from the lens portion 91 to the carrier substrate 81a to support the lens portion 91. The carrying portion 92 is configured with an arm portion 101 and a leg portion 102 and is located in an outer circumference of the lens portion 91.

The arm portion 101 is disposed at the outer side of the lens portion 91 to be in contact with the lens portion 91 and extends from the lens portion 91 toward the outside with a certain thickness. The leg portion 102 is a portion of the carrying portion 92 other than the arm portion 101 and is a portion including the portion being in contact with the sidewall of the through-hole 83a. It is preferable that the leg portion 102 is thicker than the arm portion 101 in terms of the thickness of the resin.

The planar shape of the through-hole 83a formed in the carrier substrate 81a is a circle, and the cross-section shape is naturally the same irrespective of the direction of the diameter. The shape of the lens resin portion 82a which is a shape defined according to the forms of the upper and lower mold frames in the lens formation period is also formed so that the cross-section shape is the same irrespective of the direction of the diameter.

Figure 15:
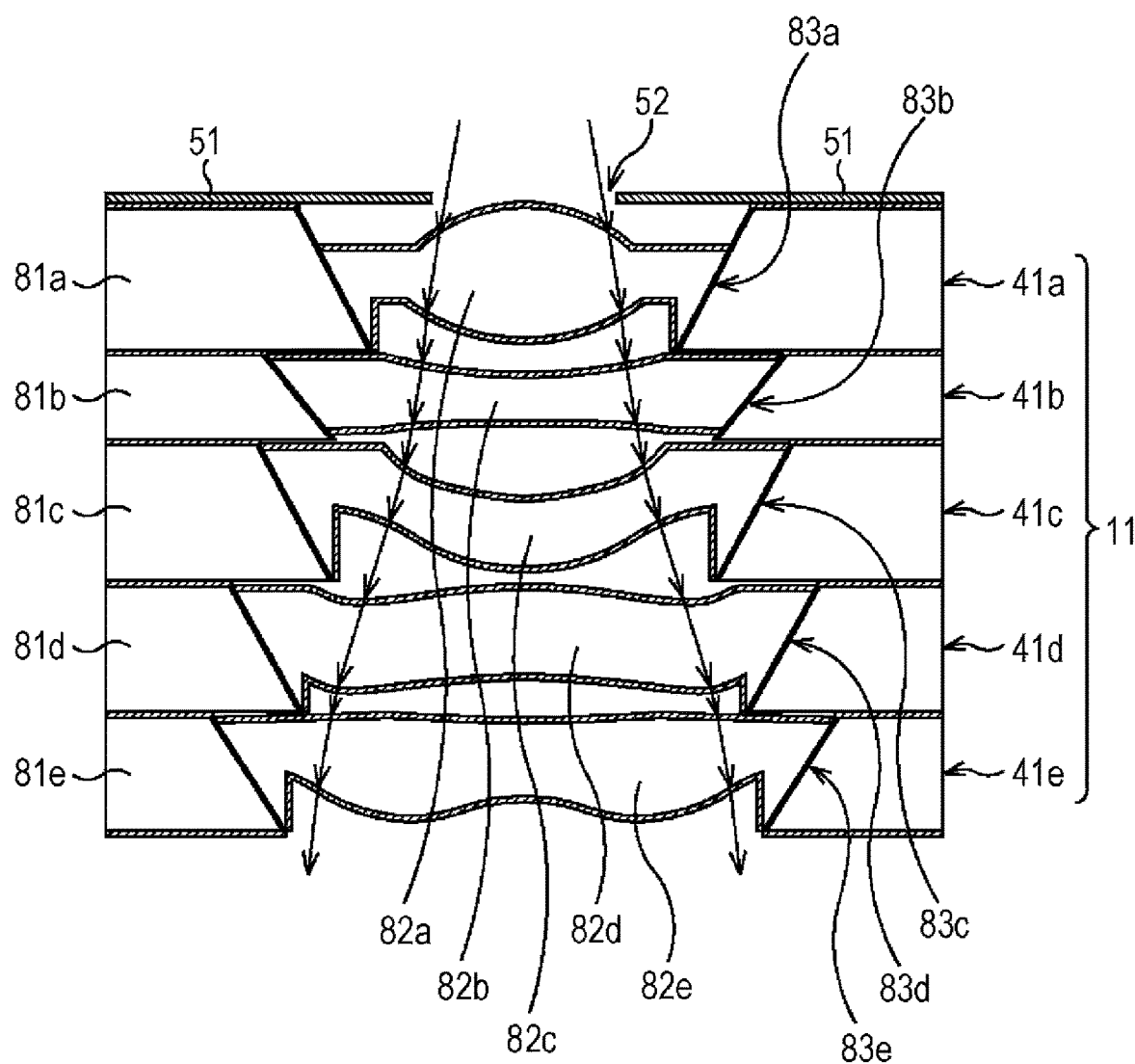
FIG. 15 is a cross-sectional diagram illustrating a stacked lens structure and an aperture stop plate.

FIG. 15 is a cross-sectional diagram illustrating the stacked lens structure 11 and the aperture stop plate 51 which are portions of the camera module 1D of FIG. 13.

In the camera module 1D, the light incident to the module is constricted by the aperture stop plate 51 and, after that, is spread in the inner portion of the stacked lens structure 11 to be incident on the light-receiving device 12 (not shown in FIG. 15) disposed under the stacked lens structure 11. Namely, in the overview of the entire stacked lens structure 11, the light incident to the module propagates to spread in a substantially fan shape from the aperture portion 52 of the aperture stop plate 51 toward the lower side. For this reason, as an example of the size of the lens resin portion 82 provided to the stacked lens structure 11, in the stacked lens structure 11 of the FIG. 15, the lens resin portion 82a provided to the lens-attached substrate 41a disposed just under the aperture stop plate 51 is smallest, and the lens resin portion 82e provided to the lens-attached substrate 41e disposed in the lowermost layer of the stacked lens structure 11 is largest.

If the thickness of the lens resin portion 82 of the lens-attached substrate 41 is set to be constant, the large-sized lens is more difficult to manufacture than the small-sized lens. This is because the lens is easily deformed by the weight added to the lens in the lens manufacturing period and the large-sized lens is hard to maintain the strength. For this reason, it is preferable that the large-sized lens is formed to be thicker than the small-sized lens. For this reason, in the stacked lens structure 11 of FIG. 15, with respect to the thickness of the lens resin portion 82, the lens resin portion 82e provided to the lens-attached substrate 41e disposed in the lowermost layer is thickest.

In order to increase the degree of lens design, the stacked lens structure 11 of FIG. 15 has at least one of the following features. (1) The thickness of the carrier substrate 81 is different among at least a plurality of the lens-attached substrates 41 constituting the stacked lens structure 11. For example, the thickness of the carrier substrate 81 is large in the lower-layer lens-attached substrate 41. (2) The opening width of the through-hole 83 provided to the lens-attached substrate 41 is different among at least a plurality of the lens-attached substrates 41 constituting the stacked lens structure 11. For example, the opening width of the through-hole 83 is large in the lower-layer lens-attached substrate 41. (3) The diameter of the lens portion 91 provided to the lens-attached substrate 41 is different among at least a plurality of the lens-attached substrates 41 constituting the stacked lens structure 11. For example, the diameter of the lens portion 91 is large in the lens portion 91 of the lower-layer lens-attached substrate 41. (4) The thickness of the lens portion 91 provided to the lens-attached substrate 41 is different among at least a plurality of the lens-attached substrates 41 constituting the stacked lens structure 11. For example, the thickness of the lens portion 91 is large in the lens portion 91 of the lower-layer lens-attached substrate 41. (5) The distance between the lenses provided to the lens-attached substrate 41 is different among at least a plurality of the lens-attached substrates 41 constituting the stacked lens structure 11. (6) The volume of the lens resin portion 82 provided to the lens-attached substrate 41 is different among at least a plurality of the lens-attached substrates 41 constituting the stacked lens structure 11. For example, the volume of the lens resin portion 82 is large in the lens resin portion 82 of the lower-layer lens-attached substrate 41. (7) The material of the lens resin portion 82 provided to the lens-attached substrate 41 is different among at least a plurality of the lens-attached substrates 41 constituting the stacked lens structure 11.

In general, incident light which is incident on a camera module includes vertical incident light and oblique incident light. A large amount of the oblique incident light collides with the aperture stop plate 51 to be absorbed by the aperture stop plate or to be reflected toward the outside of the camera module 1D. The oblique incident light which is not constricted by the aperture stop plate 51 is likely to collide with the sidewall of the through-hole 83 according to the incident angle to be reflected therefrom.

The direction of propagation of the reflected light of the oblique incident light is defined by the incident angle of the oblique incident light 85 and the angle to the sidewall of the through-hole 83 illustrated in FIG. 13. In case of the so-called fan shape where the opening width of the through-hole 83 is increased from the incident side toward the light-receiving device 12 side, when the oblique incident light 85 having a specific incident angle which is not constricted by the aperture stop plate 51 collides with the sidewall of the through-hole 83, the oblique incident light is reflected in the direction toward the light-receiving device 12, so that the oblique incident light is likely to be stray light or noise light.

However, in the stacked lens structure 11 illustrated in FIG. 13, as illustrated in FIG. 15, the through-hole 83 formed in a so-called tapered-down shape where the opening width is decreased toward the lower side (the side where the light-receiving device 12 is disposed). In case of this shape, the oblique incident light 85 colliding on the sidewall of the through-hole 83 is reflected not in the downward direction, so-called the "light-receiving device 12 direction" but in the upward direction, so-called the "incident side direction". Therefore, it is possible to obtain a function or an effect that the occurrence of stray light or noise light is suppressed.

In the through-hole 83 of the lens-attached substrate 41, in order to reduce the light colliding on the sidewall and being reflected, it is more preferable that a material having light absorbing property is disposed on the sidewall.

As an example, in case of using the camera module 1D as a camera, when light (for example, visible light) which is desired to be received is set as first light and light (for example, UV light) of which wavelength is different from that of the first light is set as second light, a material obtained by dispersing carbon particles as a first-light (visible light) absorbing material in the resin which is to be cured by the second light (UV light) is applied or sprayed on the surface of the carrier substrate 81, only the resin on the sidewall portion of the through-hole 83 is cured by irradiating with the second light (UV light), and a resin of the other areas is removed, so that a layer of a material having a light absorbing property with respect to the first light (visible light) may be formed on the sidewall of the through-hole 83.

The stacked lens structure 11 illustrated in FIG. 15 is an example of the structure where the aperture stop plate 51 is disposed on the top of a plurality of the stacked lens-attached substrates 41. The aperture stop plate 51 may be disposed to be inserted into any one of middle lens-attached substrates 41 instead of the top of a plurality of the stacked lens-attached substrates 41.

Furthermore, as another example, the flat-shaped aperture stop plate 51 is not provided separately from the lens-attached substrate 41, but a layer of a material having a light absorbing property may be formed on the surface of the lens-attached substrate 41, and the layer of the material may be allowed to function as an aperture stop. For example, the material obtained by dispersing carbon particles as a first-light (visible light) absorbing material in the resin which is to be cured by the second light (UV light) is applied or sprayed on the surface of the lens-attached substrate 41, a resin of other areas excluding the area which is desired to transmit light at the time of functioning as an aperture stop is irradiated with the second light (UV light) to cure the resin to remain, the resin of the area which is not cured, that is, the resin of the area where is desired to transmit light at the time of functioning as an aperture stop is removed, so that the aperture stop may be formed in the surface of the lens-attached substrate 41.

In addition, the lens-attached substrate 41 where the aperture stop is to be formed in the surface may be the lens-attached substrate 41 disposed in the uppermost layer of the stacked lens structure 11 or may be the lens-attached substrate 41 in the middle layer of the stacked lens structure 11.

The stacked lens structure 11 illustrated in FIG. 15 has a structure where the lens-attached substrates 41 are stacked.

As another embodiment, the stacked lens structure 11 may also be a structure including a plurality of the lens-attached substrates 41 and at least one carrier substrate 81 which is not provided with the lens resin portion 82. In this structure, the carrier substrate 81 which is not provided with the lens resin portion 82 may be disposed on the lowermost layer or the uppermost layer of the stacked lens structure 11 or may be disposed as a layer of the inner side of the stacked lens structure 11. Due to the structure, it is possible to obtain a function or an effect that for example, distances among a plurality of the lenses provided to the stacked lens structure 11 or a distance between the lens resin portion 82 of the lowermost layer of the stacked lens structure 11 and the light-receiving device 12 disposed at the lower side of the stacked lens structure 11 are arbitrarily set.

In addition, due to the structure, it is possible to obtain a function or an effect that the opening width of the carrier substrate 81 which is not provided with the lens resin portion 82 is appropriately set, and the material having light absorbing property is disposed in the area excluding the aperture portion, so that the structure is allowed to function as an aperture stop plate.

7. Sixth Embodiment of Camera Module

Figure 16:
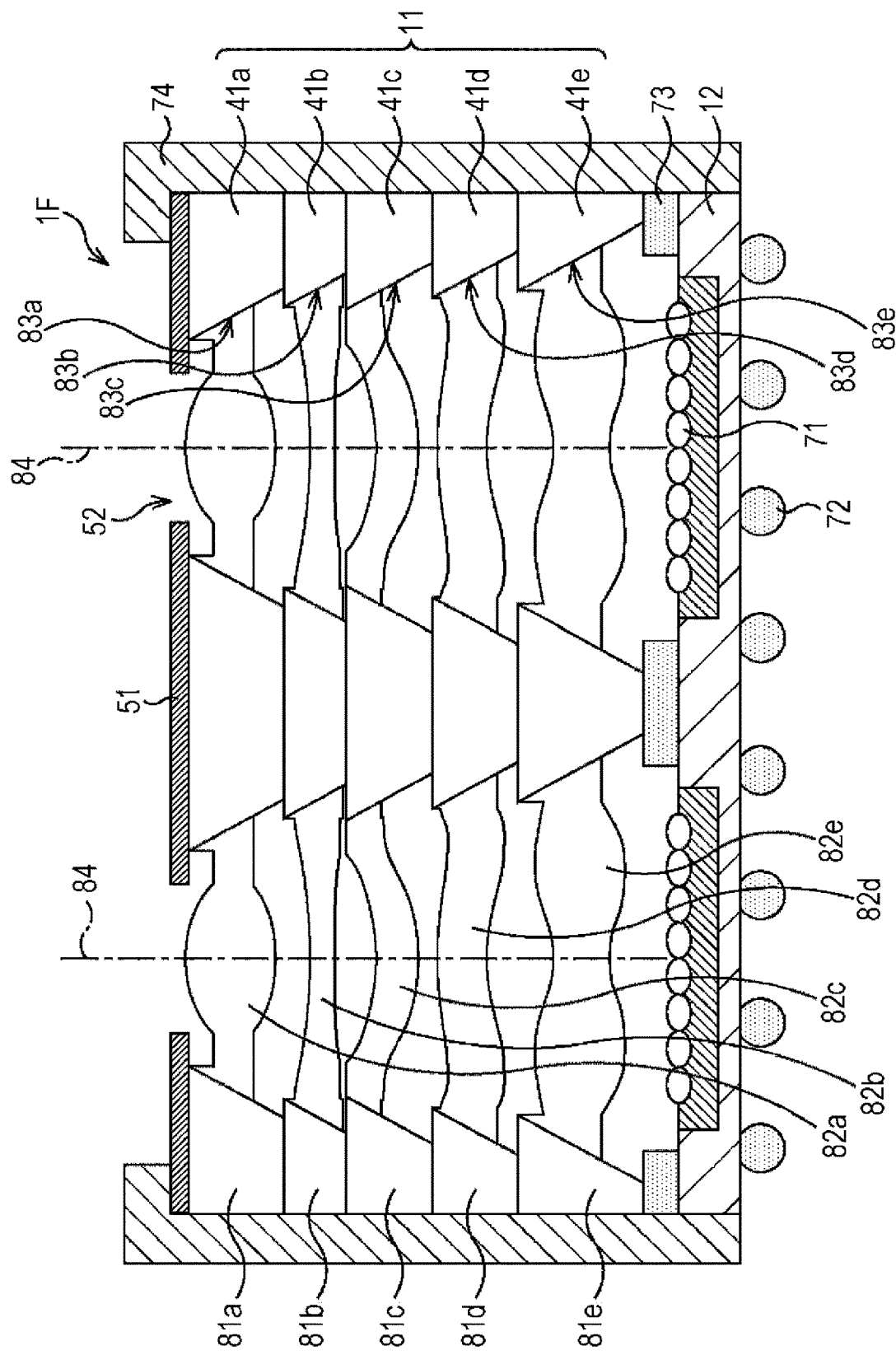
FIG. 16 is a diagram illustrating a sixth embodiment of a camera module using a stacked lens structure employing the present technology.

FIG. 16 is a diagram illustrating a sixth embodiment of a camera module using a stacked lens structure employing the present technology.

In FIG. 16, the components corresponding to those of the fourth embodiment illustrated in FIG. 13 are denoted by the same reference numerals, and description is mainly made about the components different from those of the camera module 1D of FIG. 13.

Similarly to the camera module 1D illustrated in FIG. 13, in the camera module 1F illustrated in FIG. 16, the incident light is constricted by the aperture stop plate 51 and, after that, is spread in the inner portion of the stacked lens structure 11 to be incident on the light-receiving device 12 disposed under the stacked lens structure 11. Namely, in the overview of the entire stacked lens structure 11, the light propagates to spread in a substantially fan shape from the aperture portion 52 of the aperture stop plate 51 toward the lower side.

The camera module 1F of FIG. 16 is different from the camera module 1D of FIG. 13 in terms that the cross-section shape of the through-hole 83 of each of the lens-attached substrates 41 constituting the stacked lens structure 11 is a so-called fan shape where the opening width is increased toward the lower side (the side where the light-receiving device 12 is disposed).

Since the stacked lens structure 11 of the camera module 1F has the structure where the incident light propagates to spread in a fan shape from the aperture portion 52 of the aperture stop plate 51 toward the lower side, in the fan shape where the opening width of the through-hole 83 is increased toward the lower side, for example, the carrier substrate 81 is less likely to interfere with the optical path than a tapered-down shape where the opening width of the through-hole 83 is decreased toward the lower side. Therefore, a function that a degree of lens design is high is obtained.

In addition, with respect to the cross section area of the lens resin portion 82 including the carrying portion 92 in the substrate planar directions, in case of the tapered-down shape where the opening width of the through-hole 83 is decreased toward the lower side, the cross section area in the lower surface of the lens resin portion 82 has a specific size in order to transmit the light beam incident on the lens 21, and the cross section area is increased from the lower surface of the lens resin portion 82 toward the upper surface thereof.

On the contrary, in case of the fan shape where the opening width of the through-hole 83 is increased toward the lower side, the cross section area in the lower surface of the lens resin portion 82 is substantially the same as that of the case of the tapered-down shape, but the cross section area is decreased from the lower surface of the lens resin portion 82 toward the upper surface thereof.

Therefore, due to the structure where the opening width of the through-hole 83 is increased toward the lower side, it is possible to obtain a function or an effect that it is possible to suppress the size of the lens resin portion 82 including the carrying portion 92 to be small. In addition, therefore, due to the structure, it is possible to obtain a function or an effect that it is possible to reduce the difficulty in lens formation occurring in the case where the above-described lenses are large.

8. Seventh Embodiment of Camera Module

Figure 17:
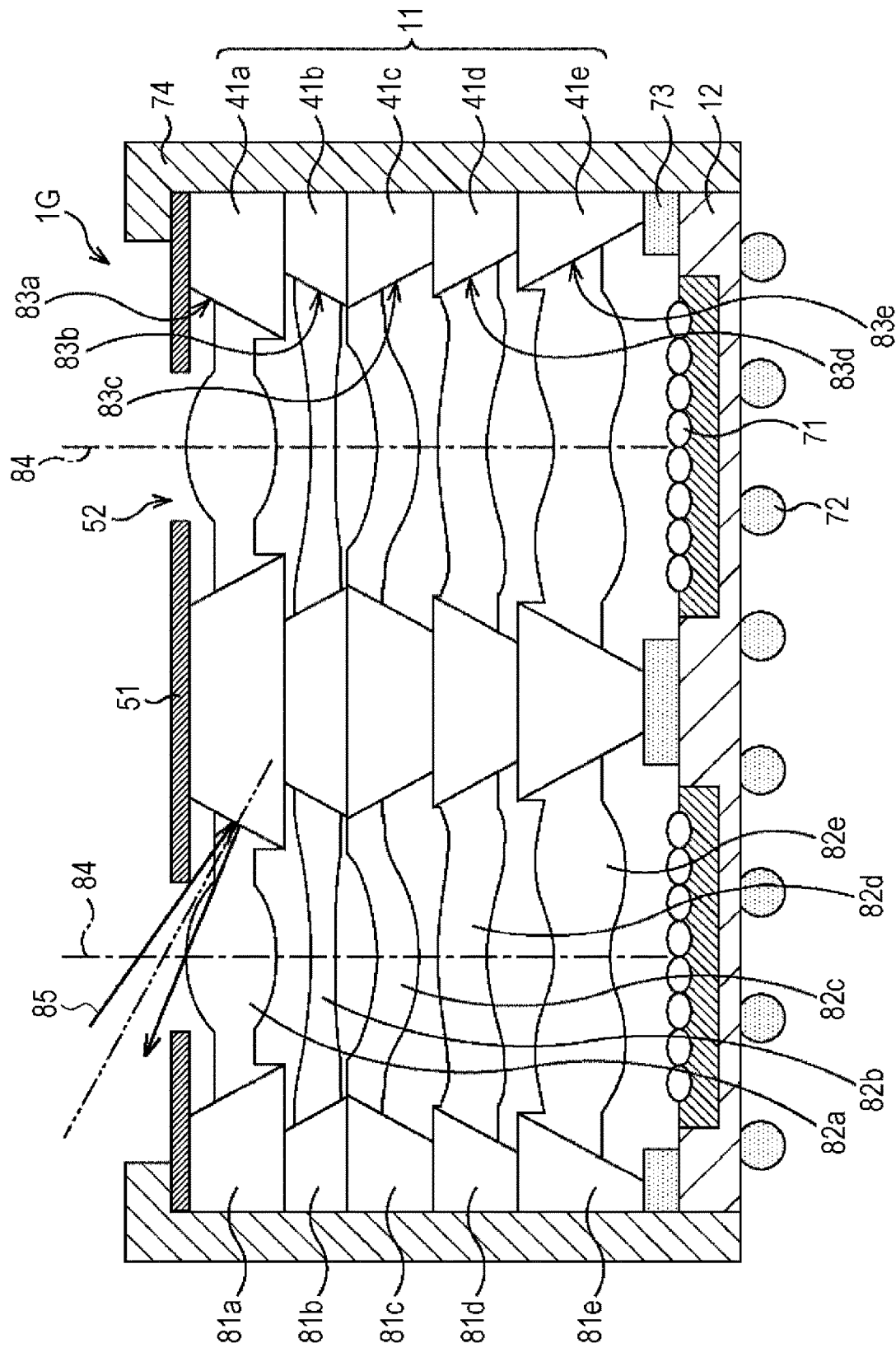
FIG. 17 is a diagram illustrating a seventh embodiment of a camera module using a stacked lens structure employing the present technology.

FIG. 17 is a diagram illustrating a seventh embodiment of a camera module using a stacked lens structure employing the present technology.

In FIG. 17, the components corresponding to those of FIG. 13 are denoted by the same reference numerals, and description is mainly made about the components different from those of the camera module 1D of FIG. 13.

The camera module 1G of FIG. 17 is also different from the camera module 1D illustrated in FIG. 13 in terms of the shapes of the lens resin portion 82 and the through-hole 83 of each of the lens-attached substrates 41 constituting the stacked lens structure 11.

The stacked lens structure 11 of the camera module 1G is configured to include a lens-attached substrate 41 where the shape of the through-hole 83 is a so-called tapered-down shape where the opening width is decreased toward the lower side (the side where the light-receiving device 12 is disposed) and a lens-attached substrate 41 where the shape of the through-hole 83 is a so-called fan shape where the opening width is increased toward the lower side.

In the lens-attached substrate 41 where the through-hole 83 has a so-called tapered-down shape where the opening width is decreased toward the lower side, as described above, the oblique incident light 85 colliding on the sidewall of the through-hole 83 is reflected in the upward direction, so-called the incident side direction, so that it is possible to obtain a function or an effect that the occurrence of stray light or noise light is suppressed.

Therefore, in the stacked lens structure 11 of FIG. 17, among a plurality of the lens-attached substrates 41 constituting the stacked lens structure 11, particularly for a plurality of the lens-attached substrates of the upper side (incident side), used are the lens-attached substrates 41 where the through-hole 83 has the so-called tapered-down shape where the opening width is decreased toward the lower side.

In the lens-attached substrate 41 where the through-hole 83 is formed in a so-called fan shape where the opening width is increased toward the lower side, as described above, the carrier substrate 81 provided to the lens-attached substrate 41 is less likely to interfere with the optical path, so that it is possible to obtain a function or an effect that a degree of lens design is increased and the size of the lens resin portion 82 including the carrying portion 92 provided to the lens-attached substrate 41 is suppressed to be small.

In the stacked lens structure 11 of FIG. 17, since light propagates to spread in a fan shape from the aperture stop to the lower side, among a plurality of the lens-attached substrates 41 constituting the stacked lens structure 11, the size of the lens resin portion 82 provided to some lens-attached substrates 41 disposed in the lower side is large. If the fan-shaped through-hole 83 is used for such a large lens resin portion 82, the function of suppressing the size of the lens resin portion 82 is exhibited to be large.

Therefore, in the stacked lens structure 11 of FIG. 17, among a plurality of the lens-attached substrates 41 constituting the stacked lens structure 11, particularly for a plurality of the lens-attached substrate of the lower side, used are the lens-attached substrate 41 where the through-hole 83 has the so-called fan shape where the opening width is increased toward the lower side.

9. Detailed Configuration of Lens-Attached Substrate

Next, the detailed configuration of the lens-attached substrate 41 will be described.

Figure 18:
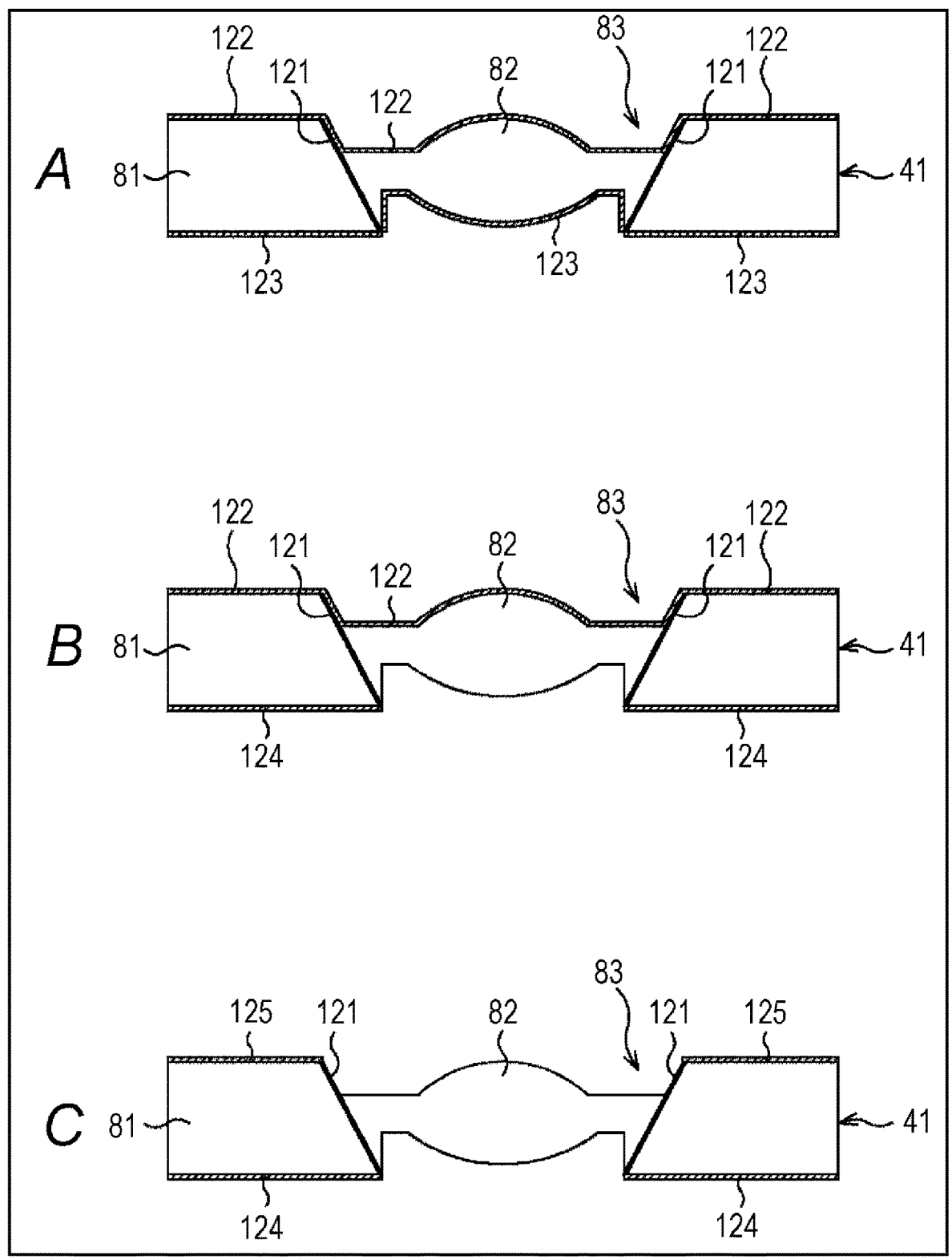
FIG. 18 is a cross-sectional diagram illustrating a detailed configuration of a lens-attached substrate.
Figure 19:
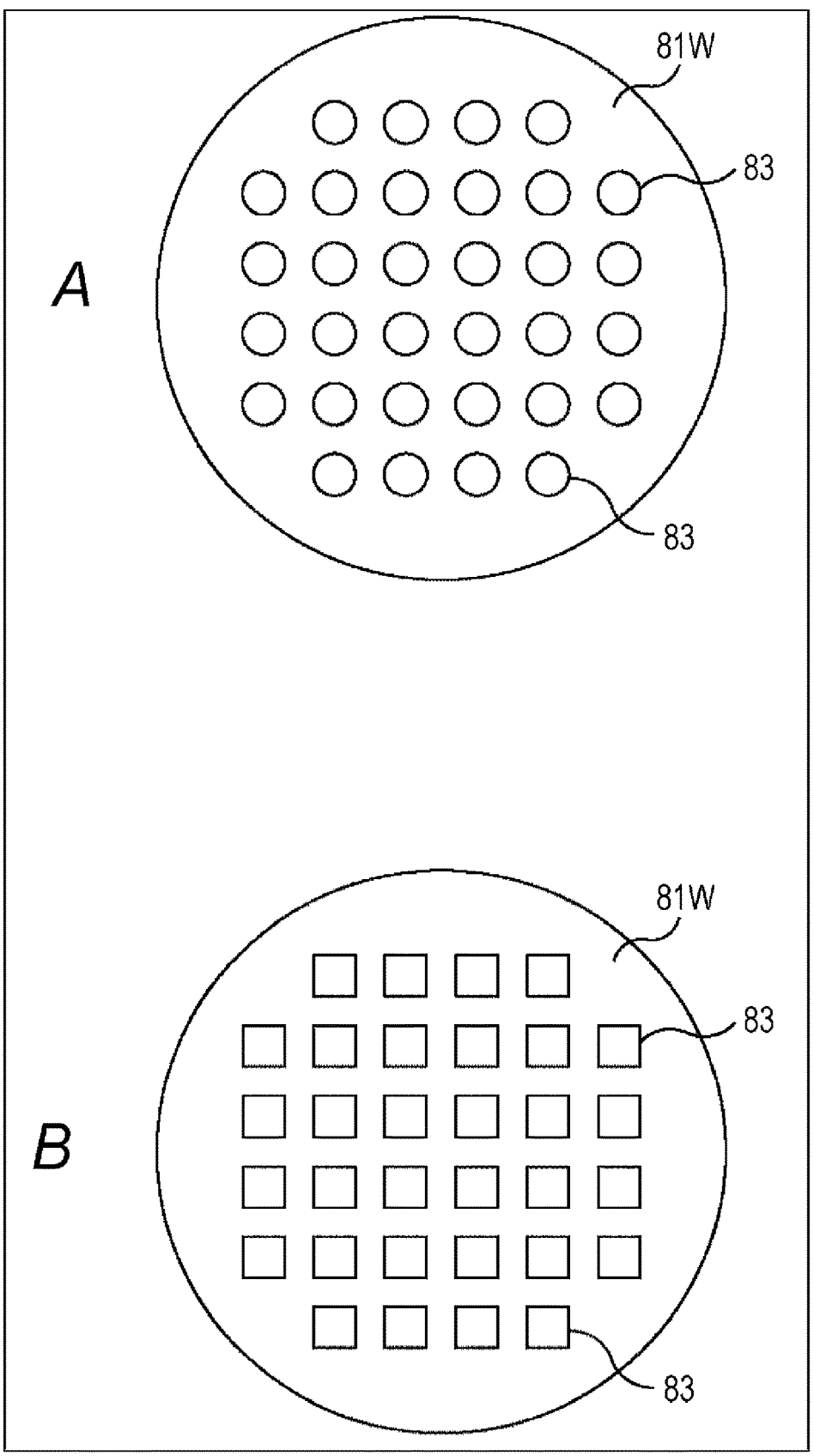
FIG. 19 is a diagram for explaining a manufacturing method for a lens-attached substrate.
Figure 20:
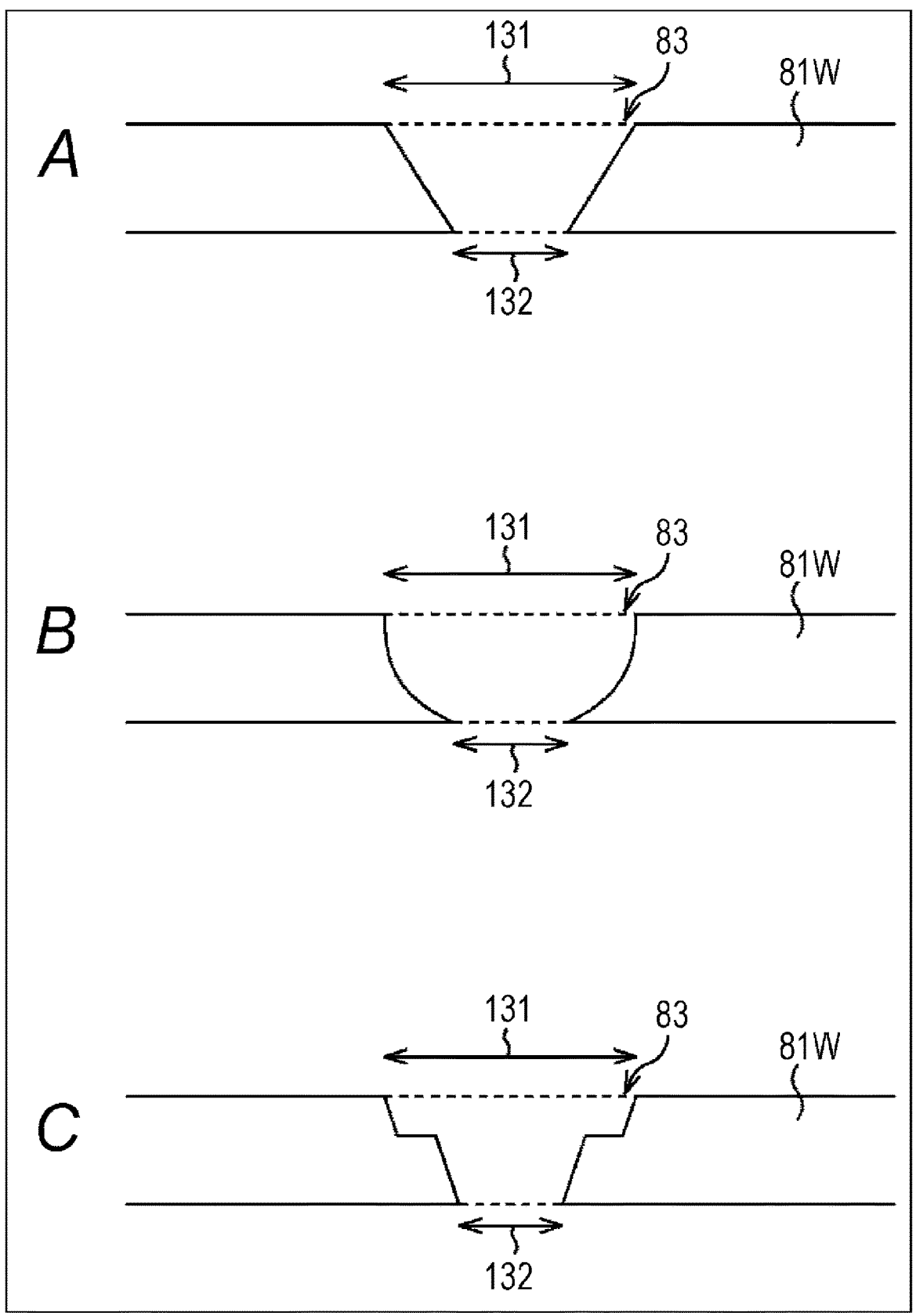
FIG. 20 is a diagram for explaining a manufacturing method for a lens-attached substrate.
Figure 21:
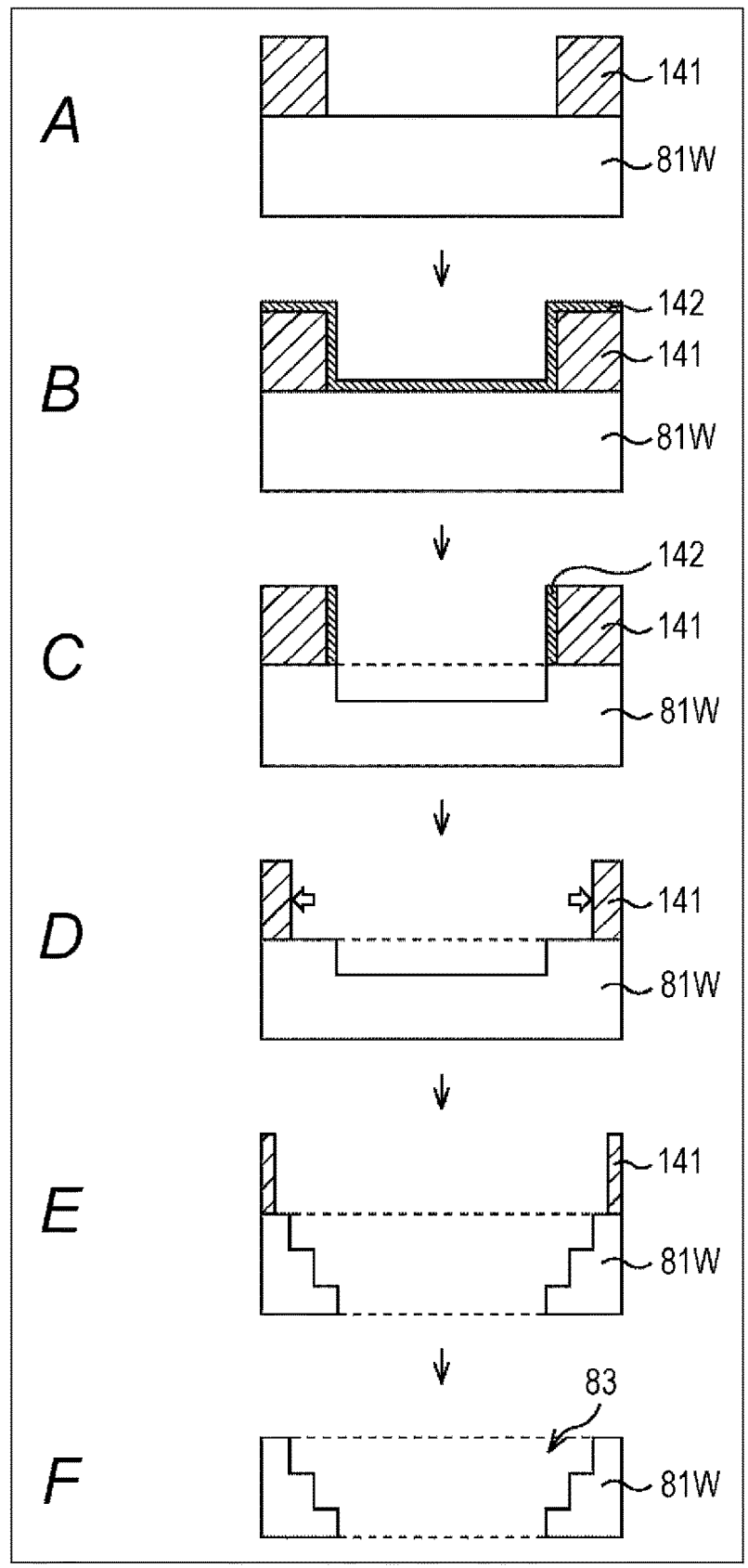
FIG. 21 is a diagram for explaining a manufacturing method for a lens-attached substrate.
Figure 22:
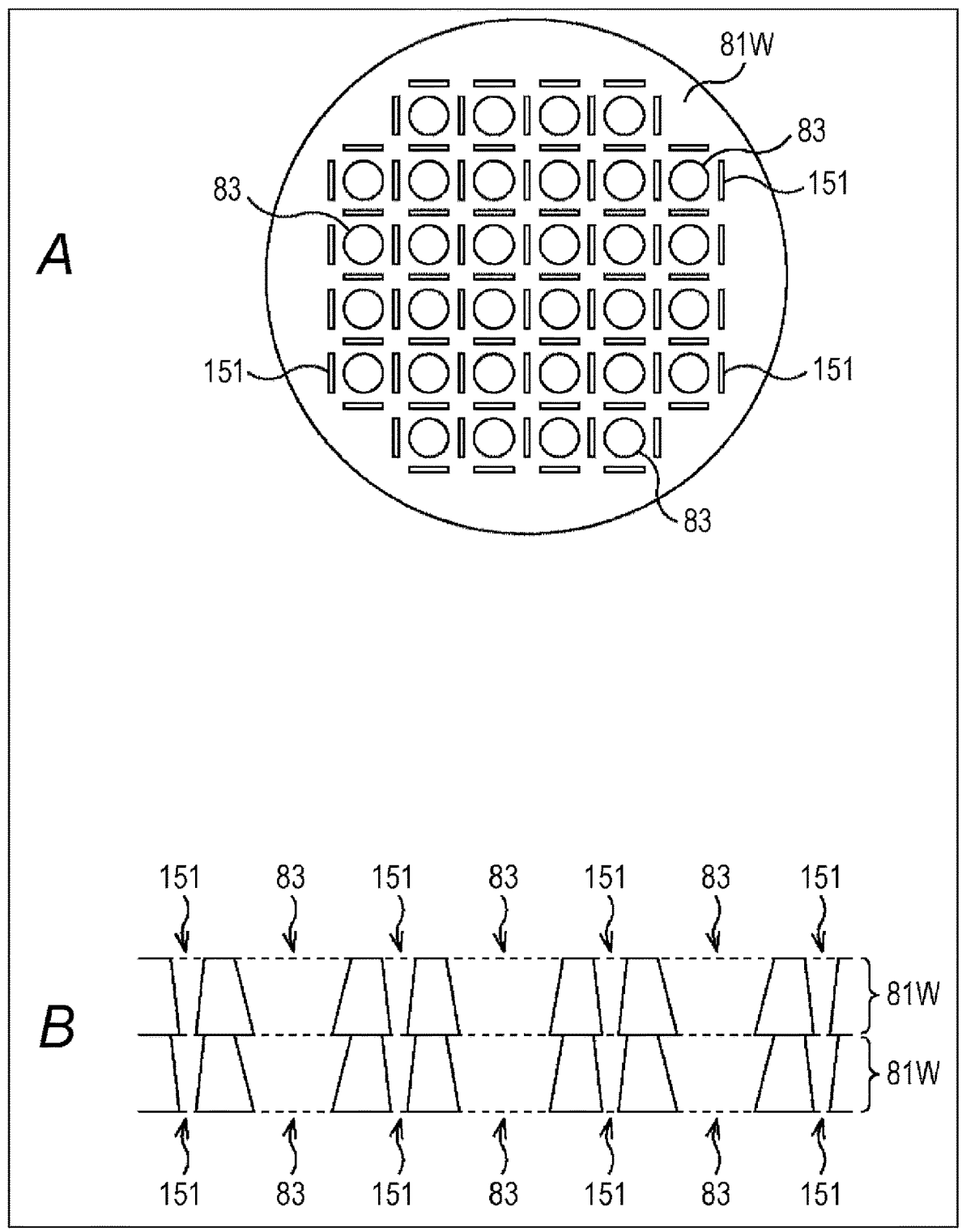
FIG. 22 is a diagram for explaining a manufacturing method for a lens-attached substrate.
Figure 23:
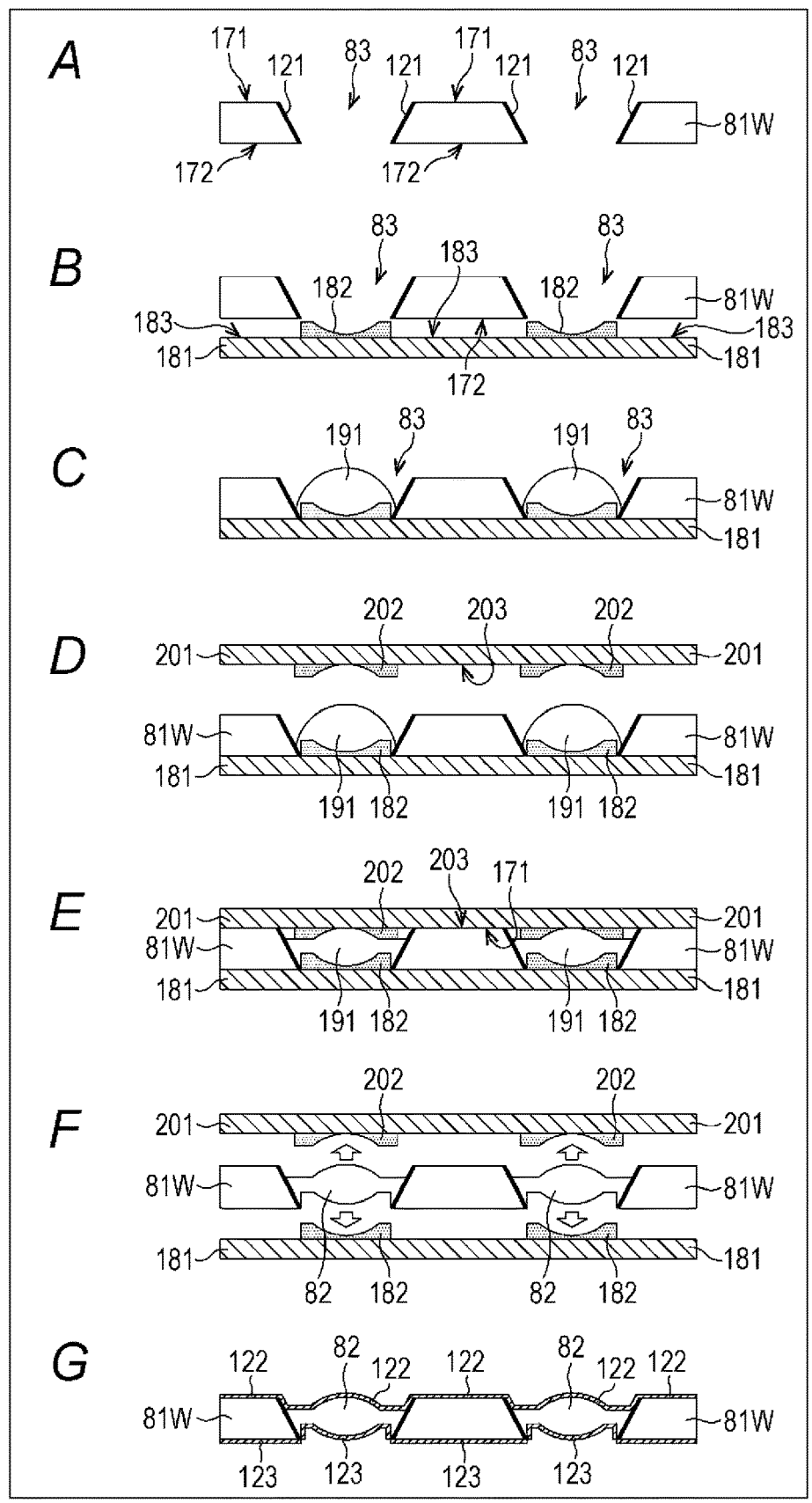
FIG. 23 is a diagram for explaining a manufacturing method for a lens-attached substrate.

FIGS. 18A to 18C are cross-sectional diagrams illustrating the detailed configuration of the lens-attached substrate 41.

In addition, in FIGS. 18A to 18C, among the five lens-attached substrates 41a to 41e, the uppermost-layer lens-attached substrate 41a is illustrated, but other lens-attached substrates 41 have the same configuration.

As the configuration of the lens-attached substrate 41, any one of the configurations of FIGS. 18A to 18C may be taken.

In the lens-attached substrate 41 illustrated in FIG. 18A, with respect to the through-hole 83 provided to the carrier substrate 81, the lens resin portion 82 is formed so as to block the through-hole 83 as viewed from the upper surface. As described above with reference to FIG. 14, the lens resin portion 82 is configured to include the lens portion 91 (not shown) in the central portion and the carrying portion 92 (not shown) in the peripheral portion.

In order to prevent ghost or flare caused by light reflection, a film 121 having light absorbing property or light-shielding property is formed on the sidewall of the through-hole 83 of the lens-attached substrate 41. For the convenience, the film 121 is called a light-shielding film 121.

An upper surface layer 122 including an oxide, a nitride, or other insulating materials is formed on the upper surface of the carrier substrate 81 and the lens resin portion 82, and a lower surface layer 123 including an oxide, a nitride, or other insulating materials is formed on the lower surface of the carrier substrate 81 and the lens resin portion 82.

As an example, the upper surface layer 122 is configured with an anti-reflection film obtained by alternately stacking a plurality of low refractive films and a plurality of high refractive films. The anti-reflection film may be configured, for example, by alternately stacking the low refractive films and the high refractive films as a total of four films. The low refractive film is configured with, for example, an oxide film of $SiO_x$ ($1 \leq x \leq 2$), SiOC, SiOF, or the like, and the high refractive film is configured with, for example, a metal oxide film of TiO, TaO, $Nb_2O_5$, or the like.

In addition, the configuration of the upper surface layer 122 may be designed, for example, so as to obtain desired anti-reflection performance using optical simulation, and material, thickness, the number of stacked films, and the like of the low refractive film and the high refractive film are not particularly limited. In the embodiment, the outermost surface of the upper surface layer 122 is configured with the low refractive film, and the thickness thereof is, for example, in a range of 20 to 1000 nm, the density thereof is, for example, in a range of 2.2 to 2.5 g/cm$^3$, the flatness thereof is, for example, about 1 nm or less of root mean square of roughness Rq (RMS). In addition, as described later in detail, the upper surface layer 122 is a joining film in the joining to other lens-attached substrate 41.

As an example, the upper surface layer 122 may be configured with an anti-reflection film obtained by alternately stacking a plurality of low refractive films and a plurality of high refractive films and may be preferably an inorganic anti-reflection film among the anti-reflection films. As another example, the upper surface layer 122 may be a single-layered film including an oxide, a nitride, or other insulating materials or may be an inorganic film among the single-layered films.

As an example, the lower surface layer 123 may also be configured with an anti-reflection film obtained by alternately stacking a plurality of low refractive films and a plurality of high refractive films and may be preferably an inorganic anti-reflection film among the anti-reflection films. As another example, the lower surface layer 123 may be a single-layered film including an oxide, a nitride, or other insulating materials or may be an inorganic film among the single-layered films.

With respect to the lens-attached substrates 41 of FIGS. 18B and 18C, only the portions different from those of the lens-attached substrate 41 illustrated in FIG. 18A will be described.

In the lens-attached substrate 41 illustrated in FIG. 18B, the film formed on the lower surface of the carrier substrate 81 and the lens resin portion 82 is different from that of the lens-attached substrate 41 illustrated in FIG. 18A.

In the lens-attached substrate 41 of FIG. 18B, a lower surface layer 124 including an oxide, a nitride, or other insulating materials is formed on the lower surface of the carrier substrate 81, and the lower surface layer 124 is not formed on the lower surface of the lens resin portion 82. The lower surface layer 124 may be configured with the same material as that of the upper surface layer 122 or may be configured with a material different from that of the upper surface layer.

This structure may be formed, for example, by a method of forming the lower surface layer 124 on the lower surface of the carrier substrate 81 before forming the lens resin portion 82, and after that, forming the lens resin portion 82. Alternatively, after the lens resin portion 82 is formed, a mask is formed on the lens resin portion 82, a film constituting the lower surface layer 124 is deposited on the lower surface of the carrier substrate 81, for example, by PVD in the state that no mask is formed on the carrier substrate 81.

In the lens-attached substrate 41 of FIG. 18C, an upper surface layer 125 including an oxide, a nitride, or other insulating materials is formed on the upper surface of the carrier substrate 81, and the upper surface layer 125 is not formed on the upper surface of the lens resin portion 82.

Similarly, in the lower surface of the lens-attached substrate 41, a lower surface layer 124 including an oxide, a nitride, or other insulating materials is formed on the lower surface of the carrier substrate 81, and the lower surface layer 124 is not formed on the lower surface of the lens resin portion 82.

This structure may be formed, for example, by a method of forming the upper surface layer 125 and the lower surface layer 124 on the carrier substrate 81 before forming the lens resin portion 82, and after that, forming the lens resin portion 82. Alternatively, after the lens resin portion 82 is formed, a mask is formed on the lens resin portion 82, a film constituting the upper surface layer 125 and a film constituting the lower surface layer 124 are deposited on the surfaces of the carrier substrate 81, for example, by PVD in the state that no mask is formed on the carrier substrate 81. The lower surface layer 124 and the upper surface layer 125 may be configured with the same material or may be configured with different materials.

The lens-attached substrate 41 may be configured as described heretofore.

10. Manufacturing Method for Lens-Attached Substrate

Next, a manufacturing method for the lens-attached substrate 41 will be described with reference to FIGS. 19 to 29.

First, a substrate-state carrier substrate 81W where a plurality of the through-holes 83 are formed is prepared. As the carrier substrate 81W, for example, a silicon substrate used for a typical semiconductor device may be used. The shape of the carrier substrate 81W is, for example, a circle as illustrated in FIG. 19A, and the diameter thereof is set to be, for example, 200 mm, 300 mm, or the like. The carrier substrate 81W may be not the silicon substrate but, for example, a glass substrate, a resin substrate, or a metal substrate.

In addition, in the embodiment, the planar shape of the through-hole 83 is a circle as illustrated in FIG. 19A, but the planar shape of the through-hole 83 may be, for example, a polygon such as a quadrangle as illustrated in FIG. 19B.

The opening width of the through-hole 83 may be taken in a range of, for example, from about 100 μm to about 20 mm. In this case, in the carrier substrate 81W, for example, about one hundred to five million through-holes may be disposed.

In this specification, the size of the through-hole 83 in the planar directions of the lens-attached substrate 41 is called the opening width. With respect to the opening width, if there no particularly specification, in the case where the planar shape of the through-hole 83 is a quadrangle, the opening width denotes a length of one side, and in the case where the planar shape of the through-hole 83 is a circle, the opening width denotes a diameter.

As illustrated in FIGS. 20A to 20C, the through-hole 83 is formed so that a second opening width 132 in a second surface facing a first surface of the carrier substrate 81W is smaller than a first opening width 131 in the first surface.

As an example of a three-dimensional shape of the through-hole 83 where the second opening width 132 is smaller than the first opening width 131, the through-hole 83 may have a truncated conical shape illustrated in FIG. 20A or may have a polygonal truncated pyramidal shape. The cross-section shape of the sidewall of the through-hole 83 may be a straight line as illustrated in FIG. 20A or may be a curved line as illustrated in FIG. 20B. Otherwise, the cross-section shape may have a step difference as illustrated in FIG. 20C.

With respect to the through-hole 83 where the second opening width 132 is smaller than the first opening width 131, a resin is supplied into the through-hole 83, when the lens resin portion 82 is formed by pressing the resin with mold frame members in the facing directions from the first and second surfaces, the resin which is to be the lens resin portion 82 is pressed on the sidewall of the through-hole 83 by being exerted on by forces from the two facing mold frame members. Therefore, a function can be obtained that the adhesion strength between the resin which is to be the lens resin portion 82 and the carrier substrate is increased.

In addition, as another embodiment of the through-hole 83, the first opening width 131 and the second opening width 132 may have the same shape, and in other words, may have the shape where the cross-section shape of the sidewall of the through-hole 83 is vertical.

<Method of Forming Through-Hole Using Wet Etching>

The through-hole 83 of the carrier substrate 81W can be formed by etching the carrier substrate 81W by wet etching. More specifically, before the etching of the carrier substrate 81W is performed, an etching mask for preventing non-opening regions of the carrier substrate 81W from being etched is formed on the surface of the carrier substrate 81W. As a material of the etching mask, for example, an insulating film such as a silicon oxide film or a silicon nitride film is used. The etching mask is formed by forming a layer of an etching mask material on the surface of the carrier substrate 81W and opening a pattern which is to be the planar shape of the through-hole 83 on the layer. After the etching mask is formed, the through-hole 83 is formed on the carrier substrate 81W by etching the carrier substrate 81W.

As the carrier substrate 81W, for example, in case of using monocrystalline silicon of which the substrate surface orientation is (100), in order to form the through-hole 83, crystal anisotropic wet etching using an alkaline solution such as KOH can be employed.

If the crystal anisotropic wet etching using an alkaline solution such as KOH performed on the carrier substrate 81W which is a monocrystalline silicon of which the substrate surface orientation is (100), the etching is performed so that the (111) plane appears on opening sidewall. As a result, in the case where the planar shape of the opening portion of the etching mask is any one of a circle and a quadrangle, the through-hole 83 is obtained so that the planar shape thereof is a quadrangle; with respect to the opening width of the through-hole 83, the second opening width 132 is smaller than the first opening width 131; and the three-dimensional shape of the through-hole 83 is a truncated pyramidal shape or a shape similar to the truncated pyramidal shape. The angle of the sidewall of the through-hole 83 which becomes the truncated pyramidal shape is about 55° with respect to the substrate plane.

As another example of the etching for forming the through-hole, wet etching using a chemical solution capable of etching silicon in an arbitrary shape without restriction to crystal orientation disclosed in WO 2011/010739 or the like may be performed. As the chemical solution, for example, a chemical solution obtained by adding at least one of polyoxyethylene alkyl phenyl ether, polyoxyalkylene alkyl ether, and polyethylene glycol to a TMAH (tetra-methyl ammonium hydroxide) aqueous solution, a chemical solution obtained by adding isopropyl alcohol to a KOH solution, or the like may be employed.

If the etching for forming the through-hole 83 is performed on the carrier substrate 81W which is a monocrystalline silicon of which the substrate surface orientation is (100) by using any one of the above-described chemical solutions, in the case where planar shape of the opening portion of the etching mask is a circle, the through-hole 83 is obtained so that the planar shape is a circle; the second opening width 132 is smaller than the first opening width 131; and the three-dimensional shape is a truncated cone or a shape similar to the truncated cone.

In the case where the planar shape of the opening portion of the etching mask is a quadrangle, the through-hole 83 is obtained so that the planar shape is a quadrangle; with respect to the opening width, the second opening width 132 is smaller than the first opening width 131; and the three-dimensional shape is a truncated pyramidal shape or a shape similar to the truncated pyramidal shape. The angle of the sidewall of the through-hole 83 which becomes the trun-cated cone or the truncated pyramidal shape is about 45° with respect to the substrate plane.

<Method of Forming Through-Hole Using Dry Etching>

In addition, in the etching for forming the through-hole 83, not the above-described wet etching but dry etching may be used.

The method of forming the through-hole 83 using the dry etching will be described with reference to FIGS. 21A to 21F.

As illustrated in FIG. 21A, an etching mask 141 is formed on one surface of the carrier substrate 81W. The etching mask 141 has a mask pattern where a portion where the through-holes 83 are to be formed is opened.

Next, as illustrated in FIG. 21B, a protective film 142 for protecting the sidewall of the etching mask 141 is formed, and after that, as illustrated in FIG. 21C, the carrier substrate 81W is etched by a predetermined depth by drying etching. By the dry etching process, the protective film 142 of the surface of the carrier substrate 81W and the surface of the etching mask 141 is removed, but the protective film 142 of the side surface of the etching mask 141 remains, so that the sidewall of the etching mask 141 is protected. After the etching, as illustrated in FIG. 21D, the protective film 142 of the sidewall is removed, the etching mask 141 is recessed in the direction that the pattern size of the opening pattern is increased.

Next, the protective film formation process, the dry etching process, and the etching mask recession process of FIGS. 21B to 21D are repeatedly performed again. Therefore, as illustrated in FIG. 21E, the carrier substrate 81W is etched so as to have a staircase shape (concave-convex shape) having periodic step differences.

Finally, if the etching mask 141 is removed, as illustrated in FIG. 21F, the through-hole 83 having a step-shaped sidewall is formed in the carrier substrate 81W. The width (width of one step) of the staircase shape of the through-hole 83 in the planar directions is set to be, for example, in a range of about 400 nm to 1 µm.

As described heretofore, in case of forming the through-hole 83 using the dry etching, the protective film formation process, the dry etching process, and the etching mask recession process are repeatedly performed.

Since the sidewall of the through-hole 83 has the periodic staircase shape (concave-convex shape), it is possible to suppress reflection of the incident light. In addition, in the case where the sidewall of the through-hole 83 has a concave-convex shape having a random size, voids are generated in the adhesion layer between the lens formed in the through-hole 83 and the sidewall, in some cases, the adhesiveness to the lens may be deteriorated due to the voids. However, according to the above-described forming method, since the sidewall of the through-hole 83 has the periodic concave-convex shape, the adhesiveness is improved, so that it is possible to suppress a change in optical characteristic according to a difference in lens position.

As examples of the materials used in the processes, for example, the carrier substrate 81W may be monocrystalline silicon, the etching mask 141 may be photoresist, the protective film 142 may be a fluorocarbon polymer formed by using gas plasma such as $C_4F_8$ or $CHF_3$, the etching process may be plasma etching using a gas containing F such as $SF_6/O_2$ or $C_4F_8/SF_6$, the mask recession process may be plasma etching including $O_2$ such as an $O_2$ gas or $CF_4/O_2$.

In addition, the carrier substrate 81W may be a monocrystalline silicon, the etching mask 141 may be $SiO_2$, the etching may be plasma containing $Cl_2$, the protective film 142 may be an oxide film obtained by oxidizing an etching target material by using $O_2$ plasma, the etching process may plasma etching using a gas containing $Cl_2$, and the mask recession process may be plasma etching using a gas containing F such as $CF_4/O_2$.

As described heretofore, although a plurality of the through-holes 83 are simultaneously formed in the carrier substrate 81W by wet etching or dry etching, as illustrated in FIG. 22A, through-grooves 151 may also be formed in areas of the carrier substrate 81W where the through-holes 83 are not formed.

FIG. 22A is a plan diagram illustrating the carrier substrate 81W where through-grooves 151 as well as the through-holes 83 are formed.

For example, as illustrated in FIG. 22A, the through-grooves 151 are disposed in only portions between the through-holes 83 in the row and column directions so as to avoid a plurality of the through-holes 83 disposed in a matrix shape.

In addition, the through-grooves 151 of the carrier substrate 81W may be disposed at the same positions among the lens-attached substrates 41 constituting the stacked lens structure 11. In this case, as illustrated in the cross-sectional diagram of FIG. 22B, in the state that a plurality of the carrier substrates 81W are stacked as the stacked lens structure 11, the structure is configured so that a plurality of the through-grooves 151 of the carrier substrates 81W penetrate a plurality of the carrier substrates 81W.

Due to the through-groove 151 of the carrier substrate 81W as a portion of the lens-attached substrate 41, it is possible to obtain a function or an effect that, for example, in the case where a stress of deforming the lens-attached substrate 41 is exerted from an outer portion of the lens-attached substrate 41, the deformation of the lens-attached substrate 41 caused by the stress is alleviated.

In addition, due to the through-groove 151, it is possible to obtain a function or an effect that, for example, in the case where the stress of deforming the lens-attached substrate 41 is generated from an inner portion of the lens-attached substrate 41, the deformation of the lens-attached substrate 41 caused by the stress is alleviated.

<Manufacturing Method for Lens-Attached Substrate>

Next, a manufacturing method for the substrate-state lens-attached substrate 41W will be described with reference to FIGS. 23A to 23G.

First, as illustrated in FIG. 23A, a carrier substrate 81W where a plurality of through-holes 83 are formed is prepared. A light-shielding film 121 is formed on the sidewall of the through-hole 83. In FIGS. 23A to 23G, although only the two through-holes 83 are illustrated for lack of space in the paper, actually as illustrated in FIGS. 19A and 19B, a plurality of the through-holes 83 are formed in the planar directions of the carrier substrate 81W. In addition, alignment marks (not shown) for position alignment are formed in the areas close to the outer circumference of the carrier substrate 81W.

A front-side flat portion 171 at the upper side of the carrier substrate 81W and a rear-side flat portion 172 at the lower side of the carrier substrate are flat planes which are formed to be so flat that plasma joining can be performed in the subsequent process. The thickness of the carrier substrate 81W functions as a spacer of determining a lens distance when the substrate is finally diced into lens-attached substrates 41 and the lens-attached substrate is superimposed on other lens-attached substrates 41.

It is preferable that a low-thermal-expansion coefficient substrate material of which the thermal expansion coefficient is 10 ppm/° C. or less is used for the carrier substrate 81W.

Next, as illustrated in FIG. 23B, the carrier substrate 81W is disposed on the lower mold frame 181 where a plurality of the concave-shaped optical transfer surfaces 182 are disposed at a certain interval. More specifically, the rear-side flat portion 172 of the carrier substrate 81W and the flat surface 183 of the lower mold frame 181 are superimposed so that the concave-shaped optical transfer surface 182 is located inside the through-hole 83 of the carrier substrate 81W. The optical transfer surface 182 of the lower mold frame 181 is formed so as to be in one-to-one correspondence with the through-hole 83 of the carrier substrate 81W, and the positions of the carrier substrate 81W and the lower mold frame 181 in the planar directions are adjusted so that the centers of the corresponding optical transfer surface 182 and the through-hole 83 are coincident with each other in the optical axis direction. The lower mold frame 181 is formed with a hard mold frame member and is made of, for example, metal, silicon, quartz, or glass.

Next, as illustrated in FIG. 23C, the energy curable resin 191 is dropped (filled) into the inner side of the superimposed lower mold frame 181 and the through-hole 83 of the carrier substrate 81W. The lens resin portion 82 is formed by using the energy curable resin 191. For this reason, it is preferable that the energy curable resin 191 is defoamed in advance so as not to include foam. As a defoaming process, a vacuum defoaming process or a defoaming process by a centrifugal force is preferred. In addition, it is preferable that the vacuum defoaming process is performed after the filling. By performing the defoaming process, the molding of the lens resin portion 82 can be performed without introducing the foam.

Next, as illustrated in FIG. 23D, the upper mold frame 201 is disposed on the superimposed lower mold frame 181 and carrier substrate 81W. A plurality of concave-shaped optical transfer surfaces 202 are disposed at a certain interval on the upper mold frame 201. Similarly to the time of disposing the lower mold frame 181, the optical transfer surfaces 202 are positioned at a high accuracy so that the centers of the through-holes 83 and the centers of the optical transfer surfaces 202 are coincident with each other in the optical axis direction, and after that, the upper mold frame 201 is disposed.

With respect to the height direction which is the vertical direction in the figure, the position of the upper mold frame 201 is fixed by a control device of controlling the distance between the upper mold frame 201 and the lower mold frame 181 so that the distance between the upper mold frame 201 and the lower mold frame 181 is a preset distance. At this time, the space interposed between the optical transfer surface 202 of the upper mold frame 201 and the optical transfer surface 182 of the lower mold frame 181 has a thickness equal to the thickness of the lens resin portion 82 (lens 21) calculated according to optical design.

In addition, as illustrated in FIG. 23E, similarly to the case where the lower mold frame 181 is disposed, the flat surface 203 of the upper mold frame 201 and the front-side flat portion 171 of the carrier substrate 81W may be superimposed. In this case, the distance between the upper mold frame 201 and the lower mold frame 181 and the thickness of the carrier substrate 81W have the same value, highly-accurate positioning in the planar directions and the height direction is available.

When the interval between the upper mold frame 201 and lower mold frame 181 is controlled so as to be a preset distance, in the above-described process of FIG. 23C, a filling amount of the energy curable resin 191 dropped into the inside of the through-hole 83 of the carrier substrate 81W becomes an amount controlled so as not to be leaked from the through-hole 83 of the carrier substrate 81W and the space surrounded by the upper mold frame 201 and the lower mold frame 181 above and under the through-hole. Therefore, the material of the energy curable resin 191 is not wasted, and thus, it is possible to reduce production cost.

Subsequently, in the state illustrated in FIG. 23E, a curing process is performed on the energy curable resin 191. The energy curable resin 191 is applied with, for example, heat or UV light as energy and is left for a predetermined time, so that the energy curable resin is cured. During the curing, by pushing the upper mold frame 201 downwards or by performing alignment, it is possible to suppress the deformation caused by the contraction of the energy curable resin 191 to the lowest limit.

Instead of the energy curable resin 191, a thermoplastic resin may be used. In this case, in the state illustrated in FIG. 23E, and the energy curable resin 191 is molded in a lens shape by increasing temperature of the upper mold frame 201 and the lower mold frame 181 and is cured by cooling.

Next, as illustrated in FIG. 23F, a control device controlling the positions of the upper mold frame 201 and the lower mold frame 181 moves the upper mold frame 201 upwards and moves the lower mold frame 181 downwards to demold the upper mold frame 201 and the lower mold frame 181 from the carrier substrate 81W. When the upper mold frame 201 and the lower mold frame 181 are demolded from the carrier substrate 81W, the lens resin portion 82 including the lens 21 is formed inside the through-hole 83 of the carrier substrate 81W.

In addition, the surfaces of the upper mold frame 201 and the lower mold frame 181 being in contact with the carrier substrate 81W may be coated with a fluorine-based or silicon-based mold-releasing agent, or the like. By doing so, it is possible to easily demold the upper mold frame 201 and the lower mold frame 181 from the carrier substrate 81W. In addition, as a method of easily demolding from the contact surface of the carrier substrate 81W, various types of coating such as fluorine containing DLC (diamond like carbon) may be performed.

Next, as illustrated in FIG. 23G, the upper surface layer 122 is formed on the front surfaces of the carrier substrate 81W and the lens resin portion 82, and the lower surface layer 123 is formed on the rear surfaces of the carrier substrate 81W and the lens resin portion 82. Before or after the layer formation of the upper surface layer 122 and the lower surface layer 123, if necessary, by performing CMP (chemical mechanical polishing) or the like, the front-side flat portion 171 and the rear-side flat portion 172 of the carrier substrate 81W may be planarized.

By compression-molding (imprinting) the energy curable resin 191 in the through-hole 83 formed in the carrier substrate 81W by using the upper mold frame 201 and the lower mold frame 181, the lens resin portion 82 is formed, and thus, the lens-attached substrate 41 can be manufactured.

The shapes of the optical transfer surface 182 and the optical transfer surface 202 are not limited to the above-described concave shape, but the shapes may be appropriately determined according to the shape of the lens resin portion 82. As illustrated in FIG. 15, the lens shape of the lens-attached substrates 41a to 41e may take various protrusion shapes according to design of the optical system, and for example, a bi-convex shape, a bi-concave shape, a plano-convex shape, a plano-concave shape, a convex meniscus shape, a concave meniscus shape, a high-order a spherical shape, or the like may be taken.

In addition, the shape of the optical transfer surface 182 and the shape of the optical transfer surface 202 may be a shape where the lens shape after the formation becomes a moth-eye structure.

According to the above-described manufacturing method, since a change in distance between the lens resin portions 82 in the planar directions caused by the curing-contraction of the energy curable resin 191 can be prevented by using the carrier substrate 81W, it is possible to control the lens distance at a high accuracy. In addition, it is possible to obtain an effect that the energy curable resin 191 having weak strength is reinforced by the carrier substrate 81W having strong strength. Therefore, it is possible to obtain effects that it is possible to provide a lens array substrate where a plurality of the lenses having a good handling property are disposed and it is possible to suppress a bent state of the lens array substrate.

<Example of Polygon of Through-Hole Shape>

As illustrated in FIG. 19B, the planar shape of the through-hole 83 may be, for example, a polygon such as a quadrangle.

Figure 24:
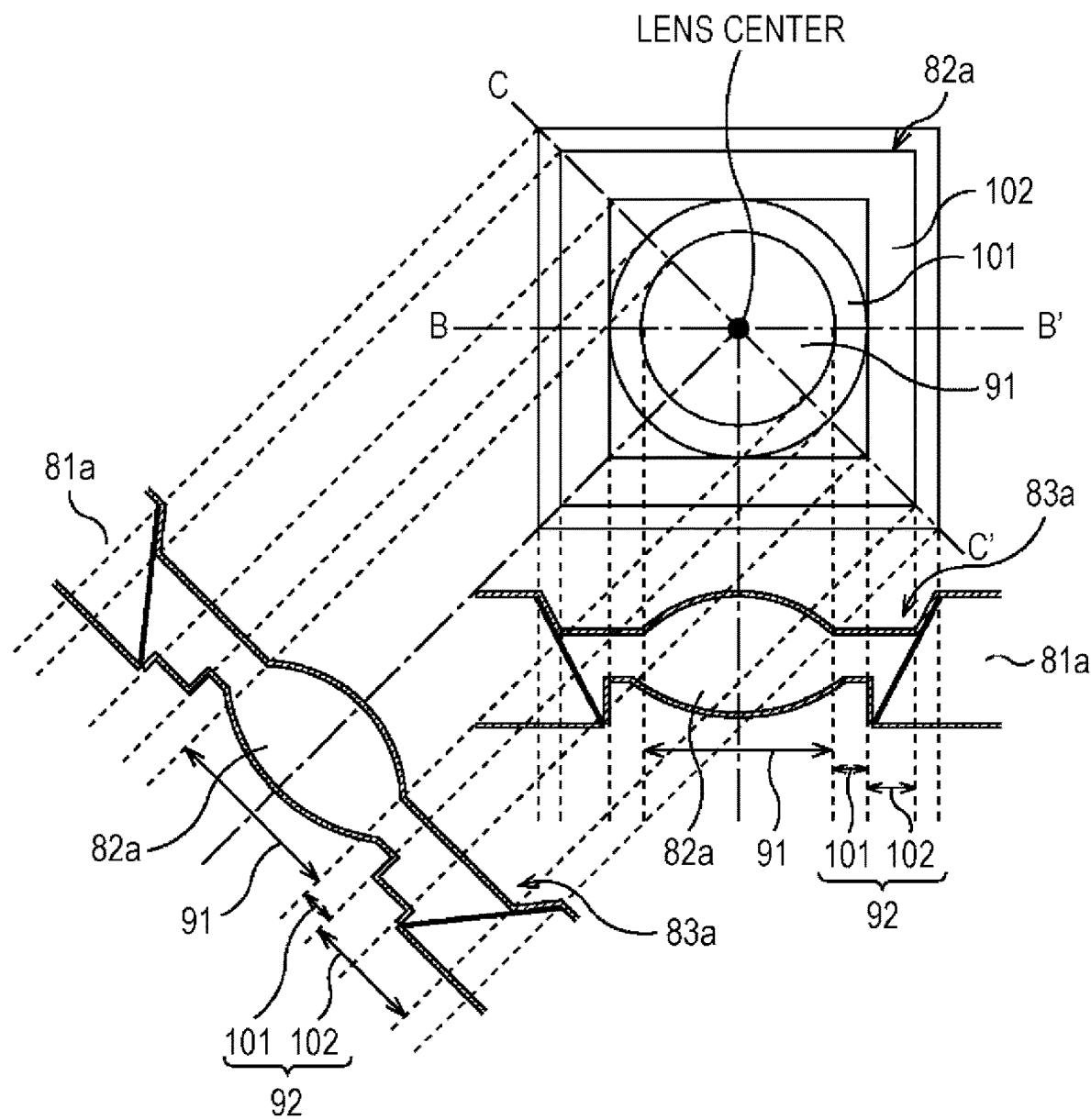
FIG. 24 is a diagram for explaining a manufacturing method for a lens-attached substrate.

FIG. 24 illustrates a plan diagram and cross-sectional diagrams of the carrier substrate 81a and the lens resin portion 82a of the lens-attached substrate 41a in the case where the planar shape of the through-hole 83 is a quadrangle.

The cross-sectional diagrams of the lens-attached substrate 41a of FIG. 24 illustrate cross-sectional diagrams taken along lines B-B' and C-C' of the plan diagram.

As understood by comparing the cross-sectional diagram of B-B' line and the cross-sectional diagram of C-C' line, in the case where the through-hole 83a is a quadrangle, the distance from the center of the through-hole 83a to the upper outer edge of the through-hole 83a and the distance from the center of the through-hole 83a to the lower outer edge of the through-hole 83a are different in the side direction and the diagonal direction of the through-hole 83a which is a quadrangle, and the distances are large in the diagonal direction. For this reason, in the case where the planar shape of the through-hole 83a is a quadrangle, if the lens portion 91 is set to be a circle, there is a need that the distance from the outer circumference of the lens portion 91 to the sidewall of the through-hole 83a sidewall, in other words, the length of the carrying portion 92 is set to be different between the side direction and the diagonal direction of the quadrangle.

Therefore, the lens resin portion 82a illustrated in FIG. 24 has the following structure. (1) The lengths of the arm portion 101 which is disposed in the outer circumference of the lens portion 91 are the same in the side direction and the diagonal direction of the quadrangle. (2) The lengths of the leg portion 102 which is disposed outside the arm portion 101 and extends to the sidewall of the through-hole 83a are set so that the length of the leg portion 102 in the diagonal direction of the quadrangle is larger than the length of the leg portion 102 in the side direction of the quadrangle.

As illustrated in FIG. 24, the leg portion 102 is not in direct contact with the lens portion 91, and the arm portion 101 is in direct contact with the lens portion 91.

In the lens resin portion 82a of FIG. 24, the length and thickness of the arm portion 101 being in direct contact with the lens portion 91 are set to be constant over the entire outer circumference of the lens portion 91, so that it is possible to obtain an effect that the entire lens portion 91 is supported evenly by a constant force.

In addition, since the entire lens portion 91 is supported evenly by a constant force, for example, in the case where a stress is applied to the entire outer circumference of the through-hole 83a by the carrier substrate 81a surrounding the through-hole 83a, the stress is exerted on the entire lens portion 91 evenly, so that it is possible to obtain a function or an effect that unevenly transferring of the stress to a specific portion of the lens portion 91 is suppressed.

Figure 25:
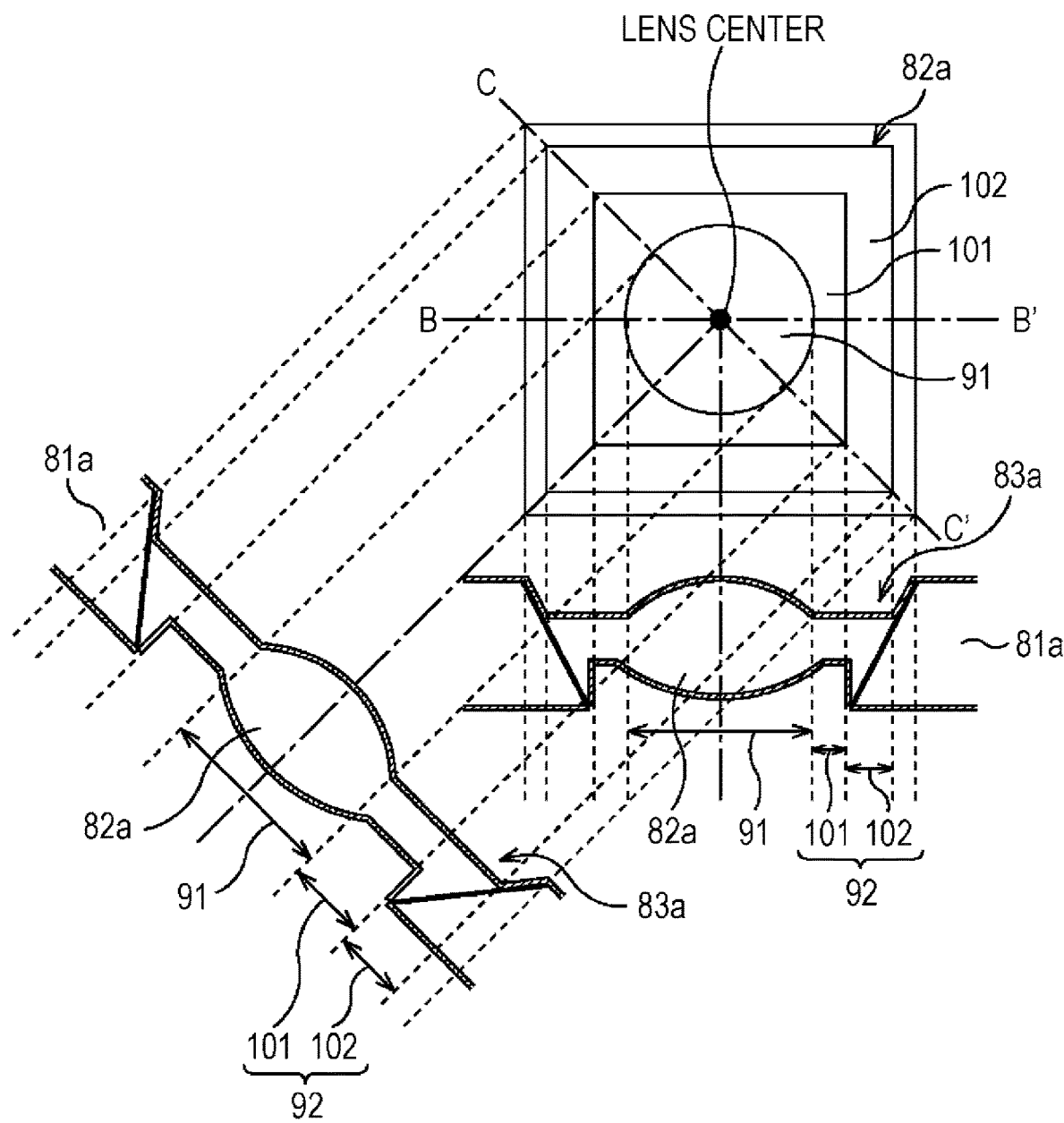
FIG. 25 is a diagram for explaining a manufacturing method for a lens-attached substrate.

FIG. 25 illustrates a plan diagram and cross-sectional diagrams of the carrier substrate 81a and the lens resin portion 82a of the lens-attached substrate 41a and indicates another example of the through-hole 83 of which the planar shape is a quadrangle.

The cross-sectional diagrams of the lens-attached substrate 41a of FIG. 25 illustrate cross-sectional diagrams taken along lines B-B' and C-C' of the plan diagram.

In FIG. 25, similarly to FIGS. 22A and 22B, the distance from the center of the through-hole 83a to the upper outer edge of the through-hole 83a and the distance from the center of the through-hole 83a to the lower outer edge of the through-hole 83a are different in the side direction and the diagonal direction of the through-hole 83a which is a quadrangle, and the distances are large in the diagonal direction. For this reason, in the case where the planar shape of the through-hole 83a is a quadrangle, if the lens portion 91 is set to a circle, there is a need that the distance from the outer circumference of the lens portion 91 to the sidewall of the through-hole 83a sidewall, in other words, the length of the carrying portion 92 is set to be different between the side direction and the diagonal direction of the quadrangle.

Therefore, the lens resin portion 82a illustrated in FIG. 25 have the following structure. (1) The lengths of the leg portion 102 disposed in the outer circumference of the lens portion 91 are set to be constant along the four sides of the quadrangle of the through-hole 83a. (2) In order to implement the structure of (1) described above, the lengths of the arm portion 101 are set so that the length of the arm portion in the diagonal direction of the quadrangle is larger than the length of the arm portion in the side direction of the quadrangle.

As illustrated in FIG. 25, the thickness of the resin of the leg portion 102 is larger than that of the arm portion 101. For this reason, in terms of the volume per unit area of the lens-attached substrate 41a in the planar directions, the leg portion 102 is larger than the arm portion 101.

In the embodiment of FIG. 25, the volume of the leg portion 102 is set to be as small as possible and is set to be constant along the four sides of the quadrangle of the through-hole 83a, so that it is possible to obtain a function or an effect that, for example, in the case where deformation such as swelling of the resin occurs, a change in volume is suppressed as much as possible, and the change in volume is not uneven over the entire outer circumference of the lens portion 91 as much as possible.

Figure 26:
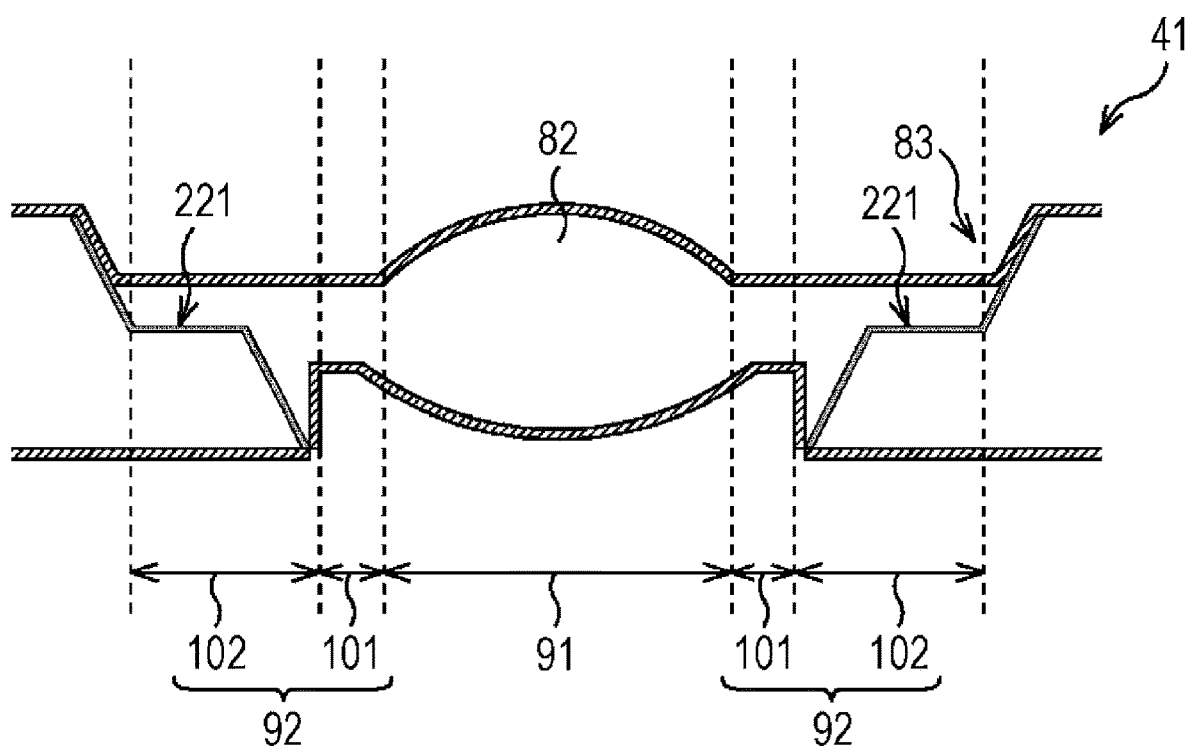
FIG. 26 is a diagram for explaining a manufacturing method for a lens-attached substrate.
Figure 27:
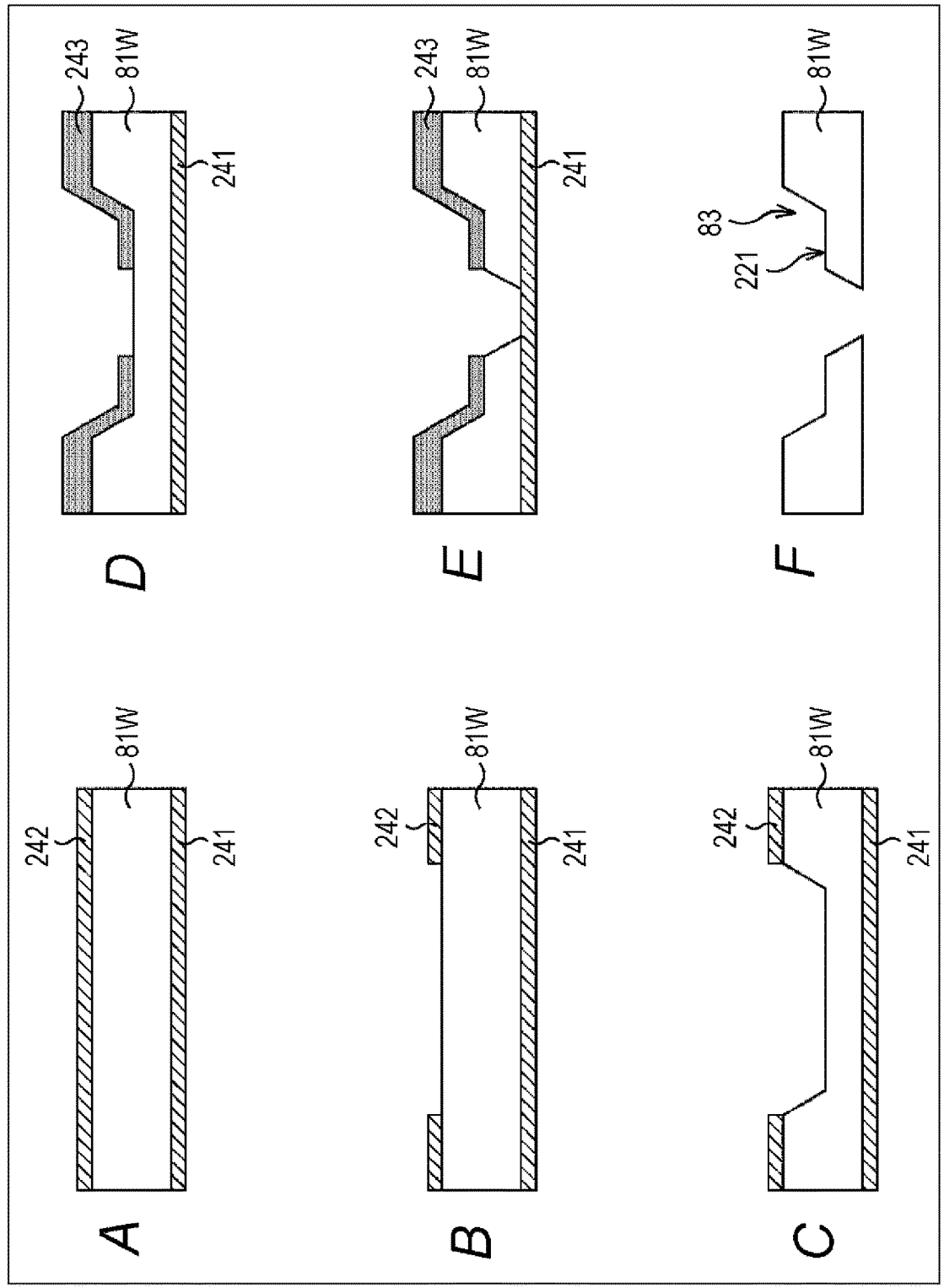
FIG. 27 is a diagram for explaining a manufacturing method for a lens-attached substrate.

FIG. 26 is a cross-sectional diagram illustrating another embodiment of the lens resin portion 82 and the through-hole 83 of the lens-attached substrate 41.

The lens resin portion 82 and the through-hole 83 illustrated in FIG. 26 have the following structure. (1) The sidewall of the through-hole 83 has a staircase shape having a staircase-type portion 221. (2) The leg portion 102 of the carrying portion 92 of the lens resin portion 82 is disposed above the sidewall of the through-hole 83 and extends on the staircase-type portion 221 provided to the through-hole 83 in the planar directions of the lens-attached substrate 41.

A method of forming the step-shaped through-hole 83 illustrated in FIG. 26 will be described with reference to FIGS. 27A to 27F.

First, as illustrated in FIG. 27A, an etching stop film 241 having resistance to the wet etching at the time of opening the through-hole is formed on one surface of the carrier substrate 81W. The etching stop film 241 may be made of, for example, a silicon nitride film.

Next, a hard mask 242 having resistance to the wet etching at the time of opening the through-hole is formed on the other surface of the carrier substrate 81W. The hard mask 242 may also be made of, for example, a silicon nitride film.

Next, as illustrated in FIG. 27B, a predetermined region of the hard mask 242 is opened for the first etching. In the first etching, a portion where is to be an upper end of the staircase-type portion 221 of the through-hole 83 is etched. For this reason, the opening portion of the hard mask 242 for the first etching becomes a region corresponding to the opening in the upper-side substrate surface of the lens-attached substrate 41 illustrated in FIG. 26.

Next, as illustrated in FIG. 27C, the carrier substrate 81W is etched by a predetermined depth according to the opening portion of the hard mask 242 by wet etching.

Next, as illustrated in FIG. 27D, the hard mask 243 is formed again on the surface of the after-etching carrier substrate 81W, and the hard mask 243 is opened corresponding to the portion which is to be the lower side of the staircase-type portion 221 of the through-hole 83. The hard mask 243 for the second etching may also be made of, for example, a silicon nitride film.

Next, as illustrated in FIG. 27E, the carrier substrate 81W is etched according to the opening portion of the hard mask 243 by wet etching until the etching stop film 241 is exposed.

Finally, as illustrated in FIG. 27F, the hard mask 243 of the upper surface of the carrier substrate 81W and the etching stop film 241 of the lower surface are removed.

As described heretofore, the etching of the carrier substrate 81W for forming the through-hole by wet etching is performed as two times of divided etchings, so that the step-shaped through-hole 83 illustrated in FIG. 26 is obtained.

Figure 28:
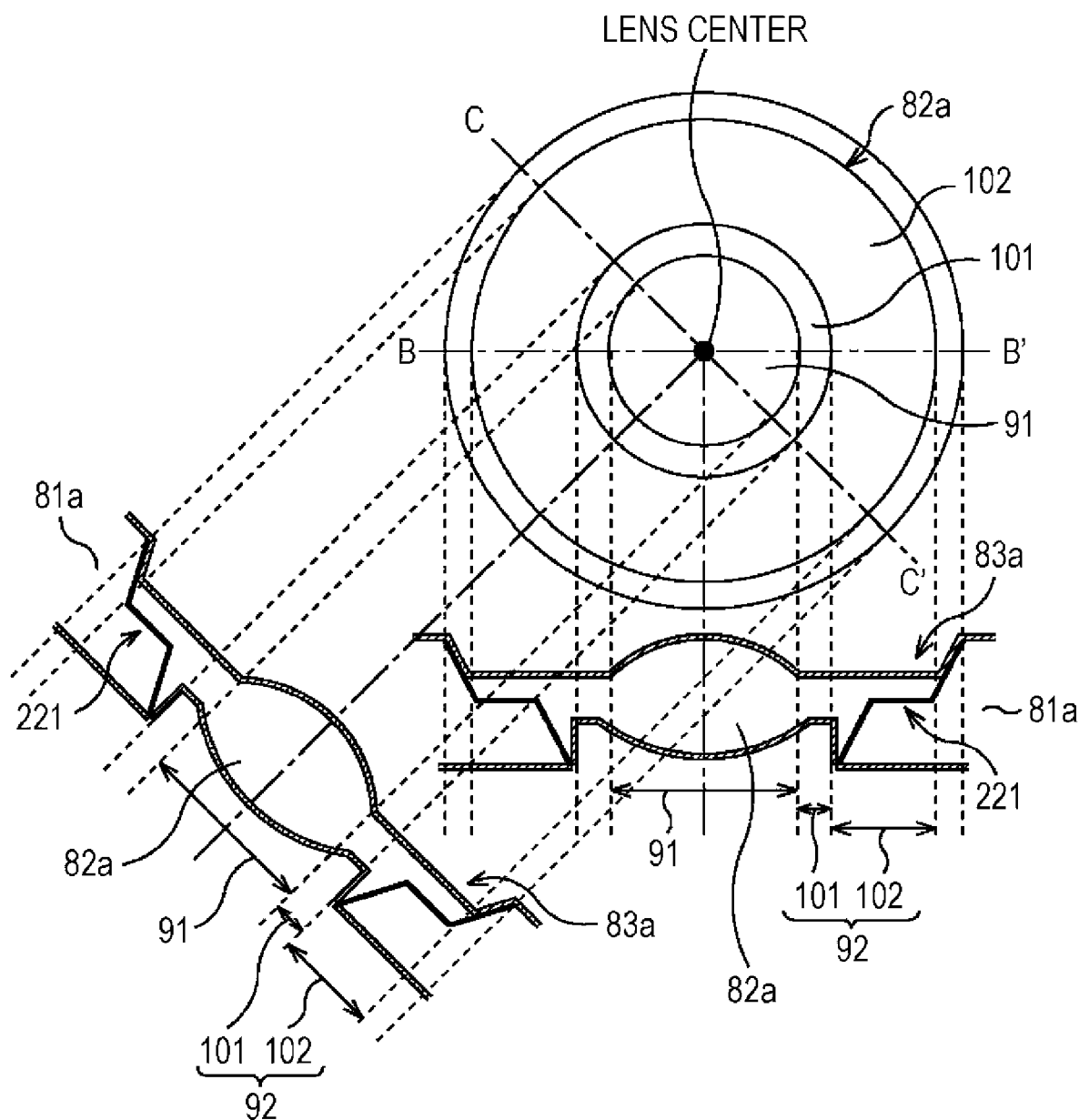
FIG. 28 is a diagram for explaining a manufacturing method for a lens-attached substrate.

FIG. 28 illustrates a plan diagram and cross-sectional diagrams of the carrier substrate 81a and the lens resin portion 82a of the lens-attached substrate 41a in the case where the through-hole 83a has a staircase-type portion 221 and the planar shape of the through-hole 83a is a circle.

The cross-sectional diagrams of the lens-attached substrate 41a of FIG. 28 illustrate cross-sectional diagrams taken along lines B-B' and C-C' of the plan diagram.

In the case where the planar shape of the through-hole 83a is a circle, the cross-section shape of the through-hole 83a is naturally the same irrespective of the direction of the diameter. In addition, the cross-section shapes of the outer edge of the lens resin portion 82a, the arm portion 101, and the leg portion 102 are formed as to be the same irrespective of the direction of the diameter.

In comparison with the through-hole 83a of FIG. 14 having no staircase-type portion 221 in the through-hole 83a, due to the through-hole 83a having the staircase shape of FIG. 28, it is possible to obtain a function or an effect that the contact area between the leg portion 102 of the carrying portion 92 the lens resin portion 82 and the sidewall of the through-hole 83a can be increased. In addition, therefore, it is possible to obtain a function or an effect that the adhesion strength between the lens resin portion 82 and the sidewall of the through-hole 83a, in other words, the adhesion strength between the lens resin portion 82a and the carrier substrate 81W is increased.

Figure 29:
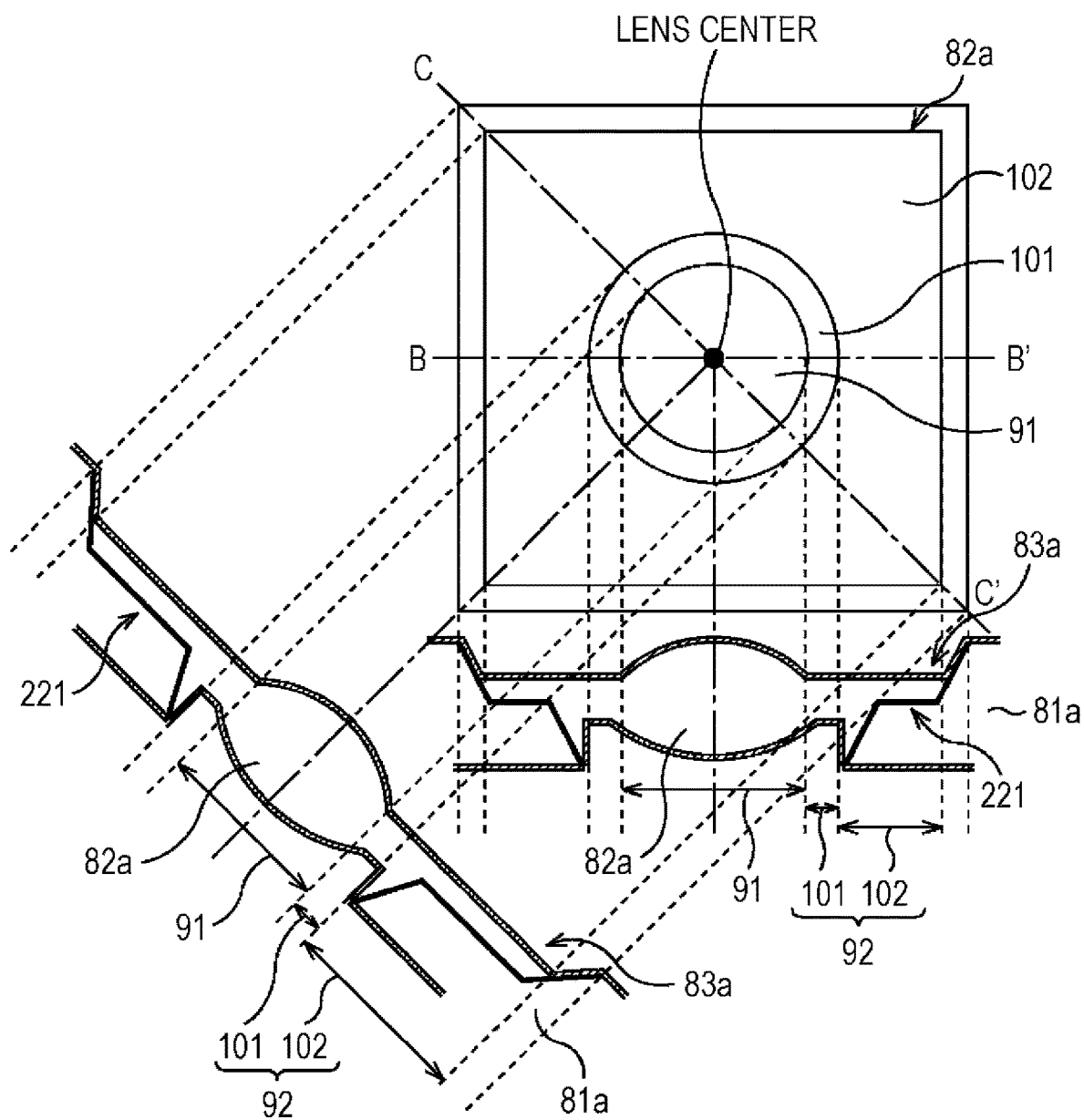
FIG. 29 is a diagram for explaining a manufacturing method for a lens-attached substrate.

FIG. 29 illustrates a plan diagram and cross-sectional diagrams of the carrier substrate 81a and the lens resin portion 82a of the lens-attached substrate 41a in the case where the through-hole 83a has a staircase-type portion 221 and the planar shape of the through-hole 83a is a quadrangle.

The cross-sectional diagrams of the lens-attached substrate 41a of FIG. 29 illustrate cross-sectional diagrams taken along lines B-B' and C-C' of the plan diagram.

The lens resin portion 82 and the through-hole 83 illustrated in FIG. 29 have the following structure. (1) The lengths of the arm portion 101 disposed in the outer circumference of the lens portion 91 are the same in the side direction and the diagonal direction of a quadrangle. (2) The lengths of the leg portion 102 which is disposed outside the arm portion 101 and extends to the sidewall of the through-hole 83a are set so that the length of the leg portion 102 in the diagonal direction of the quadrangle is larger than the length of the leg portion 102 in the side direction of the quadrangle.

As illustrated in FIG. 29, the leg portion 102 is not in direct contact with the lens portion 91, and the arm portion 101 is in direct contact with the lens portion 91.

In the lens resin portion 82a of FIG. 29, similarly to the lens resin portion 82a disclosed in FIG. 24, the length and thickness of the arm portion 101 being in direct contact with the lens portion 91 are set to be constant over the entire outer circumference of the lens portion 91, so that it is possible to obtain an effect that the entire lens portion 91 is supported evenly by a constant force.

In addition, since the entire lens portion 91 is supported evenly by a constant force, for example, in the case where a stress is applied to the entire outer circumference of the through-hole 83a by the carrier substrate 81a surrounding the through-hole 83a, the stress is exerted on the entire lens portion 91 evenly, so that it is possible to obtain a function or an effect that unevenly transferring of the stress to a specific portion of the lens portion 91 is suppressed.

In addition, in comparison with the through-hole 83a of FIG. 24 or the like having no staircase-type portion 221 in the through-hole 83a, due to the structure of the through-hole 83a of FIG. 29, it is possible to obtain a function or an effect that the contact area between the leg portion 102 of the carrying portion 92 the lens resin portion 82a and the sidewall of the through-hole 83a can be increased. Therefore, it is possible to obtain a function or an effect that the adhesion strength between the lens resin portion 82a and the sidewall portion of the through-hole 83a, in other words, the adhesion strength between the lens resin portion 82a and the carrier substrate 81a is increased.

11. Directing Joining of Lens-Attached Substrates

Next, direct joining of the substrate-state lens-attached substrates 41W where a plurality of the lens-attached substrates 41 are formed will be described.

Figure 30:
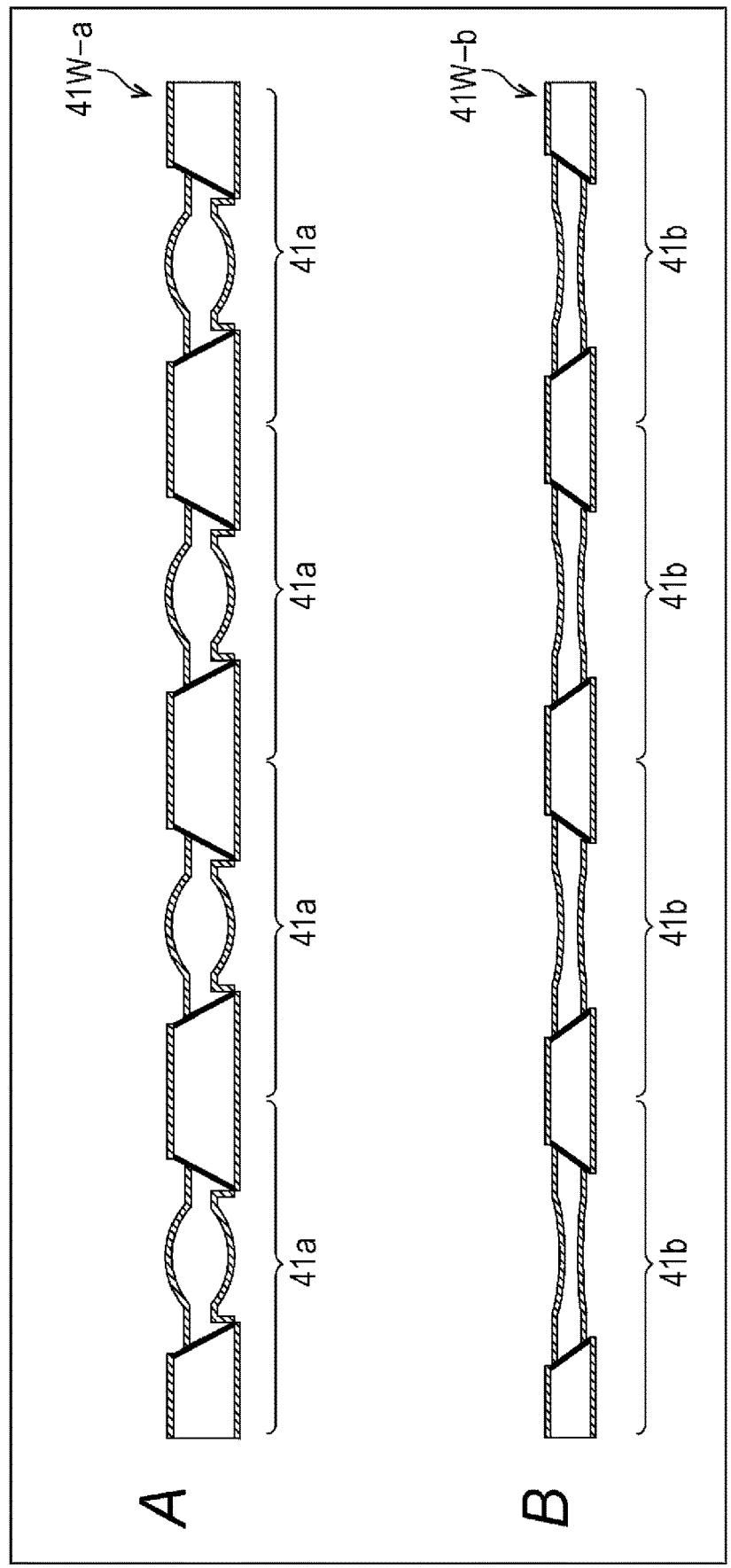
FIG. 30 is a diagram for explaining joining of substrate-state lens-attached substrates.

In the description hereinafter, as illustrated in FIGS. 30A and 30B, the substrate-state lens-attached substrate 41W where a plurality of the lens-attached substrates 41a are formed is referred to as a lens-attached substrate 41W-a, and the substrate-state lens-attached substrate 41W where a plurality of the lens-attached substrates 41b are formed is referred to as a lens-attached substrate 41W-b. With respect to the lens-attached substrates 41c to 41e, the same notation is applied.

Direct joining of the substrate-state lens-attached substrate 41W-a and the substrate-state lens-attached substrate 41W-b will be described with reference to FIGS. 31A and 31B.

Figure 31:
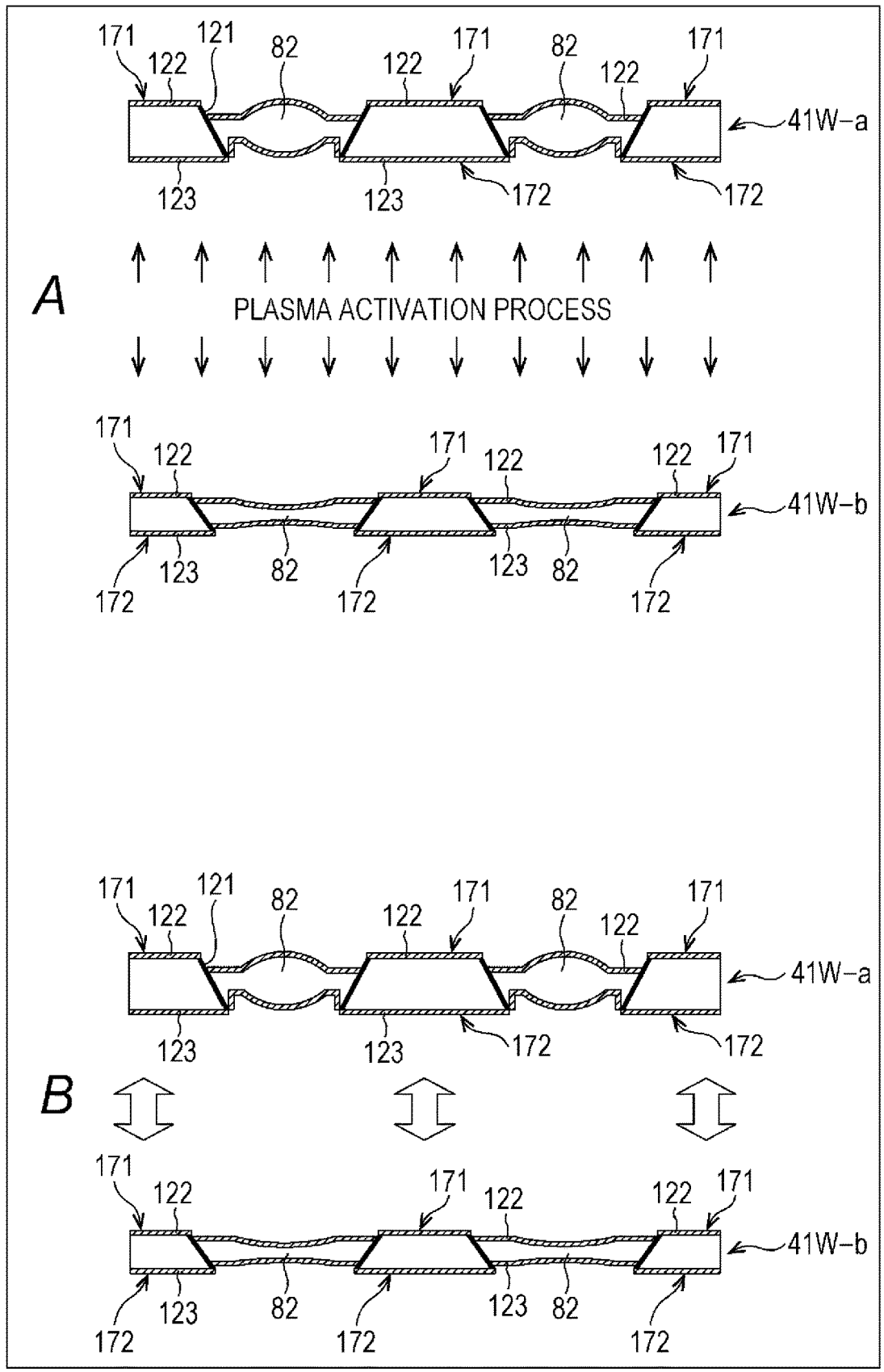
FIG. 31 is a diagram for explaining joining of substrate-state lens-attached substrates.

In addition, in FIGS. 31A and 31B, the components of the lens-attached substrate 41W-b corresponding to those of the lens-attached substrate 41W-a are denoted by the same reference numerals as those of the lens-attached substrate 41W-a.

An upper surface layer 122 or 125 is formed on the upper surfaces of the lens-attached substrate 41W-a and the lens-attached substrate 41W-b. A lower surface layer 123 or 124 is formed on the lower surfaces of the lens-attached substrate 41W-a and the lens-attached substrate 41W-b. Next, as illustrated in FIG. 31A, a plasma activation process is performed on the entire lower surface including the rear-side flat portion 172 of the lens-attached substrate 41W-a and the entire upper surface including the front-side flat portion 171 of the lens-attached substrate 41W-b which are to be a joined surface of the lens-attached substrates 41W-a and 41W-b. The gas used for the plasma activation process may be any gas which can be treated as plasma such as $O_2$, $N_2$, He, Ar, or $H_2$. However, if the gas of the same elements as constituent elements of the upper surface layer 122 and the lower surface layer 123 is used, a change in film qualities of the upper surface layer 122 and the lower surface layer 123 can be suppressed, and thus, the gas of the same elements as constituent elements thereof is preferred as the gas used for the plasma activation process.

Next, as illustrated in FIG. 31B, the rear-side flat portion 172 of the lens-attached substrate 41W-a and the front-side flat portion 171 of the lens-attached substrate 41W-b of which surface state is activated are adhered to each other.

By the process of adhering the lens-attached substrates, hydrogen bonding occurs between hydrogen of OH group of the surface of the lower surface layer 123 or 124 of the lens-attached substrate 41W-a and hydrogen of OH group of the surface of the upper surface layer 122 or 125 of the lens-attached substrate 41W-b. Therefore, the lens-attached substrate 41W-a and the lens-attached substrate 41W-b are fixed to each other. The process of adhering the lens-attached substrates can be performed under the condition of atmospheric pressure.

An annealing process is applied to the lens-attached substrate 41W-a and the lens-attached substrate 41W-b which are subject to the above-described adhering process. Therefore, dehydration condensation occurs from the state that the OH groups are hydrogen-bonded, a covalent bond through oxygen is formed between the lower surface layer 123 or 124 of the lens-attached substrate 41W-a and the upper surface layer 122 or 125 of the lens-attached substrate 41W-b. Alternatively, elements included in the lower surface layer 123 or 124 of the lens-attached substrate 41W-a and elements included in the upper surface layer 122 or 125 of the lens-attached substrate 41W-b are covalent-bonded. By this bonding, the two lens-attached substrates are firmly fixed to each other. In this manner, the covalent bond is formed between the lower surface layer 123 or 124 of the lens-attached substrate 41W disposed at the upper side and the upper surface layer 122 or 125 of the lens-attached substrate 41W disposed at the lower side, and thus, the two lens-attached substrates 41W are fixed to each other, which is called "direct joining" in this specification. The method of fixing a plurality of the lens-attached substrates over the entire substrate surface by using a resin disclosed in PTL 1 has a problem of the curing contraction or thermal expansion of the resin and the deformation of lens caused by the curing contraction or thermal expansion of the resin. On the contrary, in the direct joining according to an embodiment of the present technology, since any resin is not used at the time of fixing a plurality of the lens-attached substrates 41W, it is possible to obtain a function or an effect that, without occurrence of the curing-contraction or the thermal expansion, it is possible to fix a plurality of the lens-attached substrates 41W.

The annealing process may also be performed under the condition of atmospheric pressure. In order to perform the dehydration condensation, the temperature of the annealing process may be set to be 100° C. or more, 150° C. or more, or 200° C. On the other hand, in terms of protecting the energy curable resin 191 for forming the lens resin portion 82 from heat or suppressing degassing from the energy curable resin 191, the temperature of the annealing process may be set to be 400° C. or less, 350° C. or less, or 300° C. or less.

If the process of adhering the lens-attached substrates 41W or the process of directly joining the lens-attached substrates 41W is performed under the condition other than the atmospheric pressure, when the joined lens-attached substrate 41W-a and lens-attached substrate 41W-b are returned to the environment of atmospheric pressure, there occurs a difference in pressure between the space between the joined lens resin portion 82 and the lens resin portion 82 and the outside of the lens resin portion 82. Due to the difference in pressure, pressure is exerted on the lens resin portion 82, there is a problem in that the lens resin portion 82 is deformed.

Due to the performing of the process of adhering the lens-attached substrates 41W and the process of directly joining the lens-attached substrates under the condition of atmospheric pressure, it is possible to obtain a function or an effect that the deformation of the lens resin portion 82 which may occur in case of performing the joining under the condition other than the atmospheric pressure can be avoided.

Since the direct joining of the substrate by performing the plasma activation process, in other words, the plasma joining can suppress fluid flowing and thermal expansion, for example, in case of using a resin as the adhesive, it is possible to improve position accuracy at the time of joining the lens-attached substrate 41W-a and the lens-attached substrate 41W-b.

As described above, the upper surface layer 122 or the lower surface layer 123 are formed on the rear-side flat portion 172 of the lens-attached substrate 41W-a and the front-side flat portion 171 of the lens-attached substrate 41W-b. In the upper surface layer 122 and the lower surface layer 123, dangling bonds are easily formed by the previously-performed plasma activation process. Namely, the lower surface layer 123 formed on the rear-side flat portion 172 of the lens-attached substrate 41W-a and the upper surface layer 122 formed on the front-side flat portion 171 of the lens-attached substrate 41W-b have a function of increasing the joining strength.

In addition, in the case where the upper surface layer 122 or the lower surface layer 123 is configured with an oxide film, since the oxide film is not influenced by a change in film quality caused by plasma ($O_2$), it is also possible to obtain an effect that corrosion by plasma for the lens resin portion 82 is suppressed.

As described heretofore, the substrate-state lens-attached substrate 41W-a where a plurality of the lens-attached substrates 41a are formed and the substrate-state lens-attached substrate 41W-b where a plurality of the lens-attached substrates 41b are formed are subject to the surface activation process using plasma and, after that, are directly joined, in other words, are joined by using plasma joining.

FIGS. 32A to 32F illustrate a first stacking method of stacking the five lens-attached substrates 41a to 41e corresponding to the stacked lens structure 11 of FIG. 13 in the substrate state by using a method of joining the substrate-state lens-attached substrates 41W described with reference to FIGS. 31A and 31B.

Figure 32:
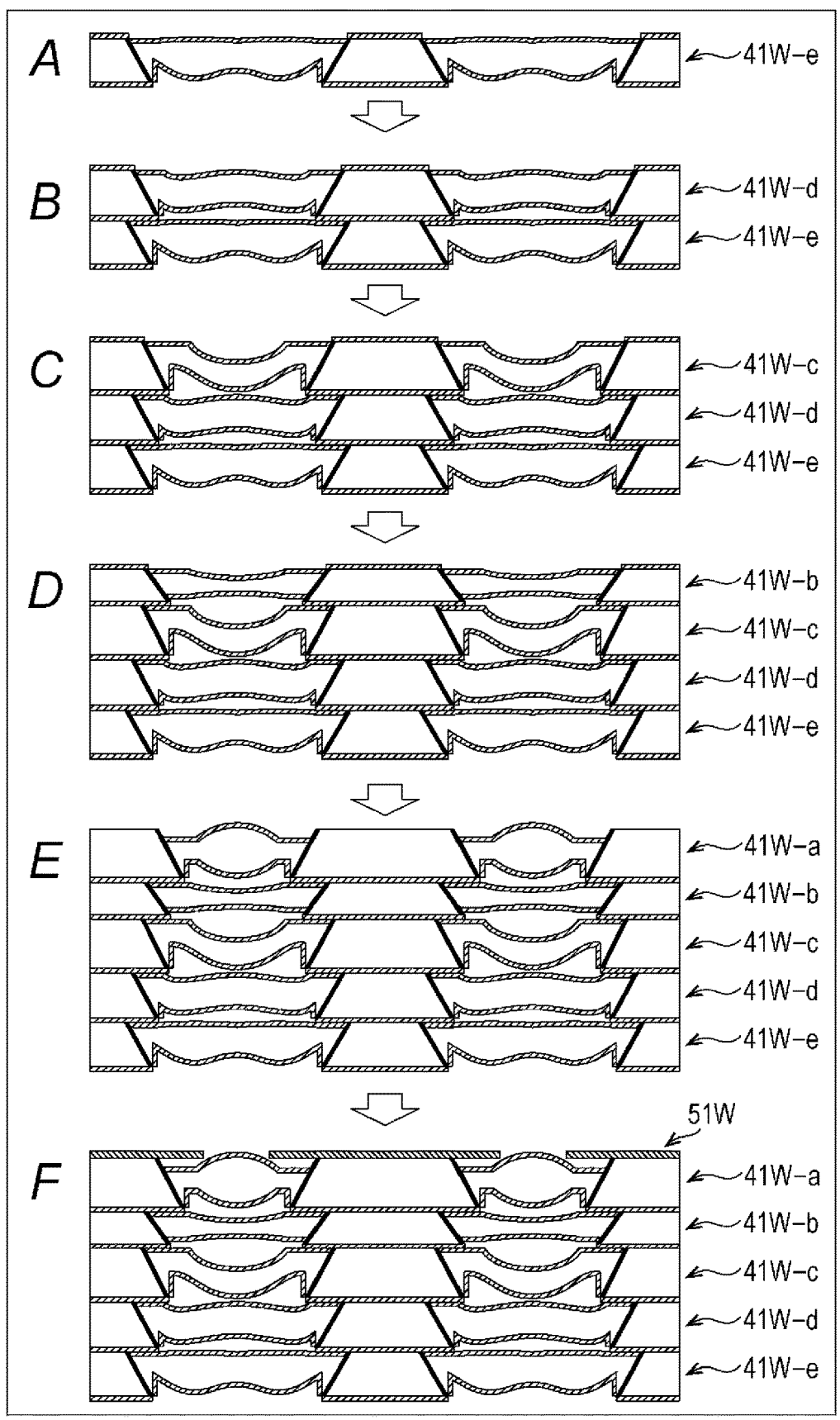
FIG. 32 is a diagram for explaining a first stacking method of stacking five lens-attached substrates in a substrate state.

First, as illustrated in FIG. 32A, the substrate-state lens-attached substrate 41W-e located in the lowermost layer in the stacked lens structure 11 is prepared.

Next, as illustrated in FIG. 32B, the substrate-state lens-attached substrate 41W-d located as the second layer from the bottom of the stacked lens structure 11 is jointed on the substrate-state lens-attached substrate 41W-e.

Next, as illustrated in FIG. 32C, the substrate-state lens-attached substrate 41W-c located as the third layer from the bottom of the stacked lens structure 11 is joined on the substrate-state lens-attached substrate 41W-d.

Next, as illustrated in FIG. 32D, the substrate-state lens-attached substrate 41W-b located as the fourth layer from the bottom of the stacked lens structure 11 is joined on the substrate-state lens-attached substrate 41W-c.

Next, as illustrated in FIG. 32E, the substrate-state lens-attached substrate 41W-a located as the fifth layer from the bottom of the stacked lens structure 11 is joined on the substrate-state lens-attached substrate 41W-b.

Finally, as illustrated in FIG. 32F, the aperture stop plate 51W located in the uppermost layer of the lens-attached substrate 41a in the stacked lens structure 11 is joined on the substrate-state lens-attached substrate 41W-a.

In this manner, the five substrate-state lens-attached substrates 41W-a to 41W-e are sequentially stacked one by one from the lower-layer lens-attached substrate 41W to the upper-layer lens-attached substrate 41W in the stacked lens structure 11, so that the substrate-state stacked lens structure 11W is obtained.

FIGS. 33A to 33F illustrate a second stacking method of stacking the five lens-attached substrates 41a to 41e corresponding to the stacked lens structure 11 of FIG. 13 in the substrate state by using a method of joining the substrate-state lens-attached substrates 41W described with reference to FIGS. 31A and 31B.

Figure 33:
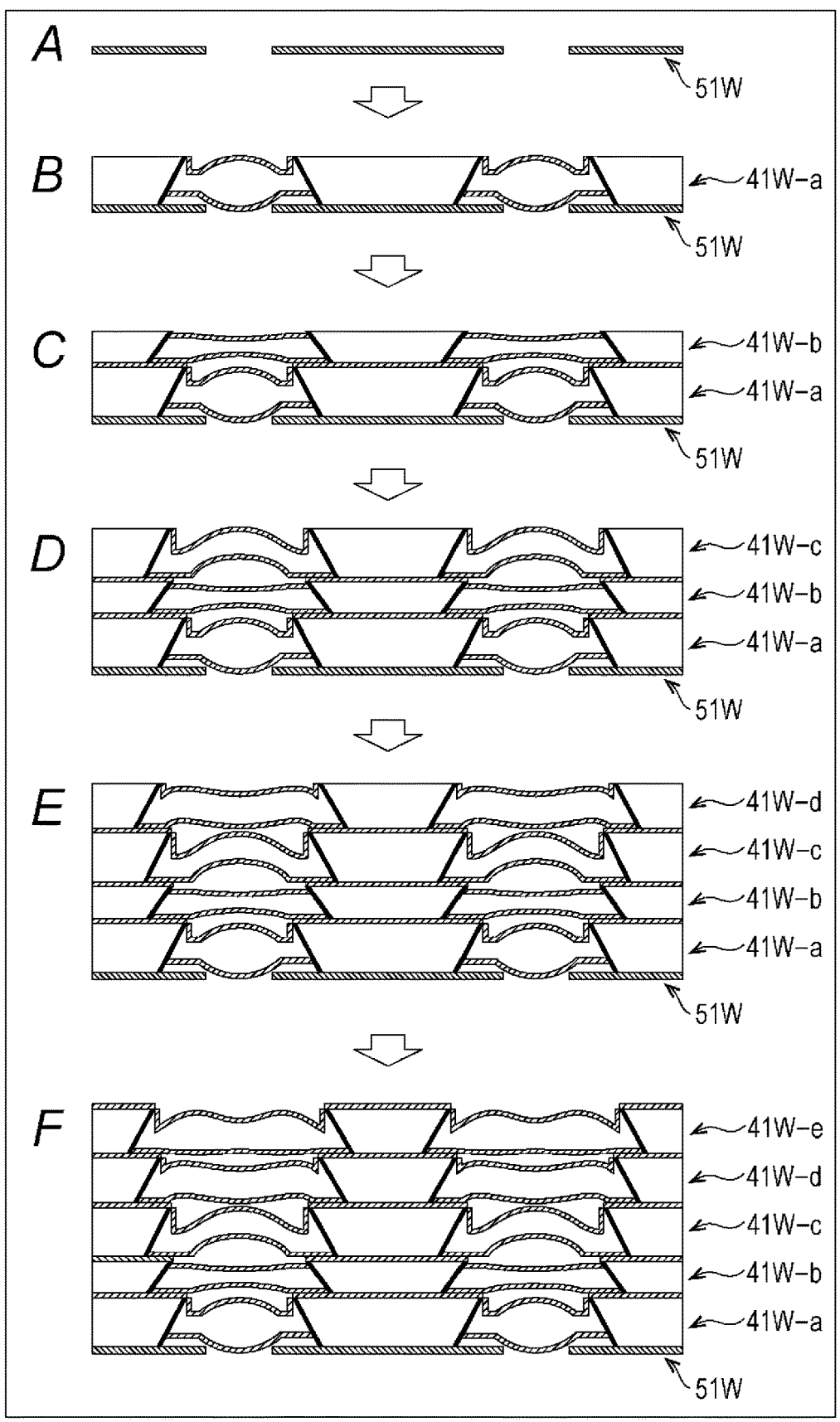
FIG. 33 is a diagram for explaining a second stacking method of stacking five lens-attached substrates in a substrate state.

First, as illustrated in FIG. 33A, the aperture stop plate 51W located in the upper layer of the lens-attached substrate 41a in the stacked lens structure 11 is prepared.

Next, as illustrated in FIG. 33B, the substrate-state lens-attached substrate 41W-a located in the uppermost layer in the stacked lens structure 11 is turned upside down and is joined on the aperture stop plate 51W.

Next, as illustrated in FIG. 33C, the substrate-state lens-attached substrate 41W-b lactated as the second layer from the top of the stacked lens structure 11 is turned upside down and is joined on the substrate-state lens-attached substrate 41W-a.

Next, as illustrated in FIG. 33D, the substrate-state lens-attached substrate 41W-c lactated as the third layer from the top of the stacked lens structure 11 is turned upside down and is joined on the substrate-state lens-attached substrate 41W-b.

Next, as illustrated in FIG. 33E, the substrate-state lens-attached substrate 41W-d lactated as the fourth layer from the top of the stacked lens structure 11 is turned upside down and is joined on the substrate-state lens-attached substrate 41W-c.

Finally, as illustrated in FIG. 33F, the substrate-state lens-attached substrate 41W-e lactated as the fifth layer from the top of the stacked lens structure 11 is turned upside down and is joined on the substrate-state lens-attached substrate 41W-d.

In this manner, the five substrate-state lens-attached substrates 41W-a to 41W-e are sequentially stacked one by one from the upper-layer lens-attached substrate 41W to the lower-layer lens-attached substrate 41W in the stacked lens structure 11, so that the substrate-state stacked lens structure 11W is obtained.

The five substrate-state lens-attached substrates 41W-a to 41W-e which are stacked by the stacking method described with reference to FIG. 32A to 32F or 33A to 33F are diced in units of a module or a chip by using a blade, a laser, or the like, so that the stacked lens structure 11 where the five lens-attached substrates 41a to 41e are stacked is obtained.

12. Eighth and Ninth Embodiments of Camera Module

Figure 34:
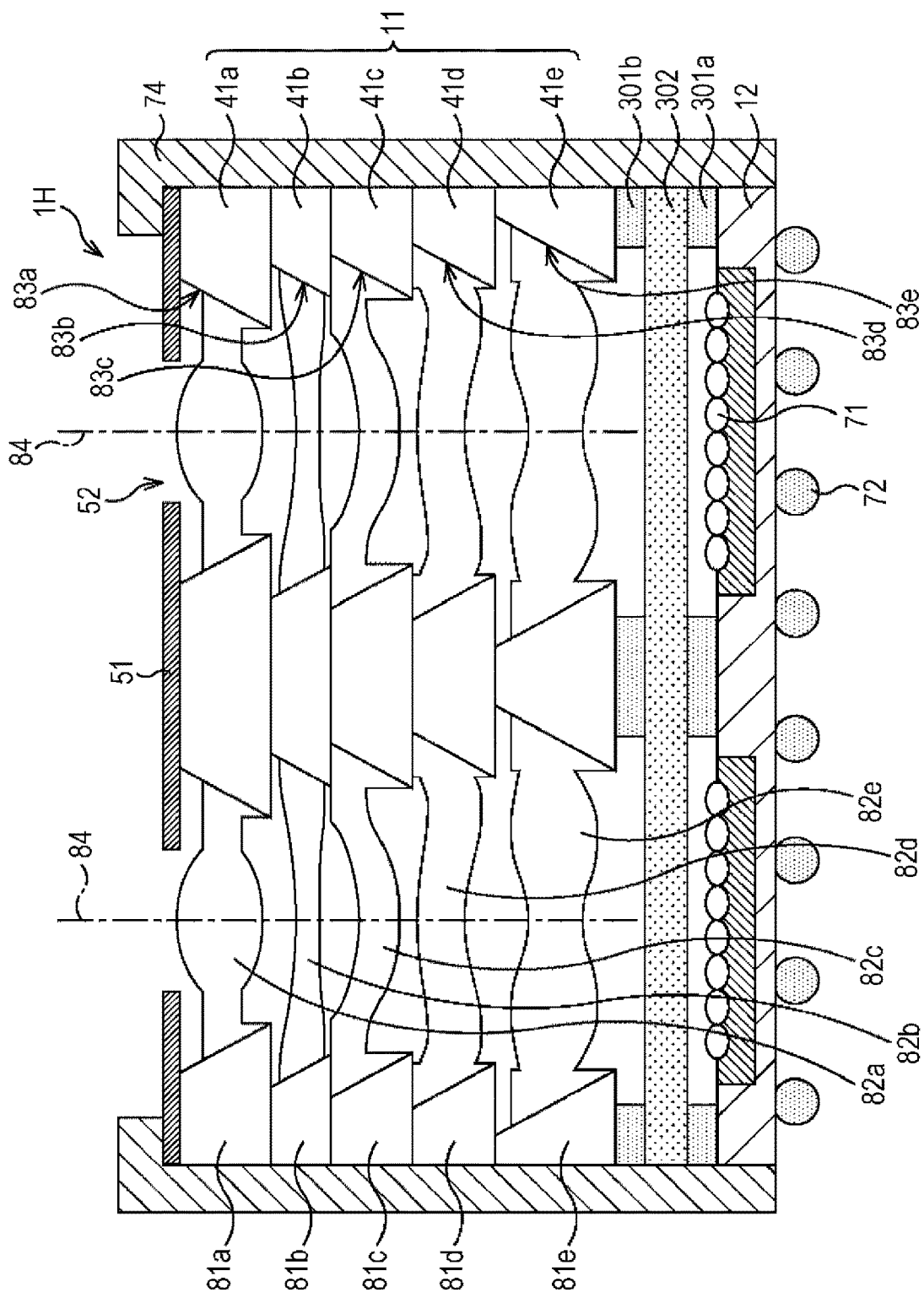
FIG. 34 is a diagram illustrating an eighth embodiment of a camera module using a stacked lens structure employing the present technology.

FIG. 34 is a diagram illustrating an eighth embodiment of a camera module using a stacked lens structure employing the present technology.

Figure 35:
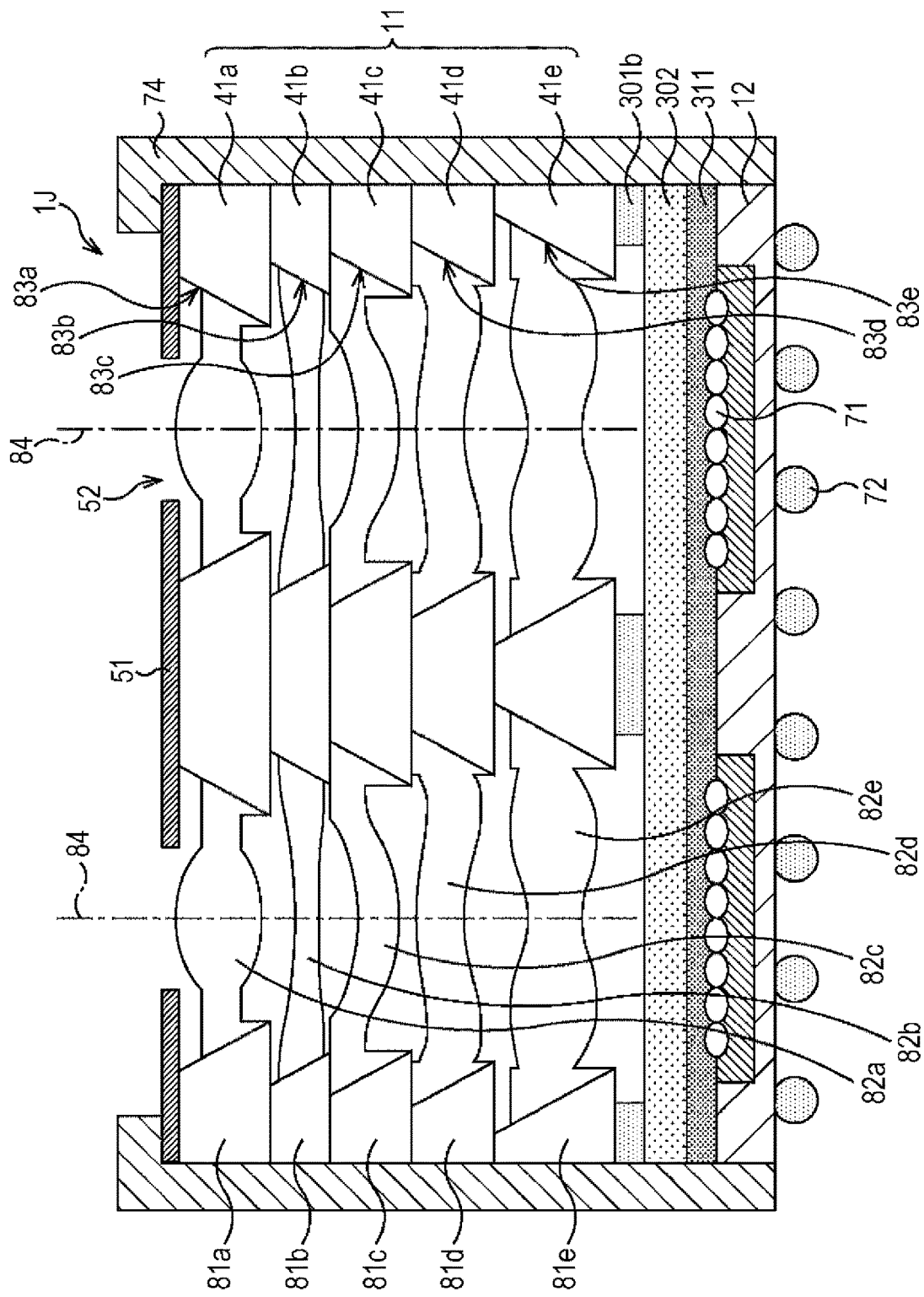
FIG. 35 is a diagram illustrating a ninth embodiment of a camera module using a stacked lens structure employing the present technology.

FIG. 35 is a diagram illustrating a ninth embodiment of a camera module using a stacked lens structure employing the present technology.

In the description of FIGS. 34 and 35, only the portions different from those of the camera module E illustrated in FIG. 13 will be described.

In the camera module 1H of FIG. 34 and the camera module 1J of FIG. 35, the portion of the structural material 73 of the camera module E illustrated in FIG. 13 is replaced by a different structure.

In the camera module 1H of FIG. 34, the portion of the structural material 73 in the camera module 1J is replaced by structural materials 301a and 301b and a light-transmitting substrate 302.

More specifically, the structural material 301a is disposed at a portion of the upper side of the light-receiving device 12. The light-receiving device 12 and the light-transmitting substrate 302 are fixed to each other through the structural material 301a. The structural material 301a is, for example, an epoxy-based resin.

The structural material 301b is disposed at the upper side of the light-transmitting substrate 302. The light-transmitting substrate 302 and the stacked lens structure 11 are fixed to each other through the structural material 301b. The structural material 301b is, for example, an epoxy-based resin.

On the contrary, in the camera module 1J of FIG. 35, the portion of the structural material 301a of the camera module 1H of FIG. 34 is replaced by a resin layer 311 having a light-transmitting property.

The resin layer 311 is disposed on the entire upper-side surface of the light-receiving device 12. The light-receiving device 12 and the light-transmitting substrate 302 are fixed to each other through the resin layer 311. Due to the resin layer 311 disposed on the entire upper-side surface of the light-receiving device 12, it is possible to obtain a function or an effect that, in the case where stress is applied from the upper side of the light-transmitting substrate 302 to the light-transmitting substrate 302, the stress is prevented from being concentrated on some portion of the light-receiving device 12 and, and thus, the stress is distributively received by the entire surface of the light-receiving device 12.

A structural material 301b is disposed at the upper side of the light-transmitting substrate 302. The light-transmitting substrate 302 and the stacked lens structure 11 are fixed through the structural material 301b.

The camera module 1H of FIG. 34 and the camera module 1J of FIG. 35 are configured to include the light-transmitting substrate 302 at the upper side of the light-receiving device 12. Due to the light-transmitting substrate 302, it is possible to obtain a function or an effect that, for example, during the manufacturing of the camera module 1H or 1J, the light-receiving device 12 is prevented from being scratched.

13. Tenth Embodiment of Camera Module

Figure 36:
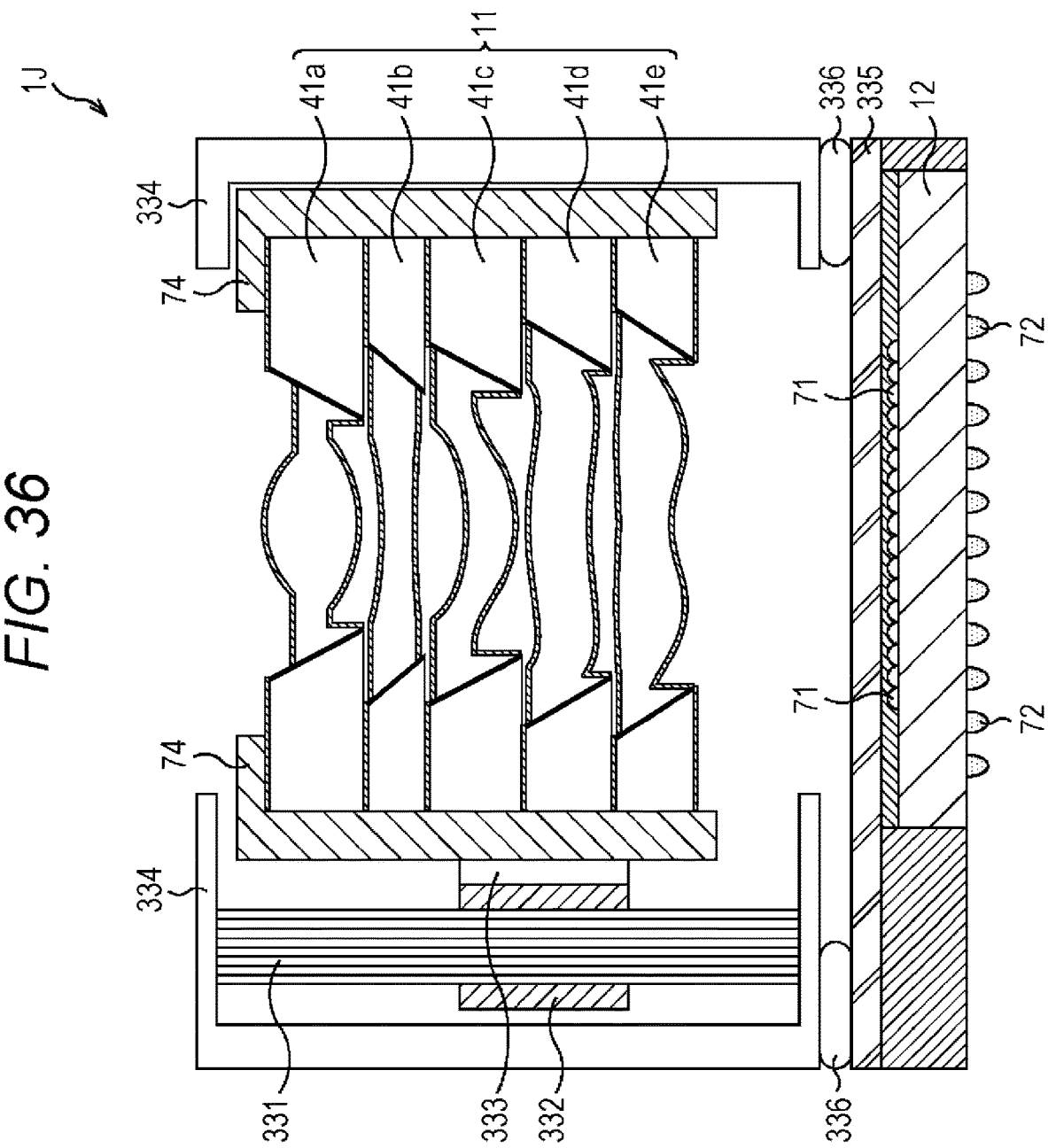
FIG. 36 is a diagram illustrating a tenth embodiment of a camera module using a stacked lens structure employing the present technology.

FIG. 36 is a diagram illustrating a tenth embodiment of a camera module using a stacked lens structure employing the present technology.

In a camera module 1J illustrated in FIG. 36, a stacked lens structure 11 is accommodated in a lens barrel 74. The lens barrel 74 is fixed to a moving member 332 moving along a shaft 331 by a fixing member 333. The lens barrel 74 is moved in the axis direction of the shaft 331 by a driving motor (not shown), so that the distance from the stacked lens structure 11 to the imaging plane of the light-receiving device 12 is adjusted.

The lens barrel 74, the shaft 331, the moving member 332, and the fixing member 333 are accommodated in a housing 334. A protective substrate 335 is disposed in the upper portion of the light-receiving device 12, and the protective substrate 335 and the housing 334 are connected to each other by an adhesive 336.

Due to the above-described mechanism of moving the stacked lens structure 11, it is possible to obtain a function or an effect that, when a camera using the camera module 1J captures an image, autofocus operation can be allowed to be performed.

14. Eleventh Embodiment of Camera Module

Figure 37:
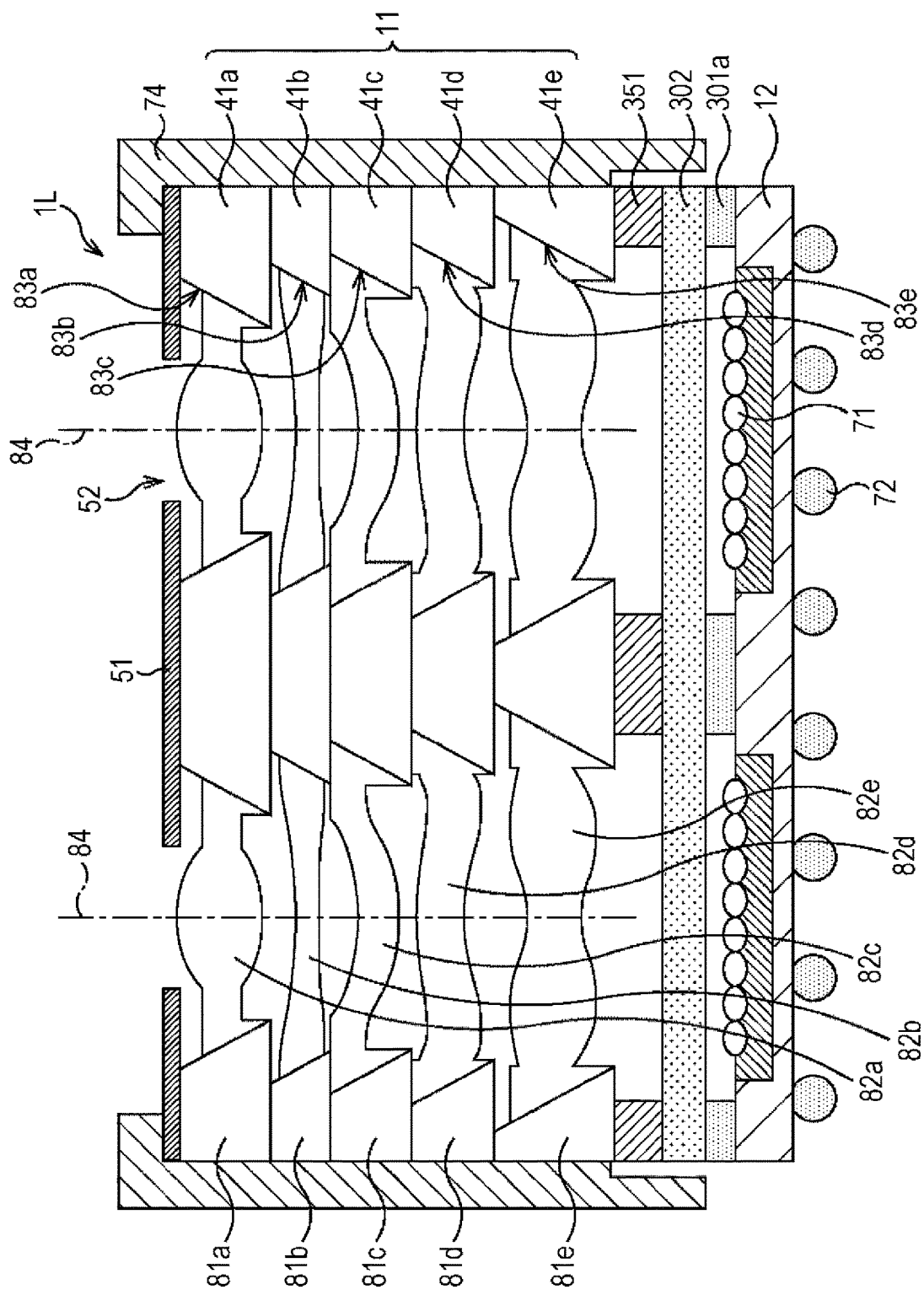
FIG. 37 is a diagram illustrating an eleventh embodiment of a camera module using a stacked lens structure employing the present technology.

FIG. 37 is a diagram illustrating an eleventh embodiment of a camera module using a stacked lens structure employing the present technology.

A camera module 1L of FIG. 37 is a camera module with a focus adjustment mechanism using a piezoelectric device.

Namely, in the camera module 1L, similarly to the camera module 1H of FIG. 34, a structural material 301a is disposed in a portion of the upper side of the light-receiving device 12. The light-receiving device 12 and the light-transmitting substrate 302 are fixed to each other through the structural material 301a. The structural material 301a is, for example, an epoxy-based resin.

A piezoelectric device 351 is disposed at the upper side of the light-transmitting substrate 302. The light-transmitting substrate 302 and the stacked lens structure 11 are fixed to each other through the piezoelectric device 351.

In the camera module 1L, by applying a voltage to the piezoelectric device 351 disposed at the lower side of the stacked lens structure 11 or by cutting off the voltage, the stacked lens structure 11 can be moved in the upward and downward directions. The means for moving the stacked lens structure 11 is not limited to the piezoelectric device 351, but other devices of which shape is changed according to applying or cutting-off of the voltage may be used. For example, a MEMS device may be used.

Due to the above-described mechanism of moving the stacked lens structure 11, it is possible to obtain a function or an effect that, when a camera using the camera module 1L captures an image, autofocus operation can be allowed to be performed.

15. Effects of Structure According to Embodiment of the Present Technology in Comparison with Other Structures The stacked lens structure 11 is a structure (hereinafter, referred to as the structure according to an embodiment of the present technology) where the lens-attached substrates 41 are directly joined. The functions and effects of the structure according to an embodiment of the present technology will be described in comparison with other structures of lens-attached substrates where lenses are formed.

Comparative Structure Example 1

Figure 38:
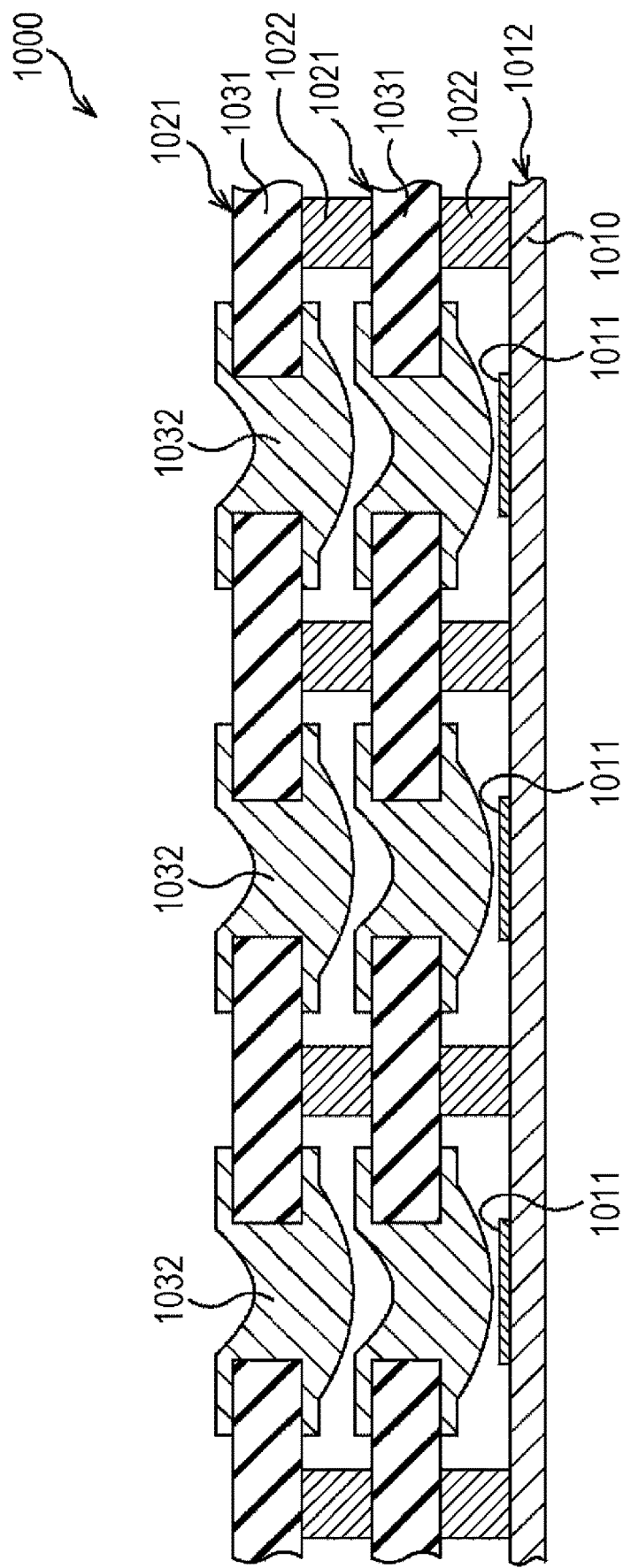
FIG. 38 is a cross-sectional diagram illustrating a wafer-level stacked structure as Comparative Structure Example 1.

FIG. 38 is a cross-sectional diagram of a first substrate structure (hereinafter, referred to as Comparative Structure Example 1) for comparing with the structure according to an embodiment of the present technology which is a wafer-level stacked structure disclosed in FIG. 14(b) of JP 2011-138089 A (hereinafter, referred to as Comparative Literature 1).

A wafer-level stacked structure 1000 illustrated in FIG. 38 has a structure where two lens array substrates 1021 are stacked on a sensor array substrate 1012 where a plurality of the image sensors 1011 are disposed on the wafer substrate 1010 through a columnar spacer 1022. Each lens array substrate 1021 is configured to include a lens-attached substrate 1031 and lenses 1032 formed in a plurality of through-hole portions formed in the lens-attached substrate 1031.

Comparative Structure Example 2

Figure 39:
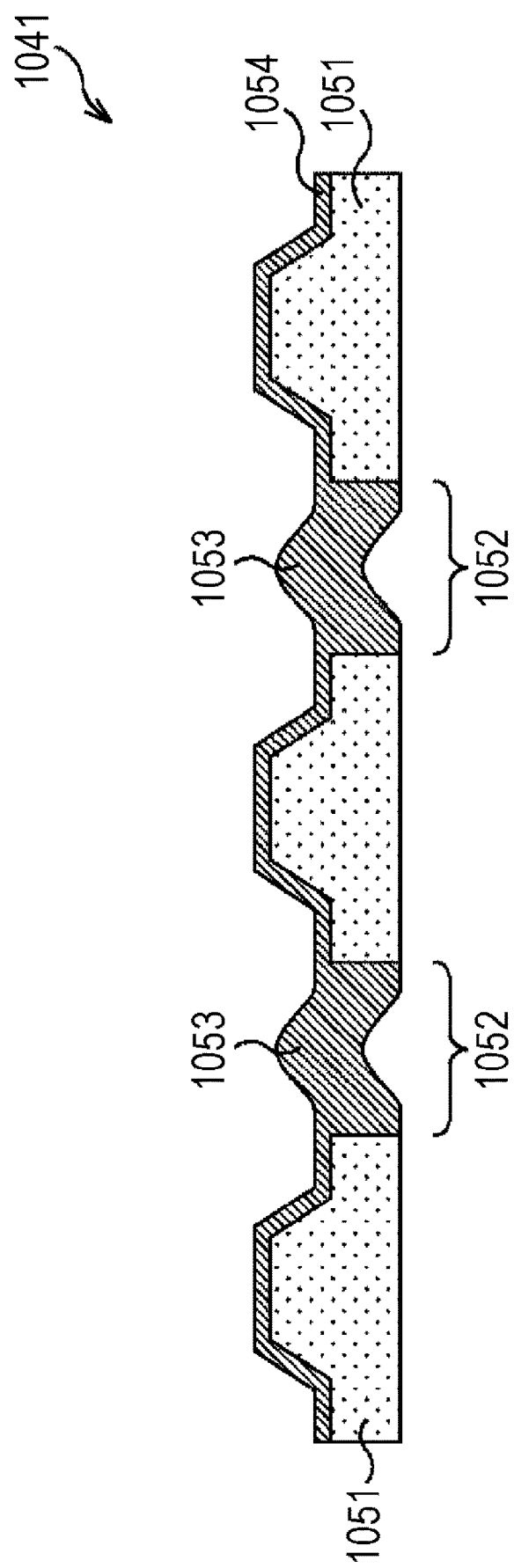
FIG. 39 is a cross-sectional diagram illustrating a lens array substrate as Comparative Structure Example 2.

FIG. 39 is a cross-sectional diagram of a second substrate structure (hereinafter, referred to as Comparative Structure Example 2) for comparing with the structure according to an embodiment of the present technology which is a lens array structure disclosed in FIG. 5(a) of JP 2009-279790 A (hereinafter, referred to as Comparative Literature 2).

In a lens array substrate 1041 illustrated in FIG. 39, a lens 1053 is provided to each of through-holes 1052 provided to a flat-shaped substrate 1051. Each lens 1053 is made of a resin (energy curable resin) 1054, and the resin 1054 is also formed on the upper surface of the substrate 1051.

A manufacturing method for the lens array substrate 1041 of FIG. 39 will be described in brief with reference to FIGS. 40A to 40C.

Figure 40:
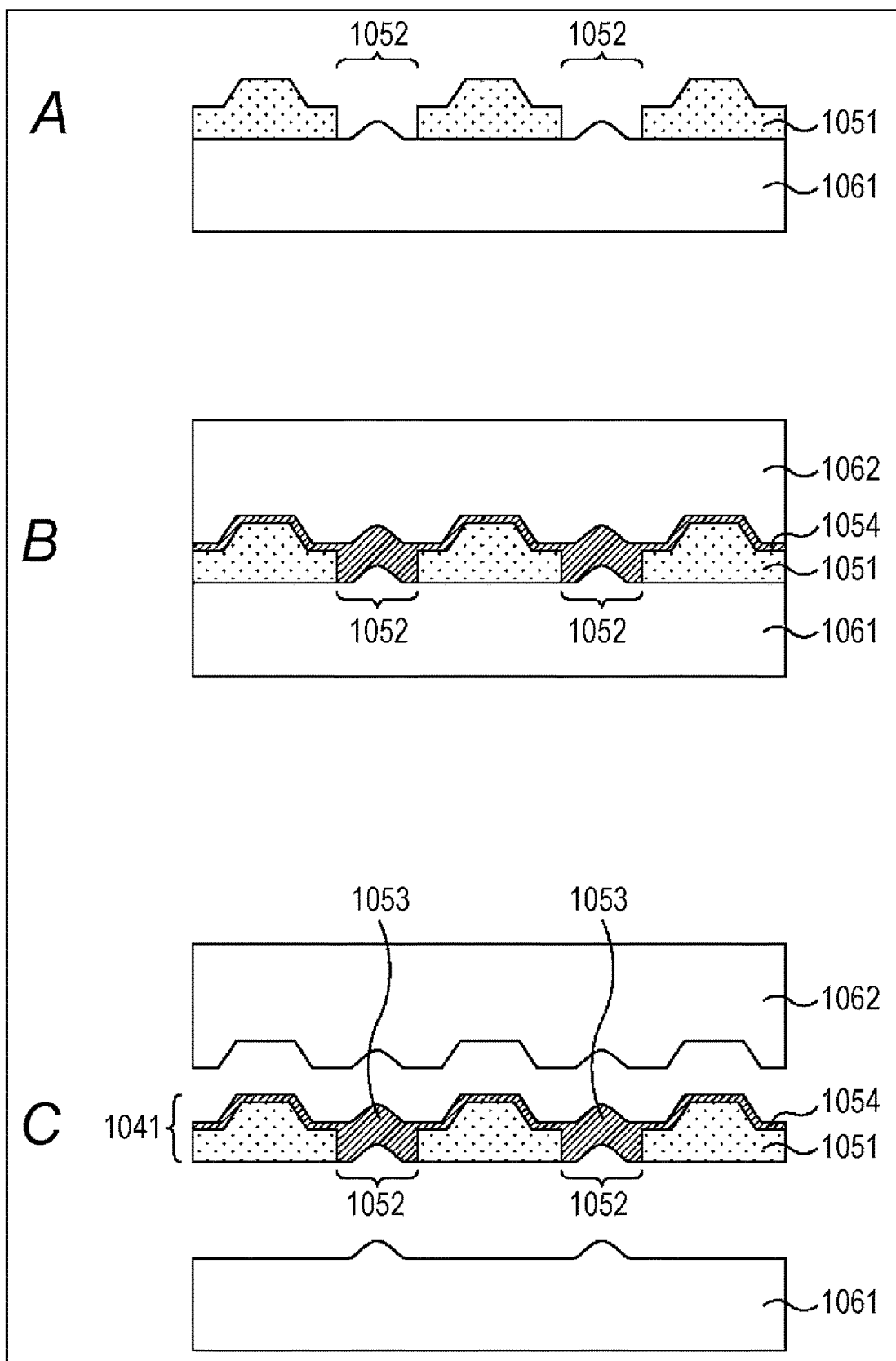
FIG. 40 is a diagram for explaining a manufacturing method for the lens array substrate of FIG. 39.

FIG. 40A illustrates a state that the substrate 1051 where a plurality of the through-holes 1052 are formed is disposed on a lower mold frame 1061. The lower mold frame 1061 is a mold frame of pressing the resin 1054 from the lower side thereof upwards in the subsequent process.

FIG. 40B illustrates a state that, after inner portions of a plurality of the through-holes 1052 and the upper surface of the substrate 1051 are applied with the resin 1054, an upper mold frame 1062 is disposed on the substrate 1051, and press-molding is performed by using the upper mold frame 1062 and the lower mold frame 1061. The upper mold frame 1062 is a mold frame of pressing the resin 1054 from the upper side thereof downwards. In the state illustrated in FIG. 40B, the curing of the resin 1054 is performed.

FIG. 40C illustrates a state that, after the resin 1054 is cured, the upper mold frame 1062 and the lower mold frame 1061 are demolded, so that the lens array substrate 1041 is completely formed.

The lens array substrate 1041 has the following features. (1) The resin 1054 formed at the positions of the through-holes 1052 of the substrate 1051 becomes the lenses 1053, and a plurality of the lenses 1053 are formed in the substrate 1051. In addition, (2) a thin layer of the resin 1054 is formed on the entire upper surface of the substrate 1051 disposed between a plurality of the lenses 1053.

In case of forming the structure where a plurality of the lens array substrates 1041 are stacked, it is possible to obtain a function or an effect that the thin layer of the resin 1054 formed on the entire upper surface of the substrate 1051 functions as an adhesive of adhering the substrates.

In addition, in case of forming the structure where a plurality of the lens array substrates 1041 are stacked, in comparison with the wafer-level stacked structure 1000 of FIG. 38 indicated as Comparative Structure Example 1, the adhering area between the substrates can be increased, the substrates can be adhered by a stronger force.

<Functions Obtained from Resin in Comparative Structure Example 2>

In Comparative Literature 2 disclosing the lens array substrate 1041 of FIG. 39 which is Comparative Structure Example 2, a function of the resin 1054 which is to be the lens 1053 is disclosed as follows.

In Comparative Structure Example 2, as the resin 1054, an energy curable resin is used. In addition, as an example of the energy curable resin, a photocurable resin is used. In the case where the photocurable resin is used as the energy curable resin, if the resin 1054 is irradiated with UV light, the resin 1054 is cured. By the curing, the resin 1054 is curing-contacted.

However, according to the structure of the lens array substrate 1041 of FIG. 39, even though the curing-contraction of the resin 1054 occurs, since the substrate 1051 is interposed among a plurality of the lenses 1053, the change of the distance between the lenses 1053 caused by the curing-contraction of the resin 1054 can be prevented, so that it is possible to suppress the bent state of the lens array substrate 1041 where a plurality of the lenses 1053 are disposed.

Comparative Structure Example 3

Figure 41:
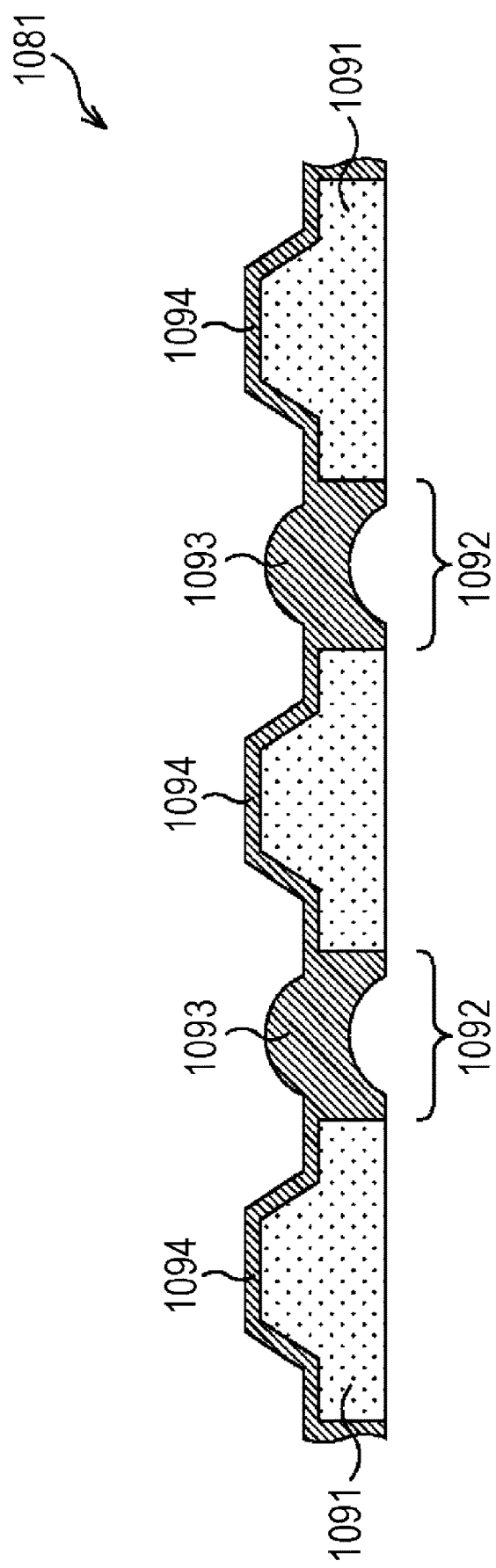
FIG. 41 is a cross-sectional diagram illustrating a lens array substrate as Comparative Structure Example 3.

FIG. 41 is a cross-sectional diagram of a third substrate structure (hereinafter, referred to as Comparative Structure Example 3) for comparing with the structure according to an embodiment of the present technology which is a lens array substrate disclosed in FIG. 1 of JP 2010-256563 A (hereinafter, referred to as Comparative Literature 3).

In a lens array substrate 1081 illustrated in FIG. 41, a lens 1093 is provided to each of through-holes 1092 provided to a flat-shaped substrate 1091. Each lens 1093 is made of a resin (energy curable resin) 1094, and the resin 1094 is also formed on the upper surface of the substrate 1091 where the through-holes 1092 are not provided.

A manufacturing method for the lens array substrate 1081 of FIG. 41 will be described in brief with reference to FIGS. 42A to 42C.

Figure 42:
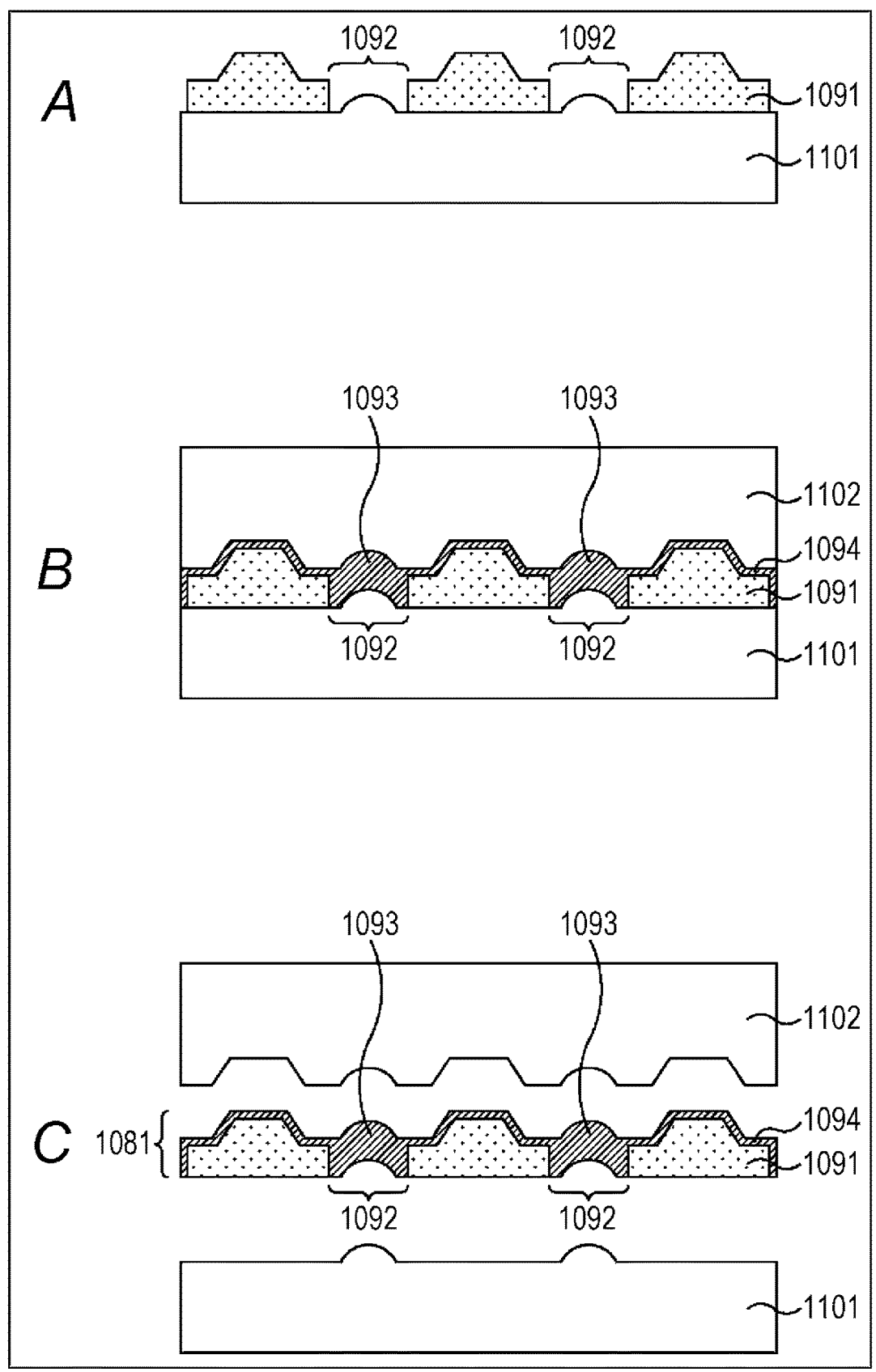
FIG. 42 is a diagram for explaining a manufacturing method for the lens array substrate of FIG. 41.

FIG. 42A illustrates a state that the substrate 1091 where a plurality of the through-holes 1092 are formed is disposed on a lower mold frame 1101. The lower mold frame 1101 is a mold frame of pressing the resin 1094 from the lower side thereof upwards in the subsequent process.

FIG. 42B illustrates a state that, after inner portions of a plurality of the through-holes 1092 and the upper surface of the substrate 1091 are applied with the resin 1094, an upper mold frame 1102 is disposed on the substrate 1091, and press-molding is performed by using the upper mold frame 1102 and the lower mold frame 1101. The upper mold frame 1102 is a mold frame of pressing the resin 1094 from the upper side thereof downwards. In the state illustrated in FIG. 42B, the curing of the resin 1094 is performed.

FIG. 42C illustrates a state that, after the resin 1094 is cured, the upper mold frame 1102 and the lower mold frame 1101 are demolded, so that the lens array substrate 1081 is completely formed.

The lens array substrate 1081 has the following features. (1) The resin 1094 formed at the positions of the through-holes 1092 of the substrate 1091 becomes the lenses 1093, and a plurality of the lenses 1093 are formed in the substrate 1091. In addition, (2) a thin layer of the resin 1094 is formed on the entire upper surface of the substrate 1091 disposed between a plurality of lenses 1093.

<Functions Obtained from Resin in Comparative Structure Example 3>

In Comparative Literature 3 disclosing the lens array substrate 1081 of FIG. 41 which is Comparative Structure Example 3, a function of the resin 1094 which is to be the lens 1093 is disclosed as follows.

In the Comparative Structure Example 3, as the resin 1094, an energy curable resin is used. In addition, an example of the energy curable resin, a photocurable resin is used. In the case where the photocurable resin is used as the energy curable resin, if the resin 1094 is irradiated with UV light, the resin 1094 is cured. By the curing, the resin 1094 is curing-contracted.

However, according to the structure of the lens array substrate 1081 of FIG. 41, even though the curing-contraction of the resin 1094 occurs, since the substrate 1091 is interposed among a plurality of the lenses 1093, the change of the distance between the lenses 1093 caused by the curing-contraction of the resin 1094 can be prevented, so that it is possible to suppress the bent state of the lens array substrate 1081 where a plurality of the lenses 1093 are disposed.

As described heretofore, Comparative Literature 2 and 3 disclose that, when a photocurable resin is cured, curing-contraction occurs. In addition, the fact that, when a photocurable resin is cured, curing-contraction occurs is also disclosed in, for example, JP 2013-1091 A or the like besides Comparative Literature 2 and 3.

In addition, if a resin is molded in a lens shape and the molded resin is cured, there is a problem in that the curing-contraction occurs in the resin. However, this problem is not limited to the photocurable resin. For example, similarly to the photocurable resin, in a thermosetting resin as a kind of an energy curable resin, there is a problem in that the curing-contraction occurs in the curing period. This is disclosed in, for example, Comparative Literature 1 and 3, JP 2010-204631 A, and the like.

Comparative Structure Example 4

Figure 43:
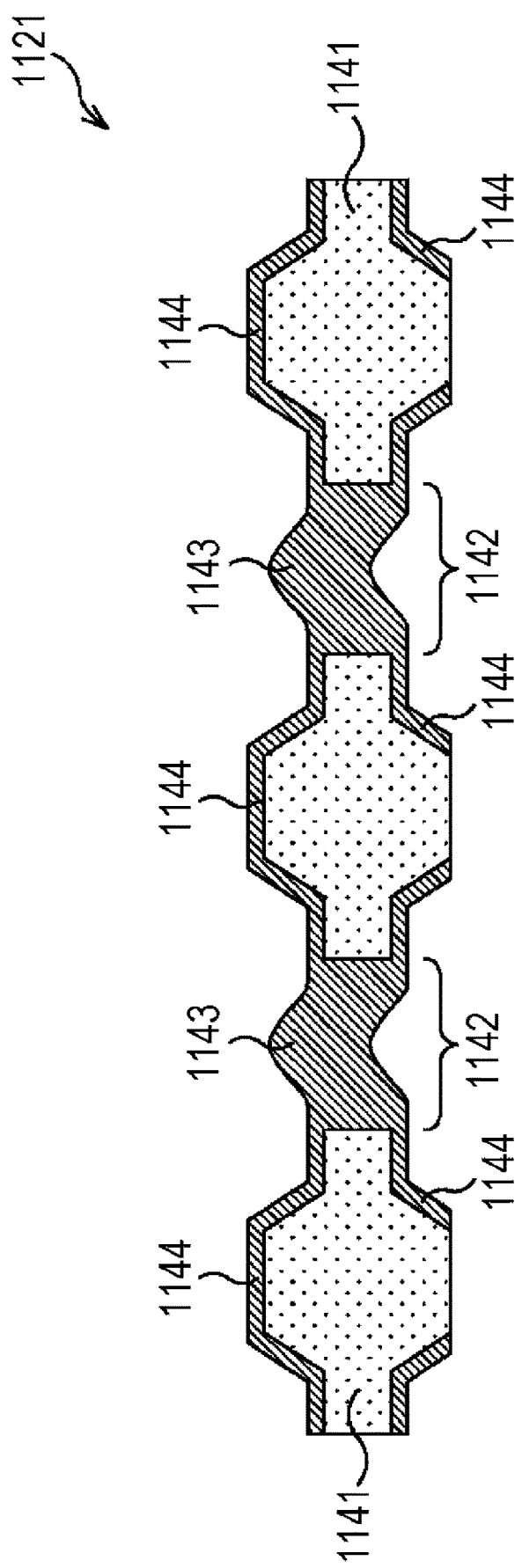
FIG. 43 is a cross-sectional diagram illustrating a lens array substrate as Comparative Structure Example 4.

FIG. 43 is a cross-sectional diagram of a fourth substrate structure (hereinafter, referred to as Comparative Structure Example 4) for comparing with the structure according to an embodiment of the present technology which is a lens array substrate disclosed in FIG. 6 of the above-described Comparative Literature 2.

The lens array substrate 1121 of FIG. 43 is different from the lens array substrate 1041 illustrated in FIG. 39 in terms that the shape of the substrate 1141 other than the portions of the through-holes 1042 is a shape protruding in the lower side as well as the upper side and in terms that the resin 1144 is also formed in a portion of the lower surface of the substrate 1141. The other configurations of the lens array substrate 1121 are the same as those of the lens array substrate 1041 illustrated in FIG. 39.

Figure 44:
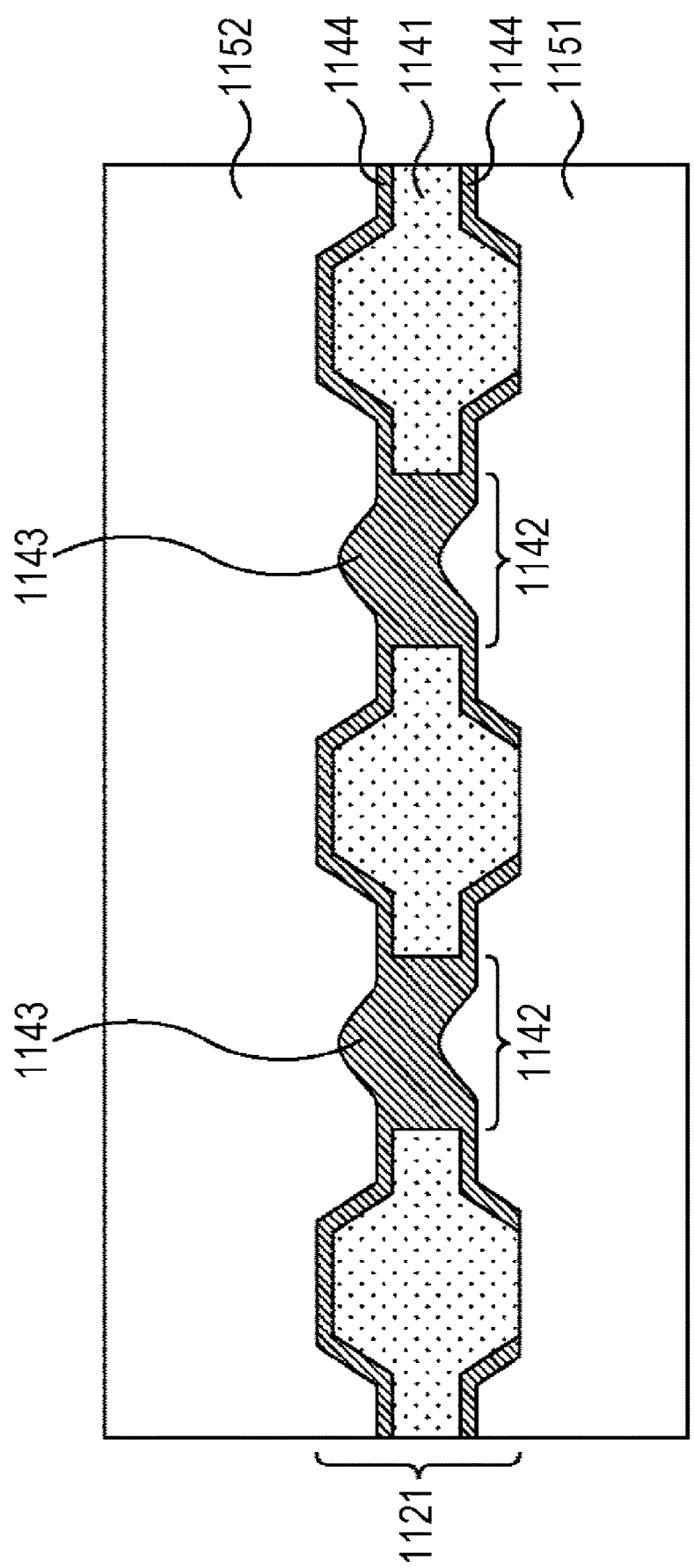
FIG. 44 is a diagram for explaining a manufacturing method for the lens array substrate of FIG. 43.

FIG. 44 is a diagram for explaining a manufacturing method for the lens array substrate 1121 of FIG. 43 and is a diagram corresponding to FIG. 40B.

FIG. 44 illustrates a state that, after inner portions of a plurality of the through-holes 1142 and the upper surface of the substrate 1141 are applied with the resin 1144, press-molding is performed by using an upper mold frame 1152 and a lower mold frame 1151. The resin 1144 is also injected between the lower surface of the substrate 1141 and the lower mold frame 1151. In the state illustrated in FIG. 44, the curing of the resin 1144 is performed.

The lens array substrate 1121 has the following features. (1) The resin 1144 formed at the positions of the through-holes 1142 of the substrate 1141 becomes the lenses 1143, and a plurality of the lenses 1143 are formed in the substrate 1141. In addition, (2) a thin layer of the resin 1144 is formed on the entire upper surface of the substrate 1141 disposed between a plurality of lenses 1143, and a thin layer of the resin 1144 is also formed in a portion of the lower surface of the substrate 1141.

<Functions Obtained from Resin in Comparative Structure Example 4>

In Comparative Literature 2 disclosing the lens array substrate 1121 of FIG. 43 which is Comparative Structure Example 4, a function of the resin 1144 which is to be the lens 1143 is disclosed as follows.

In the lens array substrate 1121 of FIG. 43 which is Comparative Structure Example 4, as the resin 1144, a photocurable resin which is an example of the energy curable resin is used. Next, if the resin 1144 is irradiated with UV light, the resin 1144 is cured. By the curing, similarly to Comparative Structure Examples 2 and 3, the resin 1144 is curing-contracted.

However, in the lens array substrate 1121 of Comparative Structure Example 4, in a certain area of the lower surface of the substrate 1141 as well as the entire upper surface of the substrate 1141 located between a plurality of lenses 1143, a thin layer of the resin 1144 is formed.

In this manner, in the structure, the resin 1144 is formed on both of the upper surface and the lower surface of the substrate 1141, so that the directions of the bent state of the entire lens array substrate 1121 can be canceled out.

On the contrary, in the lens array substrate 1041 illustrated in FIG. 39 as Comparative Structure Example 2, the thin layer of the resin 1054 is formed on the entire upper surface of the substrate 1051 disposed between a plurality of the lenses 1053, but the thin layer of the resin 1054 is not formed on the lower surface of the substrate 1051.

Therefore, in the lens array substrate 1121 of FIG. 43, in comparison with the lens array substrate 1041 of FIG. 39, it is possible to provide a lens array substrate where the amount of the bent state can be allowed to be small.

Comparative Structure Example 5

Figure 9:
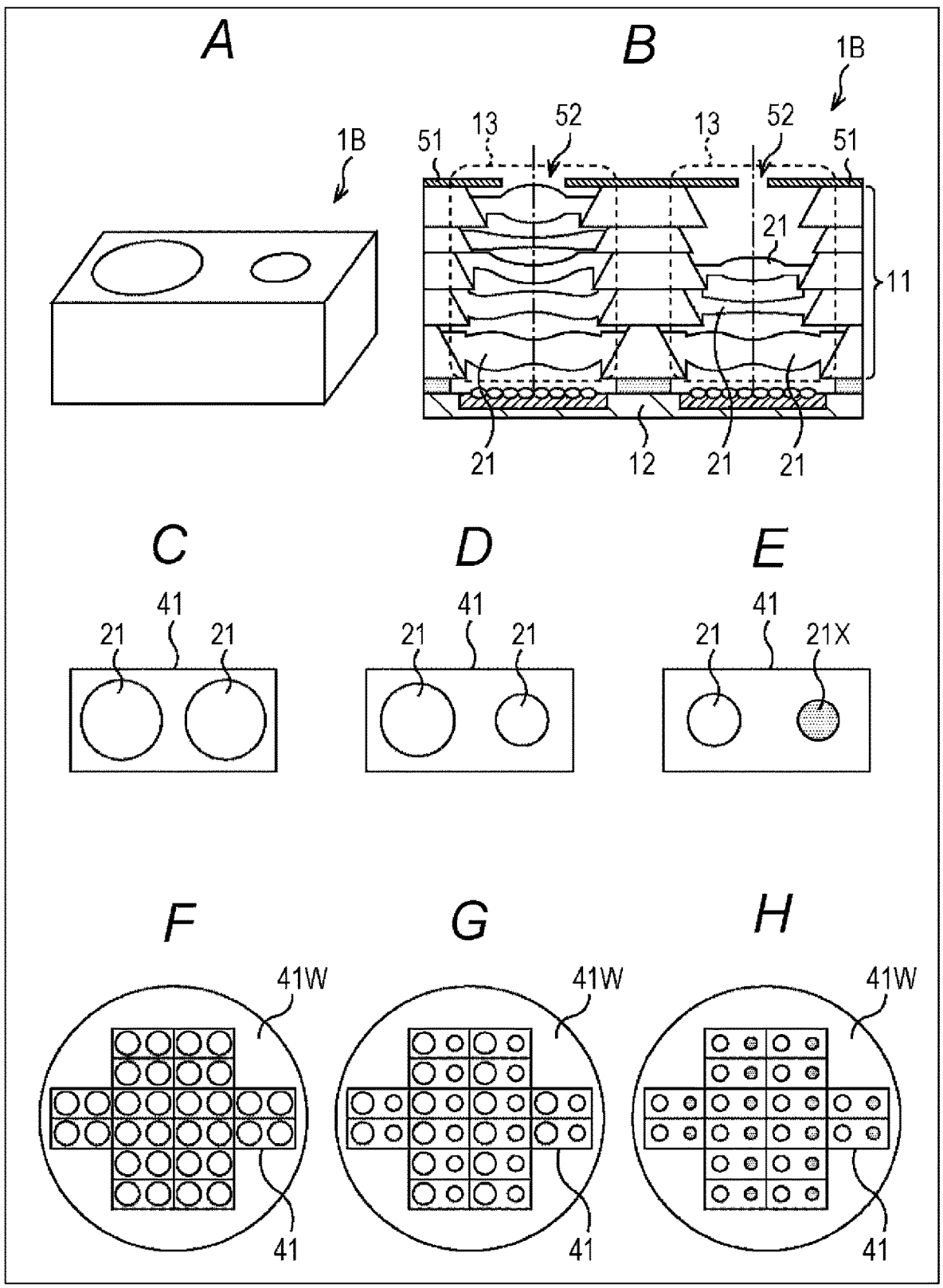
FIG. 9 is a diagram illustrating a second embodiment of a camera module using a stacked lens structure employing the present technology.
Figure 45:
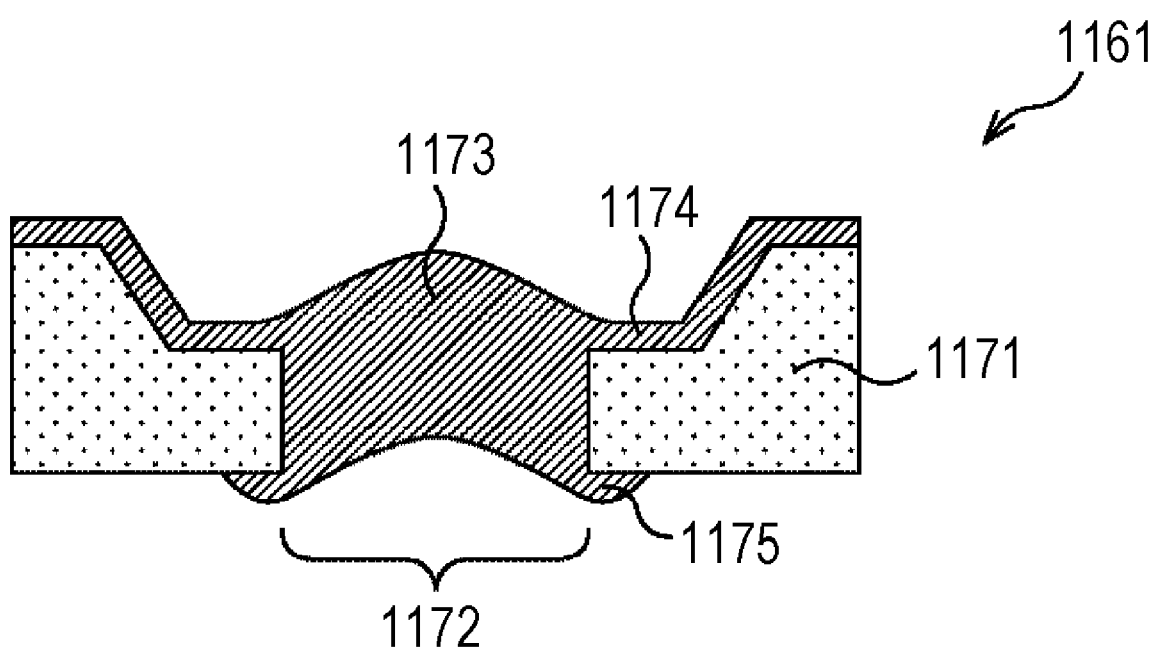
FIG. 45 is a cross-sectional diagram illustrating a lens array substrate as Comparative Structure Example 5.

FIG. 45 is a cross-sectional diagram of a fifth substrate structure (hereinafter, referred to as Comparative Structure Example 5) for comparing with the structure according to an embodiment of the present technology which is a lens array substrate disclosed in FIG. 9 of the above-described Comparative Literature 2.

The lens array substrate 1161 of FIG. 45 is different from the lens array substrate 1041 illustrated in FIG. 39 in terms that a resin protruding region 1175 is formed on the rear surface of the substrate in the vicinity of the through-hole 1172 formed in the substrate 1171. The other configurations of the lens array substrate 1161 are the same as those of the lens array substrate 1041 illustrated in FIG. 39.

In addition, FIG. 45 illustrates a state after the dicing of the lens array substrate 1161.

The lens array substrate 1161 has the following features. (1) The resin 1174 formed at the positions of the through-holes 1172 of the substrate 1171 becomes the lenses 1173, and a plurality of the lenses 1173 are formed in the substrate 1171. In addition, (2) a thin layer of the resin 1174 is formed on the entire upper surface of the substrate 1171 disposed between a plurality of the lenses 1173, and a thin layer of the resin 1174 is also formed in a portion of the lower surface of the substrate 1171.

Functions Obtained from Resin in Comparative Structure Example 5

In Comparative Literature 2 disclosing the lens array substrate 1161 of FIG. 45 which is Comparative Structure Example 5, a function of the resin 1174 which is to be the lens 1173 is disclosed as follows.

In the lens array substrate 1161 of FIG. 45 which is Comparative Structure Example 5, as the resin 1174, a photocurable resin which is an example of the energy curable resin is used. Next, if the resin 1174 is irradiated with UV light, the resin 1174 is cured. By the curing, similarly to Comparative Structure Examples 2 and 3, the resin 1174 is curing-contracted.

However, in the lens array substrate 1171 of Comparative Structure Example 5, in a certain area of the lower surface of the substrate 1171 as well as the entire upper surface of the substrate 1171 located between a plurality of the lenses 1173, a thin layer (resin protruding region 1175) of the resin 1174 is formed. Therefore, the directions of the bent state of the entire lens array substrate 1171 are canceled out, so that it is possible to provide a lens array substrate where the amount of the bent state can be allowed to be small.

<Comparison of Functions Obtained from Resin of Comparative Structure Examples 2 to 5>

The functions obtained from the resin of Comparative Structure Examples 2 to 5 are summarized as follows.

(1) Like Comparative Structure Examples 2 and 3, in case of the structure where the layer of resin is disposed on the entire upper surface of the lens array substrate, the bent state occurs in the substrate where a plurality of the lenses are disposed.

FIGS. 46A to 46C are schematic diagrams illustrating a structure where a layer of a resin is disposed over the entire upper surface of the lens array substrate similarly to Comparative Structure Examples 2 and 3 and is a diagram for explaining an effect obtained from a resin which is to be a lens.

As illustrated in FIGS. 46A and 46B, the curing-contraction occurs in the layer of the photocurable resin 1212 disposed on the upper surface of the lens array substrate 1211 (lenses and through-holes are omitted in illustration) due to the irradiation with UV light for curing. Therefore, in the layer of the photocurable resin 1212, a force caused by the photocurable resin 1212 is generated in the contraction direction.

On the other hand, the lens array substrate 1211 itself is neither contracted nor expanded even through the lens array substrate is irradiated with UV light. Namely, in the lens array substrate 1211 itself, no force caused by the substrate is generated. As a result, as illustrated in FIG. 46C, the lens array substrate 1211 is bent in a downward convex shape.

(2) However, like Comparative Structure Examples 4 and 5, in case of the structure where the layer of the resin is disposed on both of the upper surface and the lower surface of the lens array substrate, since the directions of the bent state of the lens array substrate are canceled out, the amount of the bent state of the lens array substrate can be allowed to be smaller than that of Comparative Structure Examples 2 and 3.

FIGS. 47A to 47C are schematic diagrams illustrating a structure where a layer of a resin is disposed on both of the upper surface and the lower surface of the lens array substrate similarly to Comparative Structure Examples 4 and 5 and is a diagram for explaining an effect obtained from a resin which is to be a lens.

As illustrated in FIGS. 47A and 47B, the curing contraction occurs in the layer of the photocurable resin 1212 disposed on the upper surface of the lens array substrate 1211 due to the irradiation with UV light for curing. Therefore, in the layer of the photocurable resin 1212 disposed on the upper surface of the lens array substrate 1211, a force caused by the photocurable resin 1212 is generated in the contraction direction. For this reason, a force of bending the lens array substrate 1211 in a downward convex shape is exerted on the upper surface side of the lens array substrate 1211.

On the contrary, the lens array substrate 1211 itself is neither contracted nor expanded even though the lens array substrate is irradiated with UV light. Namely, in the lens array substrate 1211 itself, no force caused by the substrate is generated.

On the other hand, the layer of the photocurable resin 1212 disposed on the lower surface of the lens array substrate 1211 is curing-contracted by UV light irradiation for curing. Therefore, in the layer of the photocurable resin 1212 disposed on the lower surface of the lens array substrate 1211, a force caused by the photocurable resin 1212 is generated in the contraction direction. For this reason, a force of bending the lens array substrate 1211 in an upward convex shape is exerted on the lower surface side of the lens array substrate 1211.

A force of bending the lens array substrate 1211 in a downward convex shape exerted on the upper surface side of the lens array substrate 1211 and a force of bending the lens array substrate 1211 in an upward convex shape exerted on the lower surface side of the lens array substrate 1211 cancel each other out.

As a result, as illustrated in FIG. 47C, the amount of the bent state of the lens array substrate 1211 in Comparative Structure Examples 4 and 5 is smaller than the amount of the bent state in Comparative Structure Examples 2 and 3 illustrated in FIG. 46C.

In this manner, the force of bending the lens array substrate and the amount of the bent state of the lens array substrate are influenced by a relationship between (1) the direction and magnitude of the force exerted on the lens array substrate in the upper surface of the lens array substrate and (2) the direction and magnitude of the force exerted on the lens array substrate in the lower surface of the lens array substrate.

Comparative Structure Example 6

Therefore, for example, as illustrated in FIG. 48A, a lens array substrate structure is considered where the layer and area of the photocurable resin 1212 disposed on the upper surface of the lens array substrate 1211 are the same as the layer and area of the photocurable resin 1212 disposed on the lower surface of the lens array substrate 1211. The lens array substrate structure is referred to as a sixth substrate structure (hereinafter, referred to as Comparative Structure Example 6) for comparing with the structure according to an embodiment of the present technology.

In Comparative Structure Example 6, in the layer of the photocurable resin 1212 disposed on the upper surface of the lens array substrate 1211, a force caused by the photocurable resin 1212 is generated in the contraction direction. In the lens array substrate 1211 itself, no force caused by the substrate is generated. For this reason, a force of bending the lens array substrate 1211 in a downward convex shape is exerted on the upper surface side of the lens array substrate 1211.

On the other hand, in the layer of the photocurable resin 1212 disposed on the lower surface of the lens array substrate 1211, a force caused by the photocurable resin 1212 is generated in the contraction direction. In the lens array substrate 1211 itself, no force caused by the substrate is generated. For this reason, a force of bending the lens array substrate 1211 in an upward convex shape is exerted on the lower surface side of the lens array substrate 1211.

The two forces of bending the lens array substrate 1211 are exerted in the directions to cancel each other out further in comparison with the structure illustrated in FIG. 47A. As a result, the force of bending the lens array substrate 1211 and an amount of the bent state of the lens array substrate 1211 are further decreased in comparison with Comparative Structure Examples 4 and 5.

Comparative Structure Example 7

However, actually, all shapes of the lens-attached substrates constituting the stacked lens structure incorporated into the camera module are not the same. More specifically, in some cases, a plurality of the lens-attached substrates constituting the stacked lens structure may be different, for example, in terms of thickness of the lens-attached substrate or size of the through-hole or may be different in terms of thickness, shape, volume, or the like of the lens formed in the through-hole. In addition, in some cases, the lens-attached substrates may be different in terms of thickness or the like of the photocurable resin formed in the upper surface and the lower surface of the lens-attached substrate.

Figure 49:
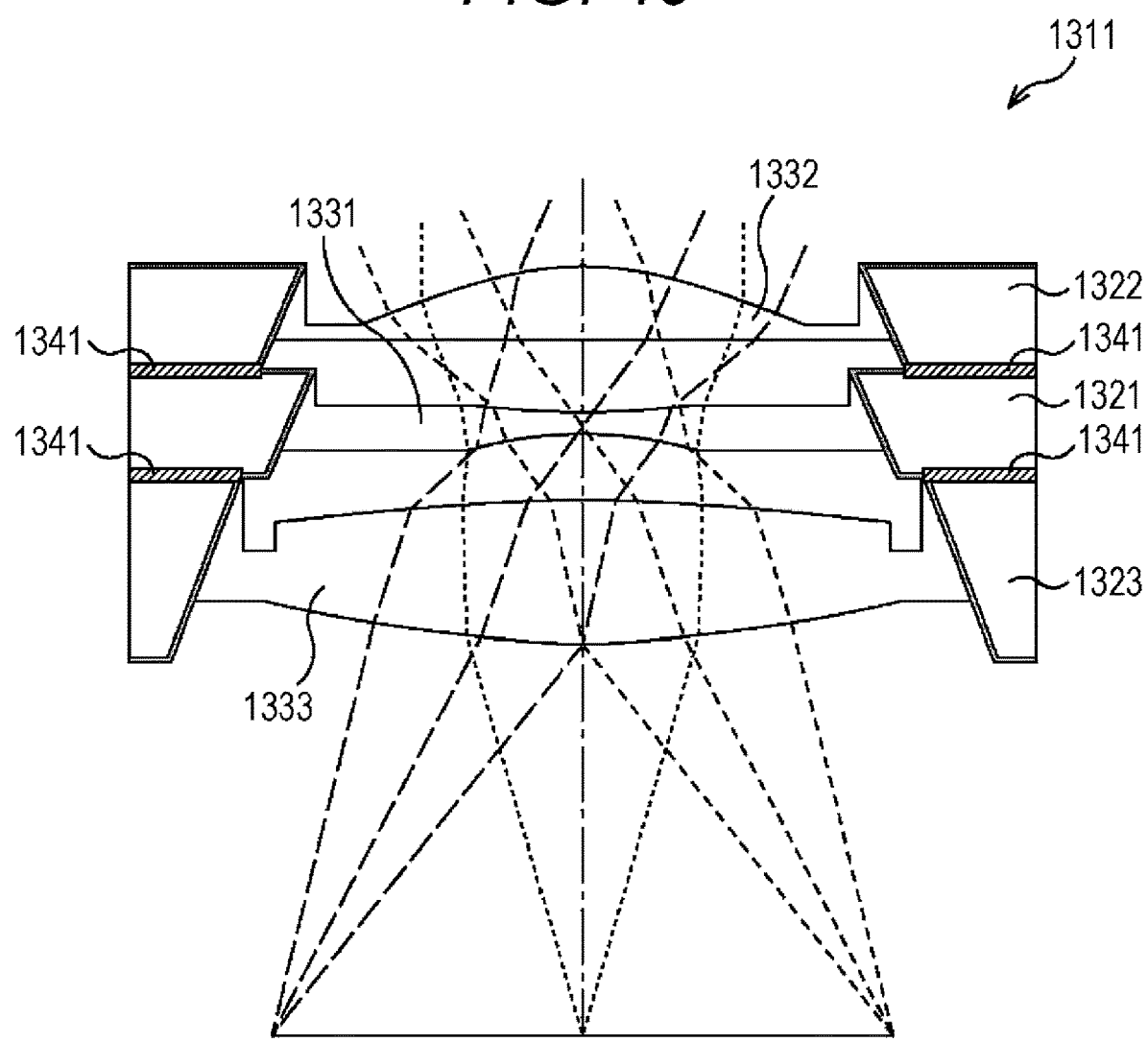
FIG. 49 is a cross-sectional diagram illustrating a stacked lens structure as Comparative Structure Example 7.

FIG. 49 is a cross-sectional diagram of a stacked lens structure as a seventh substrate structure (hereinafter, Comparative Structure Example 7) which is configured by stacking three lens-attached substrates. Similarly to Comparative Structure Example 6 illustrated in FIGS. 48A to 48C, in the stacked lens structure, the layer and area of the photocurable resin disposed on the upper surface and the lower surface of each lens-attached substrate are set to be formed so as to be the same.

The stacked lens structure 1311 illustrated in FIG. 49 is configured to include three lens-attached substrates 1321 to 1323.

Hereinafter, among the three lens-attached substrates 1321 to 1323, the middle-layered lens-attached substrate 1321 is referred to as a first lens-attached substrate 1321, the uppermost-layer lens-attached substrate 1322 is referred to as a second lens-attached substrate 1322, and the lowermost-layer lens-attached substrate 1323 is referred to as a third lens-attached substrate 1323.

The second lens-attached substrate 1322 disposed in the uppermost layer and the third lens-attached substrate 1323 disposed on the lowermost layer are different from each other in terms of a substrate thickness and a lens thickness.

More specifically, the lens thickness in the third lens-attached substrate 1323 is formed to be larger than that of the second lens-attached substrate 1322, and thus, the substrate thickness in the third lens-attached substrate 1323 is also formed to be larger than that of the second lens-attached substrate 1322.

A resin 1341 is formed over the entire contact surface between the first lens-attached substrate 1321 and the second lens-attached substrate 1322 and over the entire contact surface between the first lens-attached substrate 1321 and the third lens-attached substrate 1323.

The cross-section shape of the through-hole of the three lens-attached substrates 1321 to 1323 is the so-called fan shape where the lower surface of the substrate is larger than the upper surface of the substrate.

A function obtained from the three lens-attached substrates 1321 to 1323 having different shapes will be described with reference to FIGS. 50A to 50D.

Figure 50:
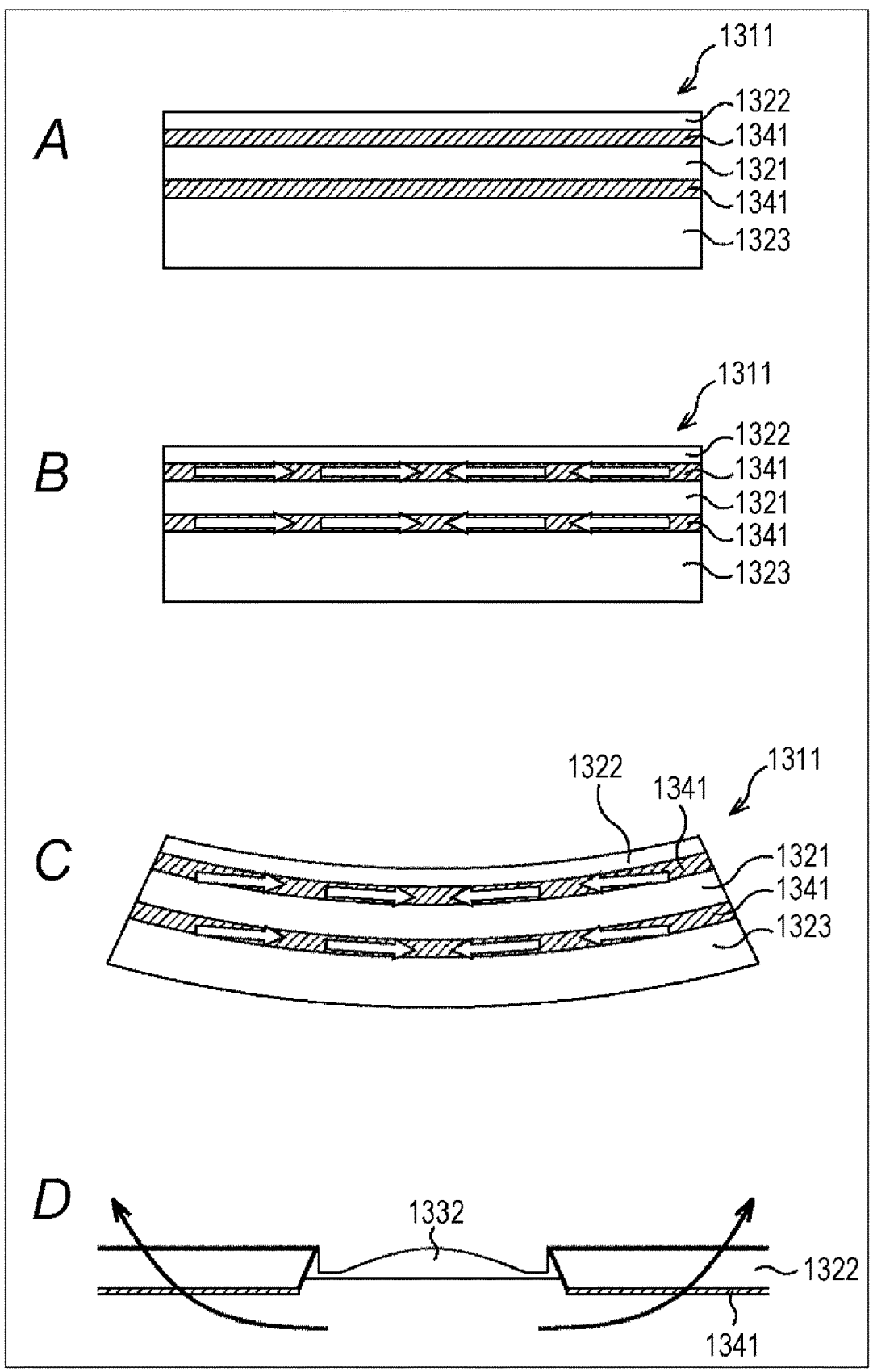
FIG. 50 is a diagram for explaining an effect obtained from the stacked lens structure of FIG. 49.

FIGS. 50A to 50C are schematic diagrams illustrating the stacked lens structure 1311 illustrated in FIG. 49.

Like the stacked lens structure 1311, in the case where the second lens-attached substrate 1322 and the third lens-attached substrate 1323 which are different in substrate thickness are disposed on the upper surface and the lower surface of the first lens-attached substrate 1321, the force of bending the stacked lens structure 1311 and the amount of the bent state of the stacked lens structure 1311 are changed according to which positions of the stacked lens structure 1311 in the thickness direction the layers of the resin 1341 existing over the entire surfaces of the contact surfaces among the three lens-attached substrates 1321 to 1323 exist.

If the layers of the resin 1341 existing over the entire surfaces of the contact surfaces among the three lens-attached substrates 1321 to 1323 are not disposed symmetrically with respect to the center line of the stacked lens structure 1311, that is, the line passing through the thickness-direction center of the stacked lens structure 1311 along the substrate planar directions, functions of the forces generated by the curing-contraction of the resin 1341 disposed on the upper surface and the lower surface of the first lens-attached substrate 1321 are not completely canceled out as illustrated in FIG. 48C. As a result, the stacked lens structure 1311 is bent in any one of the directions.

For example, in the case where the two layers of the resin 1341 on the upper surface and the lower surface of the first lens-attached substrate 1321 are disposed so as to be deviated upwards from the center line of the stacked lens structure 1311 in the thickness direction, if the two layers of resin 1341 are curing-contracted, the stacked lens structure 1311 is bent in a downward convex shape as illustrated in FIG. 50C.

In addition, in the case where the cross-section shape of the through-hole of the thinner substrate between the second lens-attached substrate 1322 and the third lens-attached substrate 1323 is a shape which is increased toward the direction of the first lens-attached substrate 1321, the problem in that the lens is lost or damaged is increased.

In the example illustrated in FIG. 49, between the second lens-attached substrate 1322 and the third lens-attached substrate 1323, the cross-section shape of the through-hole of the second lens-attached substrate 1322 of which thickness is small is the fan shape where the size of the through-hole is increased toward the first lens-attached substrate 1321. In such a shape, when the two layers of the resin 1341 on the upper surface and the lower surface of the first lens-attached substrate 1321 are curing-contracted, as illustrated in FIG. 50C, the force of bending in a downward convex shape is exerted on the stacked lens structure 1311, and as illustrated in FIG. 50D, the force is exerted on the second lens-attached substrate 1322 as a force in a direction of separating the lens and the substrate. Due to the exertion of the force, the problem in that the lens 1332 of the second lens-attached substrate 1322 is lost or damaged is increased.

Next, the case where the resin is thermally expanded is considered.

Comparative Structure Example 8

Figure 51:
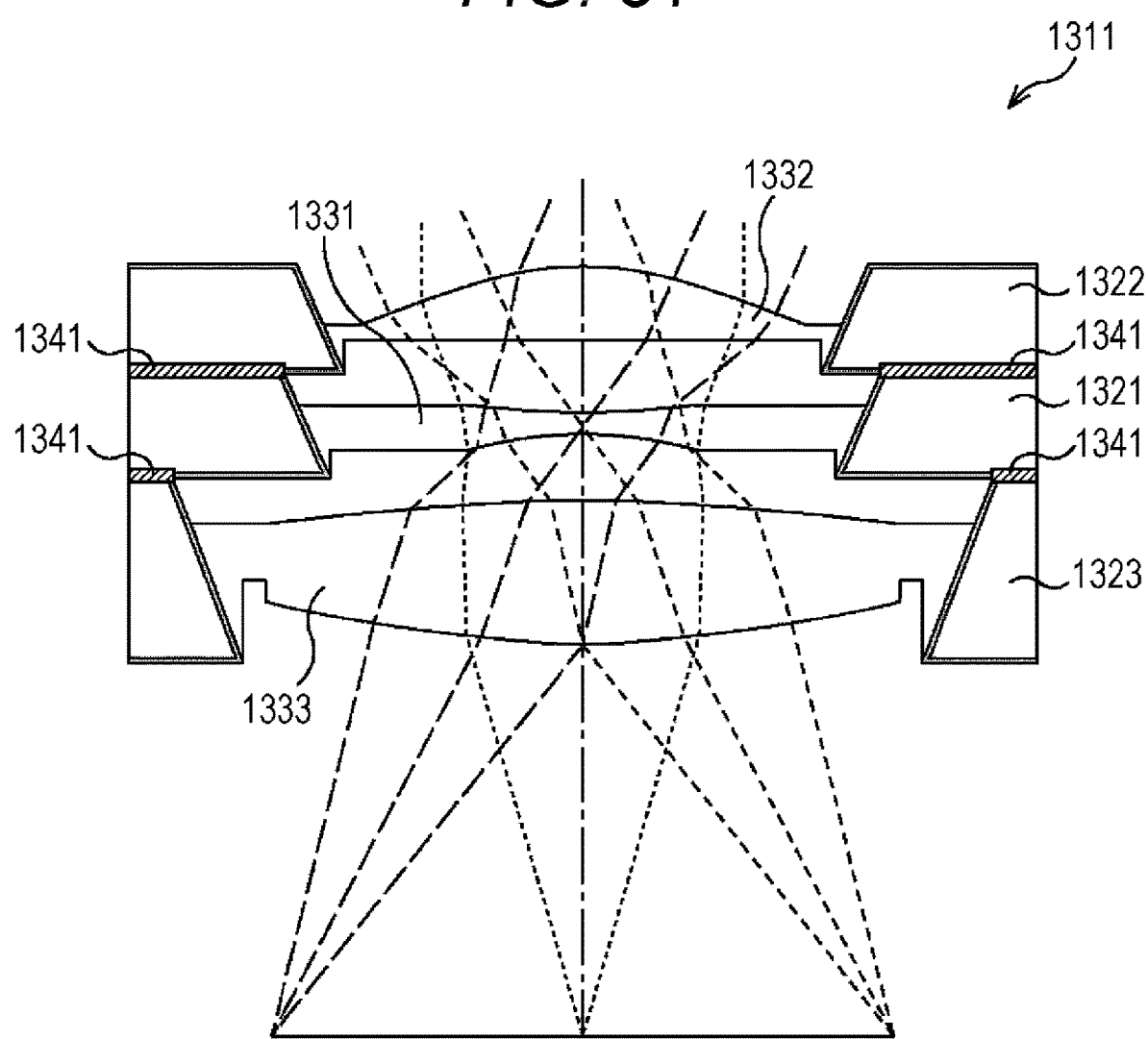
FIG. 51 is a cross-sectional diagram illustrating a stacked lens structure as Comparative Structure Example 8.

FIG. 51 is a cross-sectional diagram of a stacked lens structure as an eighth substrate structure (hereinafter, Comparative Structure Example 8) which is configured by stacking three lens-attached substrates. Similarly to Comparative Structure Example 6 illustrated in FIGS. 48A to 48C, in the stacked lens structure, the layer and area of the photocurable resin disposed on the upper surface and the lower surface of each lens-attached substrate are set to be formed so as to be the same.

Comparative Structure Example 8 of FIG. 51 is different from Comparative Structure Example 7 of FIG. 49 only in terms that the cross-section shape of the through-hole of the three lens-attached substrates 1321 to 1323 has the so-called tapered-down shape where the lower surface of the substrate is smaller than the upper surface of the substrate.

Figure 52:
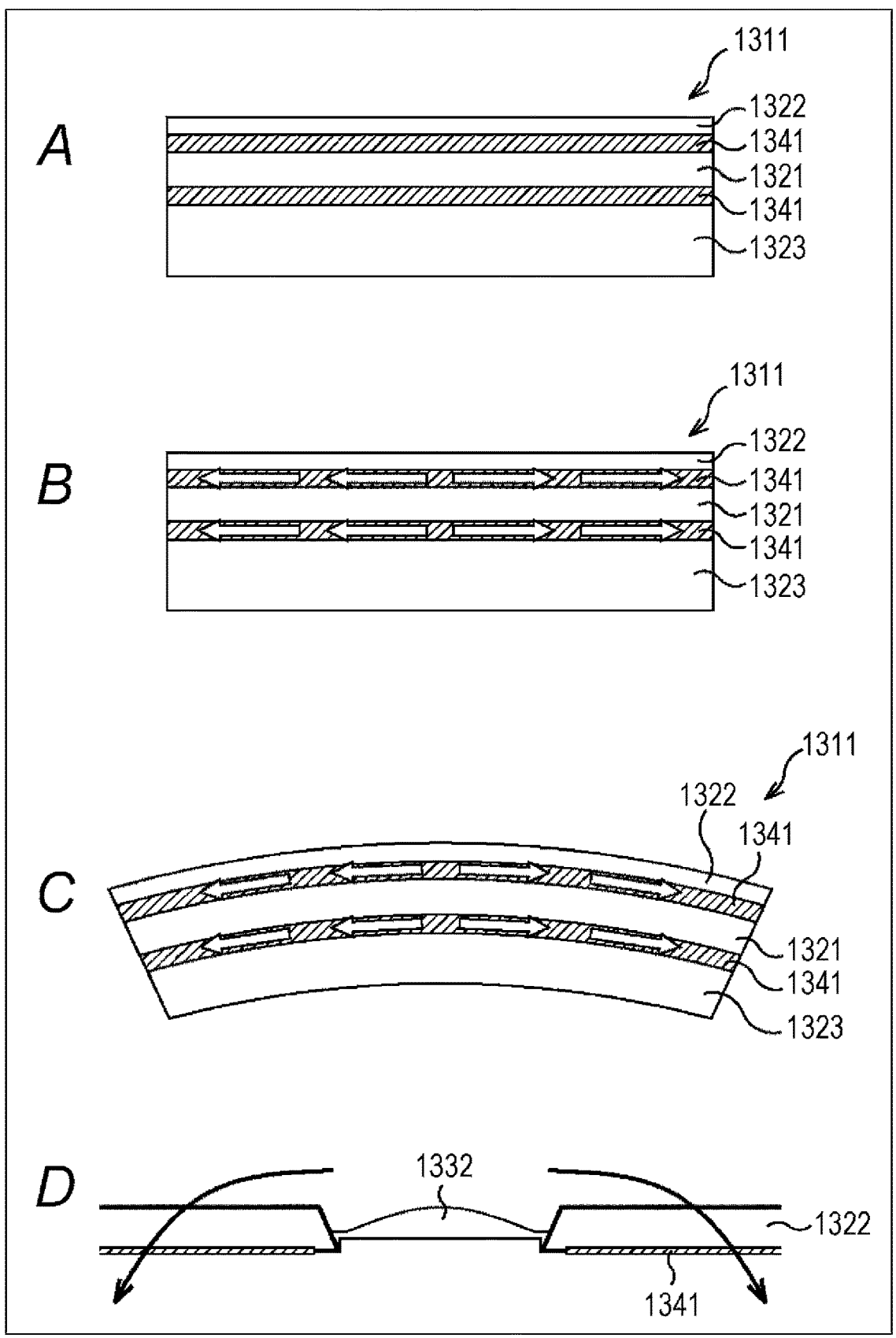
FIG. 52 is a diagram for explaining an effect obtained from the stacked lens structure of FIG. 51.

FIGS. 52A to 52C are schematic diagrams illustrating the stacked lens structure 1311 illustrated in FIG. 51.

When a user actually uses a camera module, due to an increase in power consumption according to the operation, a temperature of the housing of the camera is increased, and thus, a temperature of the camera module is also increased. Due to the increase in temperature, in the stacked lens structure 1311 of FIG. 51, the resin 1341 disposed in the upper surface and the lower surface of the first lens-attached substrate 1321 is thermally expanded.

Although the area and thickness of the resin 1341 disposed on the upper surface and the lower surface of the first lens-attached substrate 1321 are set to be the same as illustrated in FIG. 48A, if the layers of the resin 1341 existing over the entire surfaces of the contact surfaces among the three lens-attached substrates 1321 to 1323 are not disposed symmetrically with respect to the center line of the stacked lens structure 1311, that is, the line passing through the thickness-direction center of the stacked lens structure 1311 along the substrate planar directions, functions of the forces generated by the thermal expansion of the resin 1341 disposed on the upper surface and the lower surface of the first lens-attached substrate 1321 are not completely canceled out as illustrated in FIG. 48C. As a result, the stacked lens structure 1311 is bent in any one of the directions.

For example, in the case where the two layers of the resin 1341 on the upper surface and the lower surface of the first lens-attached substrate 1321 are disposed so as to be deviated upwards from the center line of the stacked lens structure 1311 in the thickness direction, if the two layers of the resin 1341 are thermally expand, the stacked lens structure 1311 is bent in an upward convex shape as illustrated in FIG. 52C.

In addition, in the example illustrated in FIG. 51, between the second lens-attached substrate 1322 and the third lens-attached substrate 1323, the cross-section shape of the through-hole of the second lens-attached substrate 1322 of which thickness is small is the tapered-down shape where the size of the through-hole is decreased toward the first lens-attached substrate 1321. In such a shape, when the two layers of the resin 1341 on the upper surface and the lower surface of the first lens-attached substrate 1321 are thermally expand, the force of bending in an upward convex shape is exerted on the stacked lens structure 1311, and as illustrated in FIG. 52D, the force is exerted on the second lens-attached substrate 1322 as a force in a direction of separating the lens and the substrate. Due to the exertion of the force, the problem in that the lens 1332 of the second lens-attached substrate 1322 is lost or damaged is increased.

<Structure According to Embodiment of the Present Technology>

Figure 53:
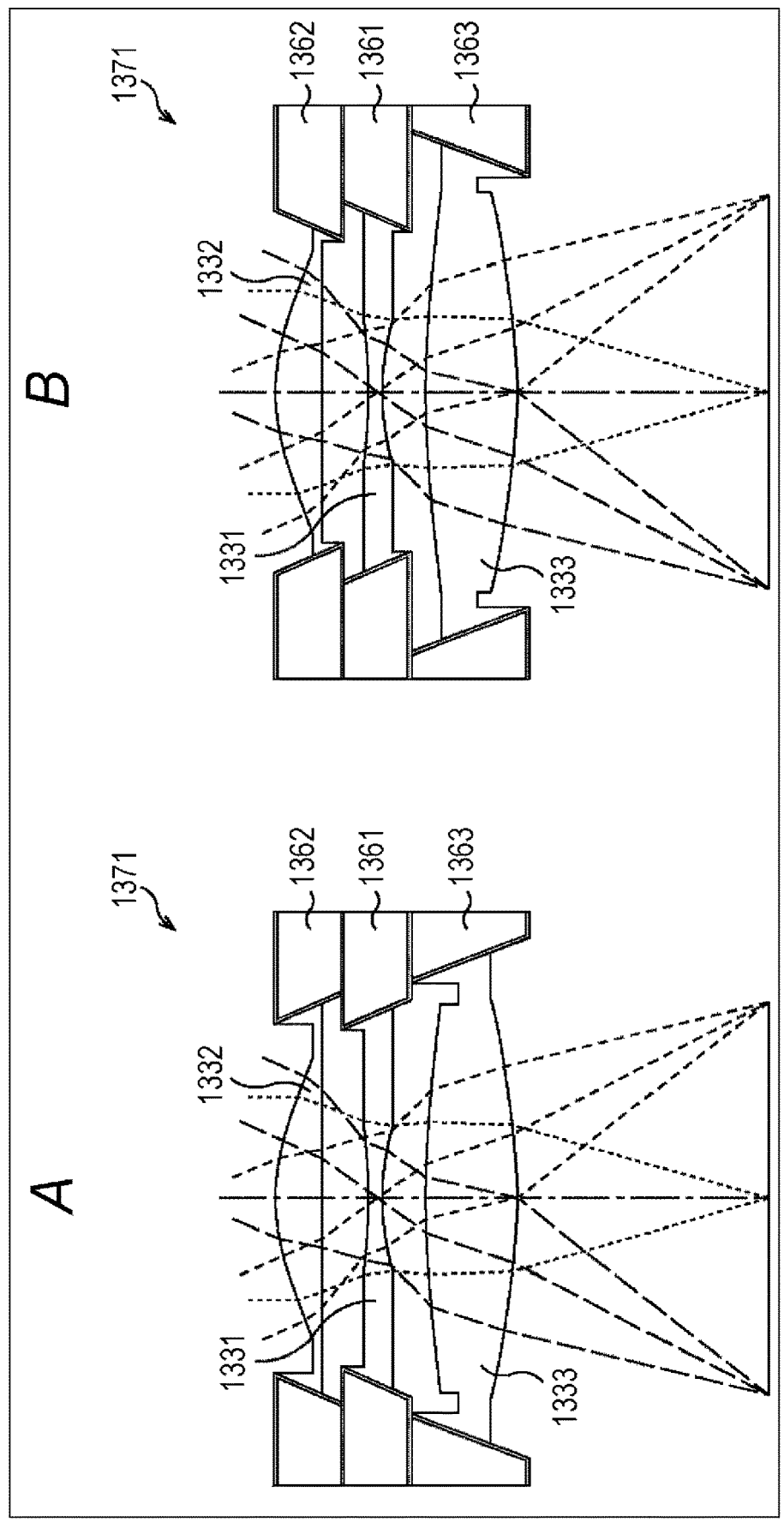
FIG. 53 is a cross-sectional diagram illustrating a stacked lens structure employing the structure according to an embodiment of the present technology.

FIGS. 53A and 53B are diagrams illustrating a stacked lens structure 1371 configured to include three lens-attached substrates 1361 to 1363 employing the structure according to an embodiment of the present technology.

FIG. 53A illustrates the structure corresponding to the stacked lens structure 1311 of FIG. 49, which is the structure where the cross-section shape of the through-hole is the so-called fan shape. On the other hand, FIG. 53B illustrates the structure corresponding to the stacked lens structure 1311 of FIG. 51, which is the structure where the cross-section shape of the through-hole is the so-called tapered-down shape.

Figure 54:
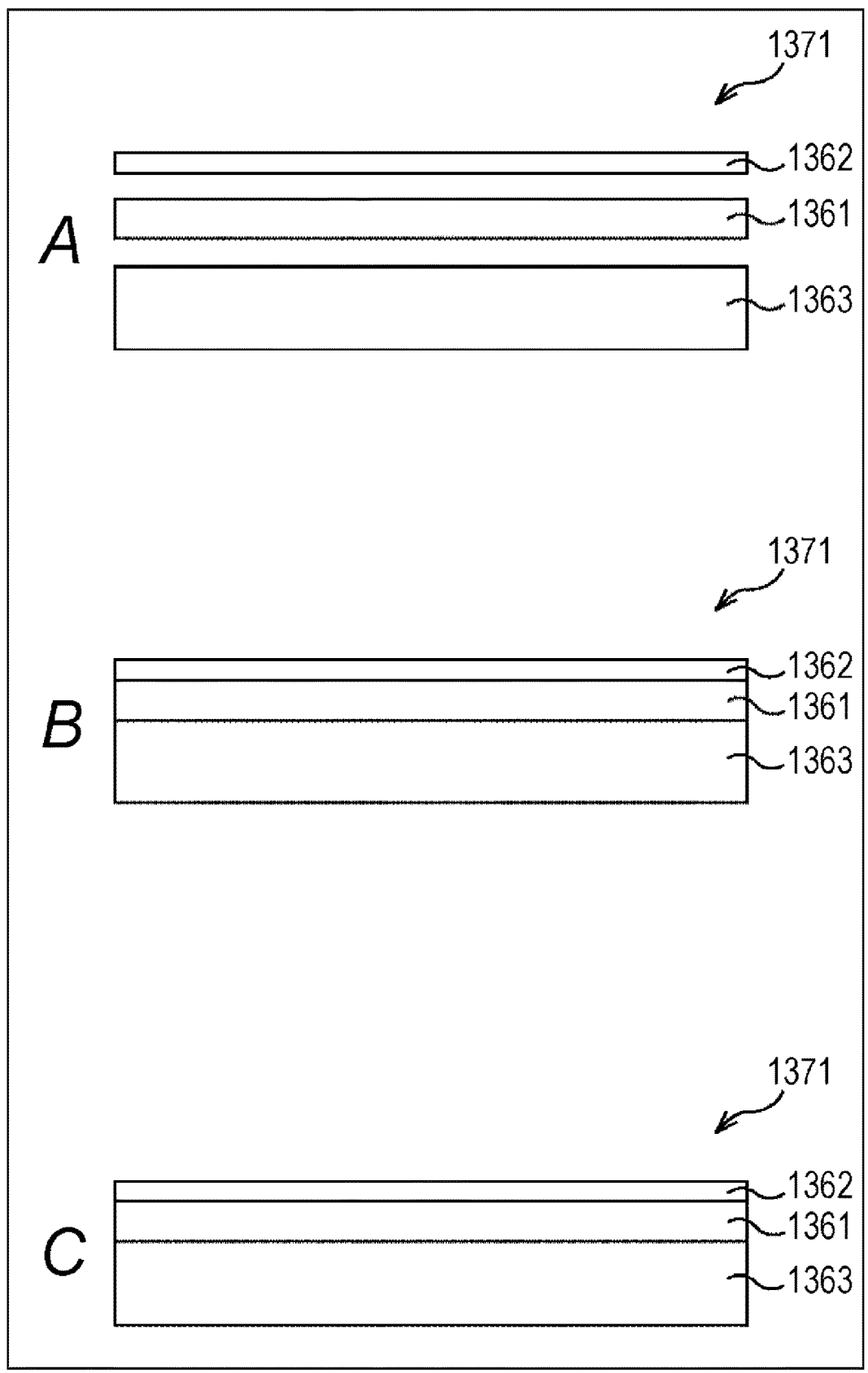
FIG. 54 is a schematic diagram illustrating the stacked lens structure of FIG. 53.

FIGS. 54A to 54C are schematic diagrams illustrating the stacked lens structure 1371 illustrated in FIGS. 53A and 53B in order to explain a function obtained from the structure according to an embodiment of the present technology.

The stacked lens structure 1371 is a structure where a second lens-attached substrate 1362 is disposed above a first lens-attached substrate 1361 as the middle lens-attached substrate and a third lens-attached substrate 1363 is disposed under the first lens-attached substrate 1361.

The second lens-attached substrate 1362 disposed in the uppermost layer and the third lens-attached substrate 1363 disposed in the lowermost layer are different from each other in terms of a substrate thickness and a lens thickness. More specifically, the lens thickness in the third lens-attached substrate 1363 is formed to be larger than that of the second lens-attached substrate 1362, and thus, the substrate thickness in the third lens-attached substrate 1363 is also formed to be larger than that of the second lens-attached substrate 1362.

In the stacked lens structure 1371 of the structure according to an embodiment of the present technology, as a means for fixing the lens-attached substrates, direct joining of the substrates is used. In other words, a plasma activation process is performed on the to-be-fixed lens-attached substrates, so that the two to-be-fixed lens-attached substrates are plasma-joined. Furthermore, in other words, silicon oxide films are formed on the surfaces of the to-be-stacked two lens-attached substrates, hydroxyl groups are bonded thereto, after that, the two lens-attached substrates are adhered to each other, and dehydration condensation is performed by increasing the temperature of the substrates.

By doing so, the two lens-attached substrates are directly joined by silicon-oxygen covalent bonds.

Therefore, in the stacked lens structure 1371 of the structure according to an embodiment of the present technology, as a means for fixing the lens-attached substrates, adhesion using a resin is not used. For this reason, a resin for lens formation and a resin for substrate adhesion are not disposed between the lens-attached substrate and the lens-attached substrate. In addition, since a resin is not disposed on the upper surface and the lower surface of the lens-attached substrate, in the upper surface and the lower surface of the lens-attached substrate, a resin is neither thermally expanded nor curing-contracted.

Therefore, in the stacked lens structure 1371, even though the second lens-attached substrate 1362 and the third lens-attached substrate 1363 which are different in terms of lens thickness and substrate thickness are disposed on the upper layer and the lower layer of the first lens-attached substrate 1351, unlike the above-described Comparative Structure Examples 1 to 8, the bent state of the substrate caused by the curing-contraction and the bent state of the substrate caused by the thermal expansion do not occur.

Namely, due to the structure according to an embodiment of the present technology where the lens-attached substrates are fixed to each other by direct joining, it is possible to obtain a function or an effect that, even in the case where the lens-attached substrates which are different in terms of lens thickness and substrate thickness are stacked on the upper layer and the lower layer thereof, the bent state of the substrate can be more greatly suppressed than those of the above-described Comparative Structure Examples 1 to 8.

16. Various Modified Examples

Hereinafter, other Modified Examples of the above-described embodiments will be described.

For example, in case of dicing a substrate-state stacked lens structure by using a blade or a laser, there is a problem in that chipping may be generated in a carrier substrate of each layer of lens-attached substrates. In addition, for example, if the chipping reaches through-holes, flexural strength of the lens-attached substrates is decreased, so that there is a problem in that the stacked lens structure may be broken at the time of assembling a camera module or the like.

In addition, in case of performing dicing by using blade dicing or the like, since the lens-attached substrates are stacked to have some thickness, the load of the dicing is increased, and thus, for example, process deviation occurs due to deterioration of the blade, so that there is a problem in that chipping yield is decreased.

Therefore, hereinafter, examples of chipping countermeasure will be described.

<First Chipping Countermeasure>

First, first chipping countermeasure will be described with reference to FIGS. 55 to 58.

Figure 55:
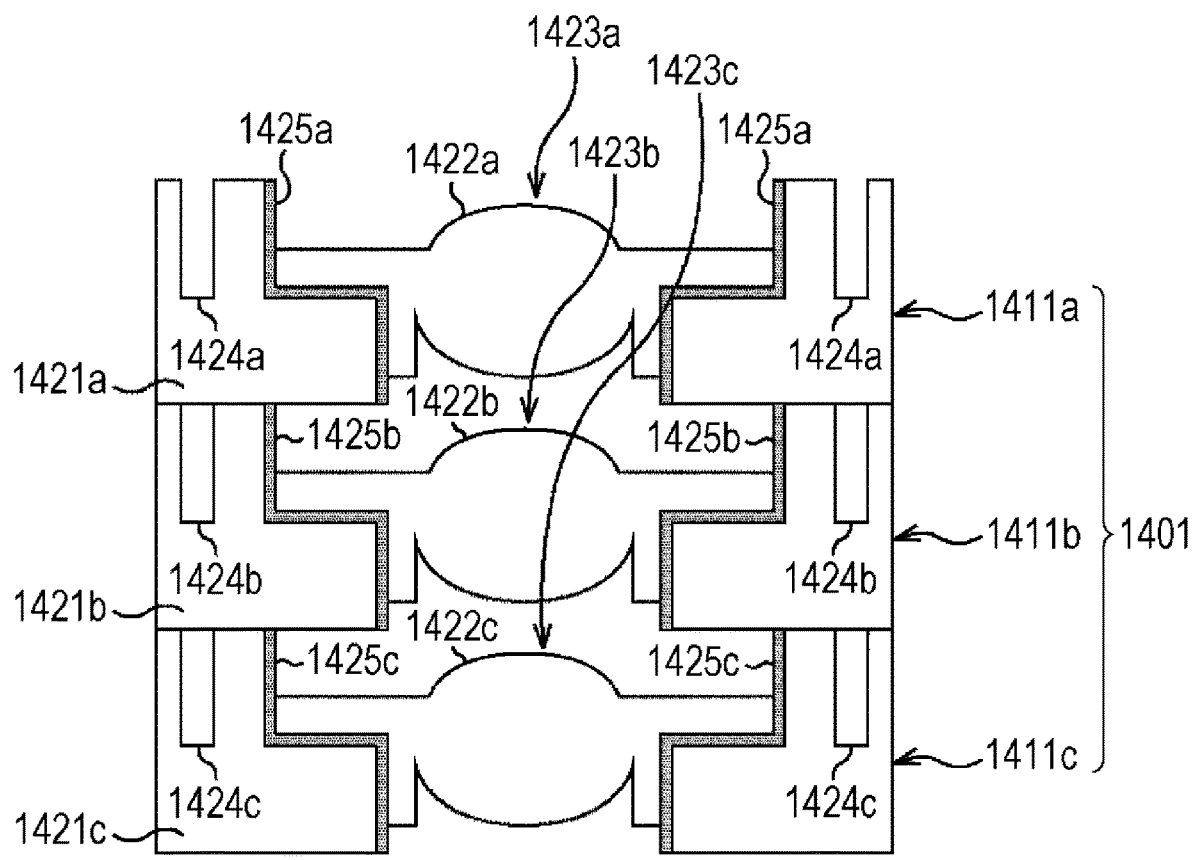
FIG. 55 is a schematic cross-sectional diagram illustrating a stacked lens structure according to an embodiment of the present technology.

FIG. 55 is a schematic cross-sectional diagram illustrating the stacked lens structure 1401. In addition, in FIG. 55, only components necessary for description are mainly illustrated, but components unnecessary for description are appropriately omitted in illustration.

In a stacked lens structure 1401, three layers of lens-attached substrates 1411a to 1411c are stacked. A lens resin portion 1422a is formed in an inner side of a through-hole 1423a of a carrier substrate 1421a of the lens-attached substrate 1411a. A light-shielding film 1425a is formed on a sidewall of the through-hole 1423a. A groove 1424a surrounding the through-hole 1423a is formed in an end portion of the upper surface of the carrier substrate 1421a.

The lens-attached substrates 1411b and 1411c have the same configuration as that of the lens-attached substrate 1411a, and thus, the description thereof is omitted. In addition, in FIG. 55, for the simplification of illustration, an example where the shapes of the lens resin portions 1422a to 1422c are the same is illustrated, but the shapes of the lens resin portions 1422a to 1422c may be arbitrarily set.

In addition, hereinafter, in the case where there is no need to individually distinguish the lens-attached substrates 1411a to 1411c, the lens-attached substrates are simply referred to as a lens-attached substrate 1411. Hereinafter, in the case where there is no need to individually distinguish the carrier substrates 1421a to 1421c, the carrier substrates are simply referred to as a carrier substrate 1421. Hereinafter, in the case where there is no need to individually distinguish the lens resin portions 1422a to 1422c, the lens resin portions are simply referred to as a lens resin portion 1422. Hereinafter, in the case where there is no need to individually distinguish the through-holes 1423a to 1423c, the through-holes are simply referred to as a through-hole 1423. Hereinafter, in the case where there is no need to individually distinguish the grooves 1424a to 1424c, the grooves are simply referred to as a groove 1424.

<Manufacturing Method for Stacked Lens Structure 1401>

Figure 56:
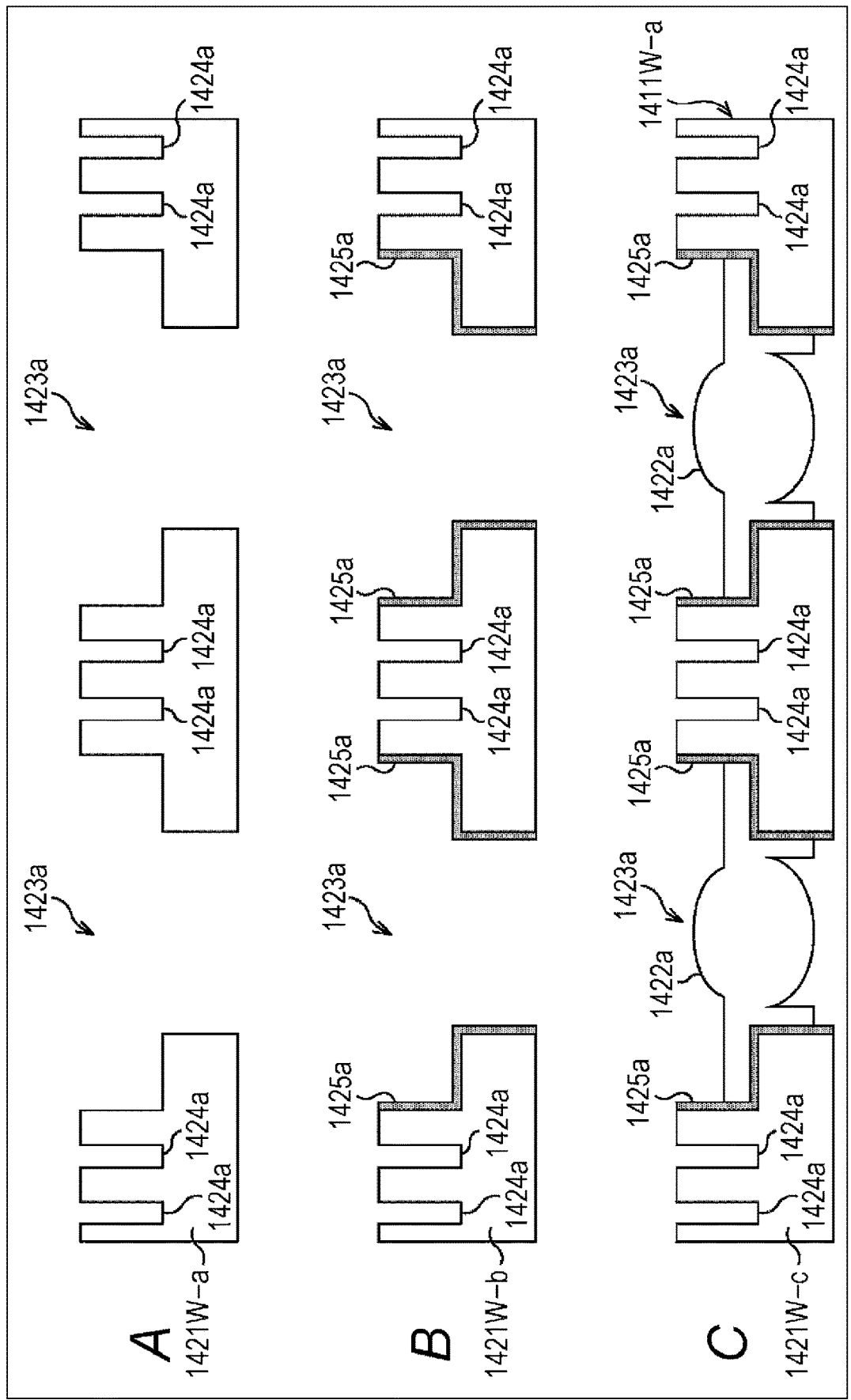
FIG. 56 is a diagram for explaining a manufacturing method for the stacked lens structure of FIG. 55.

Next, a manufacturing method for the stacked lens structure 1401 will be described with reference to FIGS. 56 to 58. In addition, hereinafter, processes relating to a chipping countermeasure will be mainly described. The processes of which description is omitted are basically the same as the above-described processes.

First, as illustrated in FIG. 56A, a plurality of through-hole 1423a is formed in a substrate-state carrier substrate 1421W-a. As a method of processing the through-hole 1423a, any one of the above-described methods may be used. In addition, in FIGS. 56A to 56C, although only the two through-holes 1423a are illustrated for lack of space in the paper, actually, a plurality of the through-holes 1423a are formed in the planar directions of the carrier substrate 1421W-a.

In addition, by dry etching, grooves 1424a are formed on the upper surface of the carrier substrate 1421W-a to surround the respective through-holes 1423a.

The groove 1424a may be configured to surround each through-hole 1423a at least within the area surrounded by a dicing line (not shown). For example, a square or circle of the groove 1424a surrounding each through-hole 1423a may be formed within a square area surrounded by a dicing line. In addition, in both sides of each dicing line, grooves 1424a parallel to the dicing line may be formed so as to interpose the dicing line.

Next, as illustrated in FIG. 56B, a light-shielding film 1425a is formed on the sidewall of each through-hole 1423a.

Next, as illustrated in FIG. 56C, a lens resin portion 1422a is formed in each through-hole 1423a by the above-described method.

In this manner, the substrate-state lens-attached substrate 1411W-a is manufactured.

In addition by the same processes, the substrate-state lens-attached substrates 1411W-b and 1411W-c are manufactured.

Figure 57:
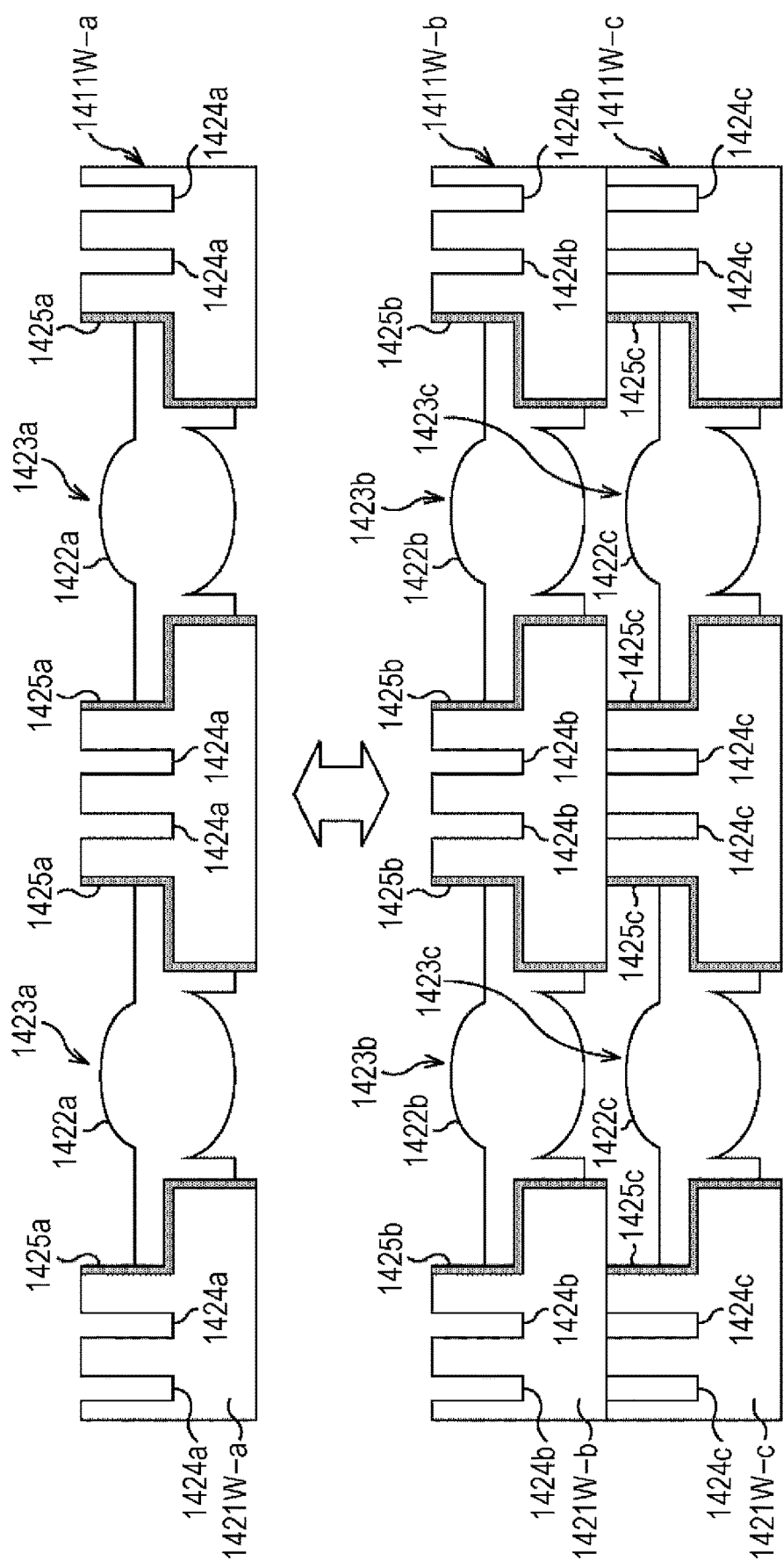
FIG. 57 is a diagram for explaining a manufacturing method for the stacked lens structure of FIG. 55.

Next, as illustrated in FIG. 57 lens-attached substrates 1411W-a to 1411W-c are stacked by direct joining according to the above-described method, so that the substrate-state stacked lens structure 1401W is manufactured. In the stacked lens structure 1401W, the grooves 1424a to 1424c of the lens-attached substrates 1411W-a to 1411W-c substantially overlap each other in the up-down direction.

Figure 58:
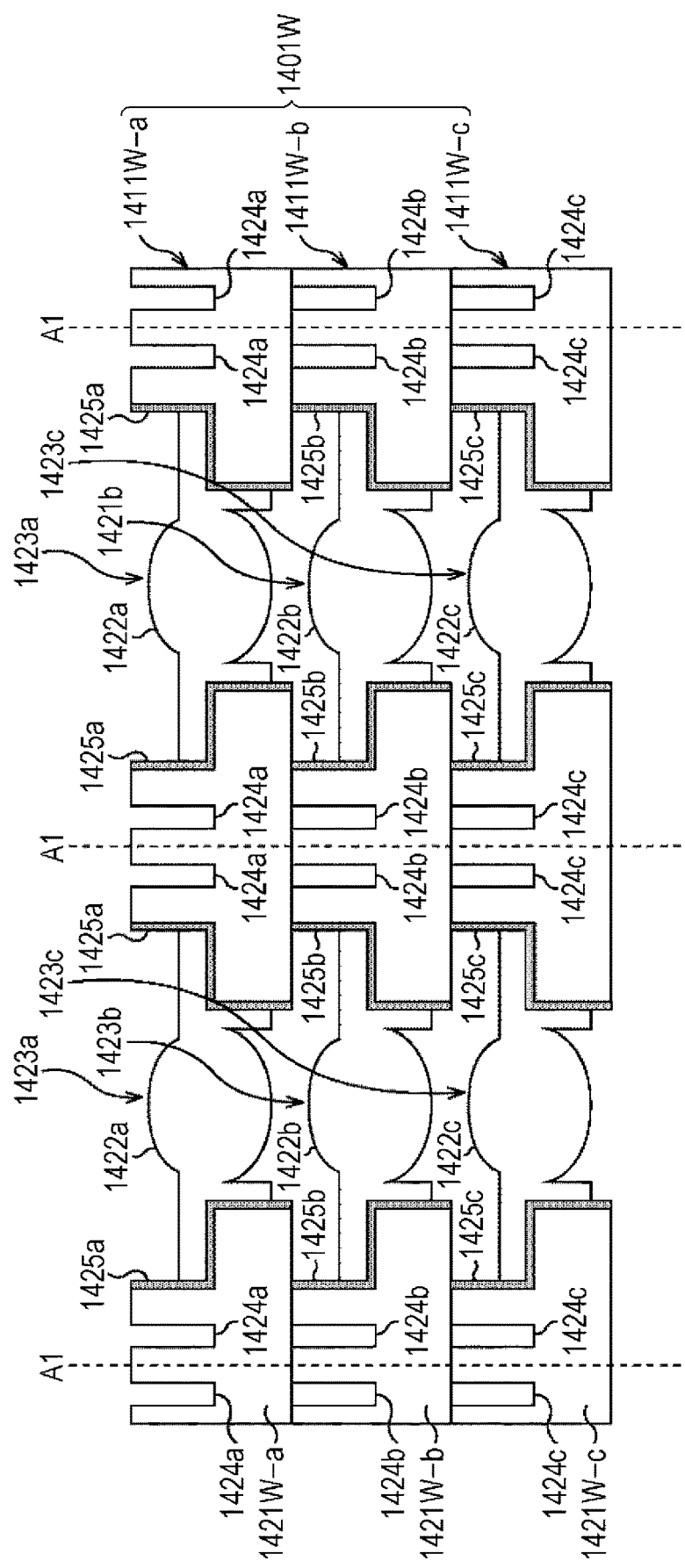
FIG. 58 is a diagram for explaining a manufacturing method for the stacked lens structure of FIG. 55.

Next, as illustration in FIG. 58, a plurality of the stacked lens structures 1401 are obtained by dicing the substrate-state stacked lens structure 1401W into units by using a blade, a laser, or the like. At this time, as indicated by a dotted line A1 of FIG. 58, areas between adjacent grooves 1424a to 1424c are cut along the dicing lines (not shown). Therefore, in each layer of the lens-attached substrates 1411, the chipping generated by the cutting is stopped at the grooves 1424a to 1424c to be prevented from reaching the through-holes 1423a to 1423c. As a result, the flexural strength of the lens-attached substrates is decreased, so that the stacked lens structure is prevented from being broken at the time of assembling a camera module or the like.

<Second Chipping Countermeasure>

Next, second chipping countermeasure will be described with reference to FIGS. 59 to 62.

Figure 59:
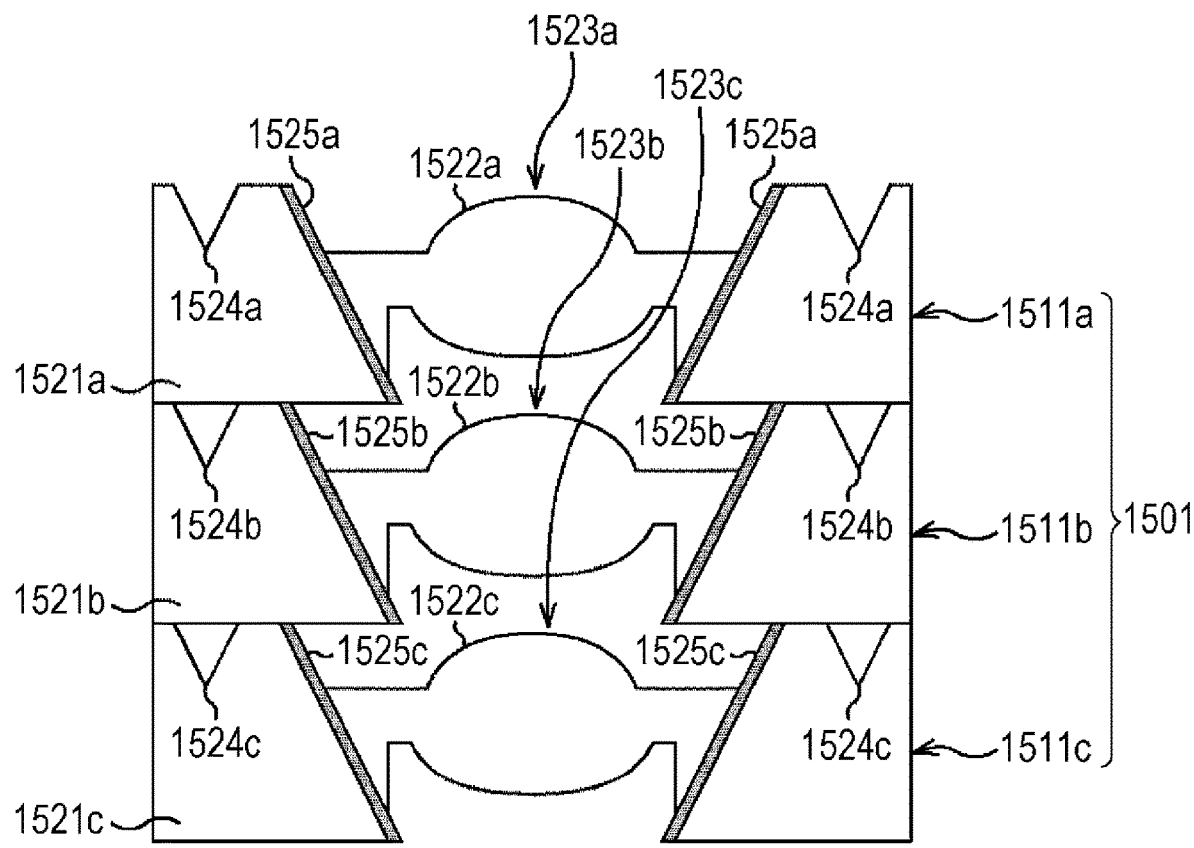
FIG. 59 is a schematic cross-sectional diagram illustrating a stacked lens structure according to an embodiment of the present technology.

FIG. 59 is a schematic cross-sectional diagram illustrating the stacked lens structure 1501. In addition, in FIG. 59, only components necessary for description are mainly illustrated, but components unnecessary for description are appropriately omitted in illustration.

In a stacked lens structure 1501, three layers of lens-attached substrates 1511a to 1511c are stacked. A lens resin portion 1522a is formed in an inner side of a through-hole 1523a of a carrier substrate 1521a of the lens-attached substrate 1511a. A light-shielding film 1525a is formed on a sidewall of the through-hole 1523a. A groove 1524a surrounding the through-hole 1523a is formed in an end portion of the upper surface of the carrier substrate 1521a.

The lens-attached substrates 1511b and 1511c have the same configuration as that of the lens-attached substrate 1511a, and thus, the description thereof is omitted. In addition, in FIG. 59, for the simplification of illustration, an example where the shapes of the lens resin portions 1522a to 1522c are the same is illustrated, but the shapes of the lens resin portions 1522a to 1522c may be arbitrarily set.

In addition, hereinafter, in the case where there is no need to individually distinguish the lens-attached substrates 1511a to 1511c, the lens-attached substrates are simply referred to as a lens-attached substrate 1511. Hereinafter, in the case where there is no need to individually distinguish the carrier substrates 1521a to 1521c, the carrier substrates are simply referred to as a carrier substrate 1521. Hereinafter, in the case where there is no need to individually distinguish the lens resin portions 1522a to 1522c, the lens resin portions are simply referred to as a lens resin portion 1522. Hereinafter, in the case where there is no need to individually distinguish the through-holes 1523a to 1523c, the through-holes are simply referred to as a through-hole 1523. Hereinafter, in the case where there is no need to individually distinguish the grooves 1524a to 1524c, the grooves are simply referred to as a groove 1524.

<Manufacturing Method for Stacked Lens Structure 1501>

Figure 60:
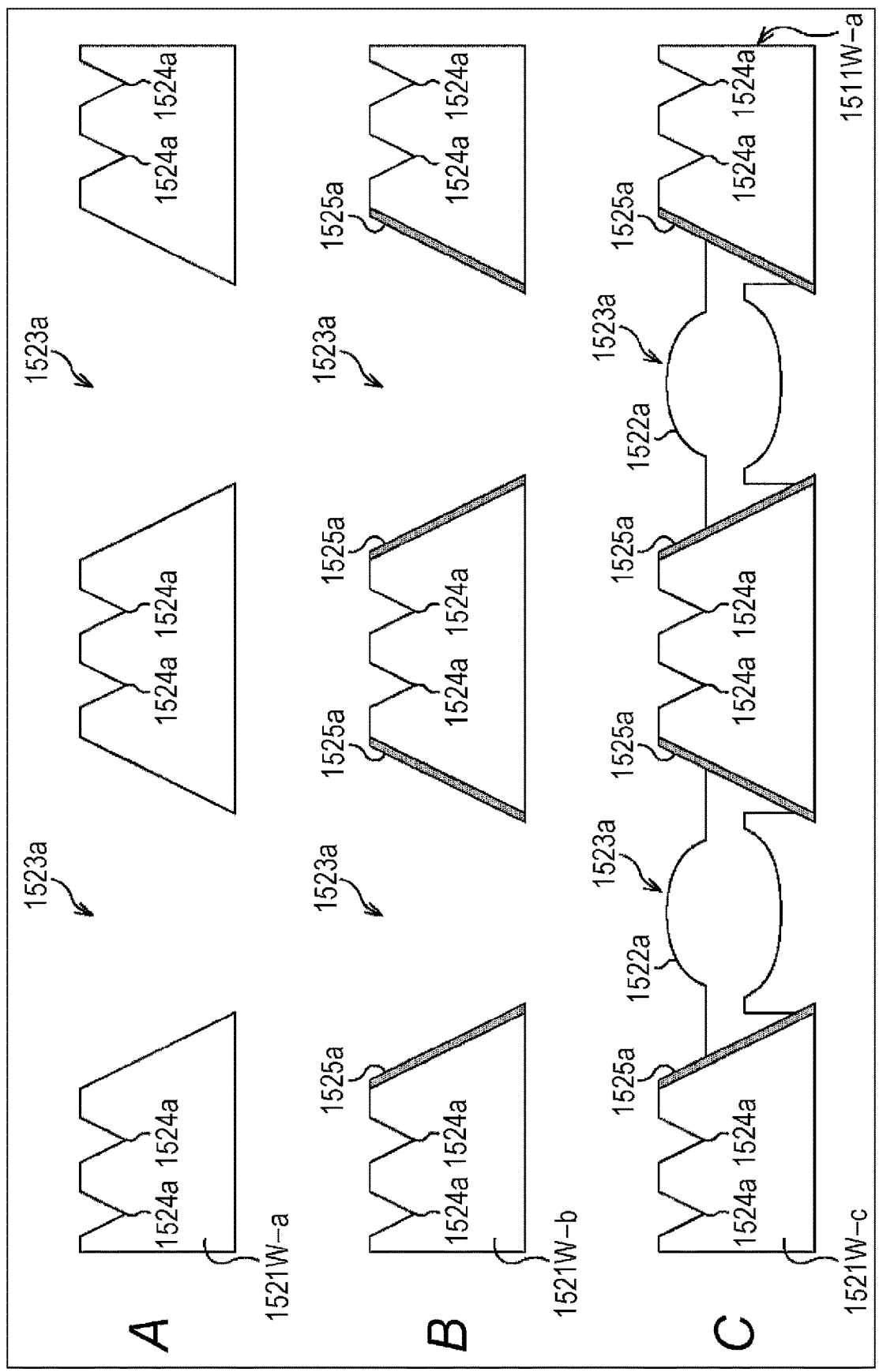
FIG. 60 is a diagram for explaining a manufacturing method for the stacked lens structure of FIG. 59.

Next, a manufacturing method for the stacked lens structure 1501 will be described with reference to FIGS. 60 to 62. In addition, hereinafter, processes relating to a chipping countermeasure will be mainly described. The processes of which description is omitted are basically the same as the above-described processes.

First, as illustrated in FIG. 60A, a plurality of through-holes 1523a is formed in a substrate-state carrier substrate 1521W-a. As a method of processing the through-hole 1523a, any one of the methods described above may be available. In addition, in FIGS. 60A to 60C, although only the two through-holes 1523a are illustrated for lack of space in the paper, actually, a plurality of the through-holes 1523a are formed in the planar directions of the carrier substrate 1521W-a.

In addition, by wet etching, grooves 1524a are formed on the upper surface of the carrier substrate 1521W-a to surround the respective through-holes 1523a.

The groove 1524a may be configured to surround each through-hole 1523a at least within the area surrounded by a dicing line (not shown). For example, a square or circle of the groove 1524a surrounding each through-hole 1523a may be formed within a square area surrounded by a dicing line. In addition, in both sides of each dicing line, grooves 1524a parallel to the dicing line may be formed so as to interpose the dicing line.

At this time, by using the above-described crystal anisotropic wet etching, a width of the groove 1524a is adjusted, so that a depth of the groove 1524a can be adjusted. For example, in case of a condition that etching is performed at 55° with respect to a crystal direction of the carrier substrate 1521W-a, if the width of the groove 1524a is set to be about 140 μm, the depth becomes about 100 μm.

In addition, the through-hole 1523a is also manufactured by using the crystal anisotropic wet etching, and thus, the through-hole 1523a and the groove 1524a can be simultaneously manufactured, so that it is possible to reduce the number of processes. In this case, slanted angles of the through-hole 1523a and the groove 1524a are equal to each other.

Next, as illustrated in FIG. 60C, a lens resin portion 1522a is formed in each through-hole 1523a by the above-described method.

In this manner, the substrate-state lens-attached substrate 1511W-a is manufactured. In addition, the substrate-state lens-attached substrates 1511W-b and 1511W-c are manufactured by the same process.

Figure 61:
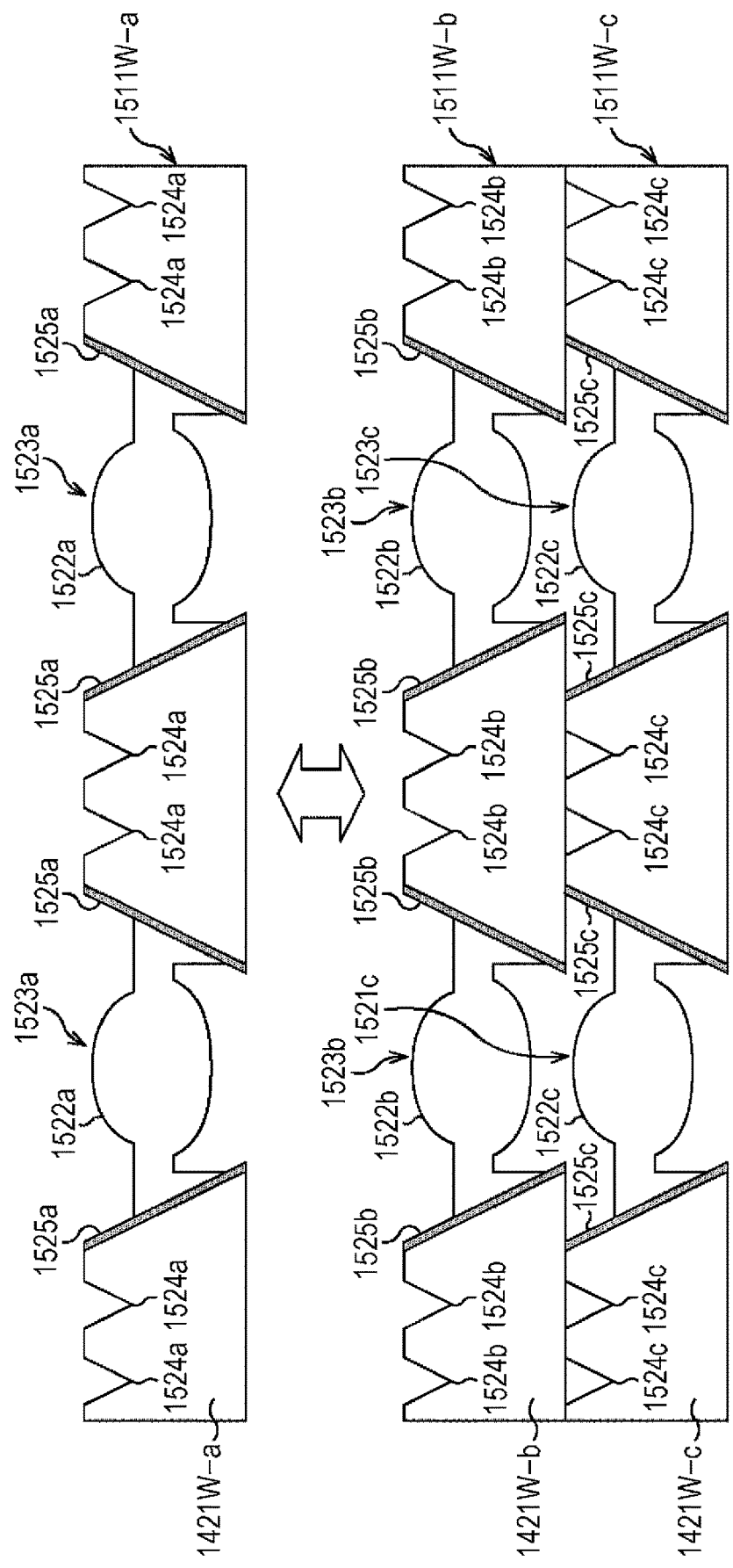
FIG. 61 is a diagram for explaining a manufacturing method for the stacked lens structure of FIG. 59.

Next, as illustrated in FIG. 61, lens-attached substrates 1511W-a to 1511W-c are stacked by direct joining according to the above-described method, so that the substrate-state stacked lens structure 1501W is manufactured. In the stacked lens structure 1501W, the grooves 1524a to 1524c of the lens-attached substrates 1511W-a to 1511W-c substantially overlap each other in the up-down direction.

Figure 62:
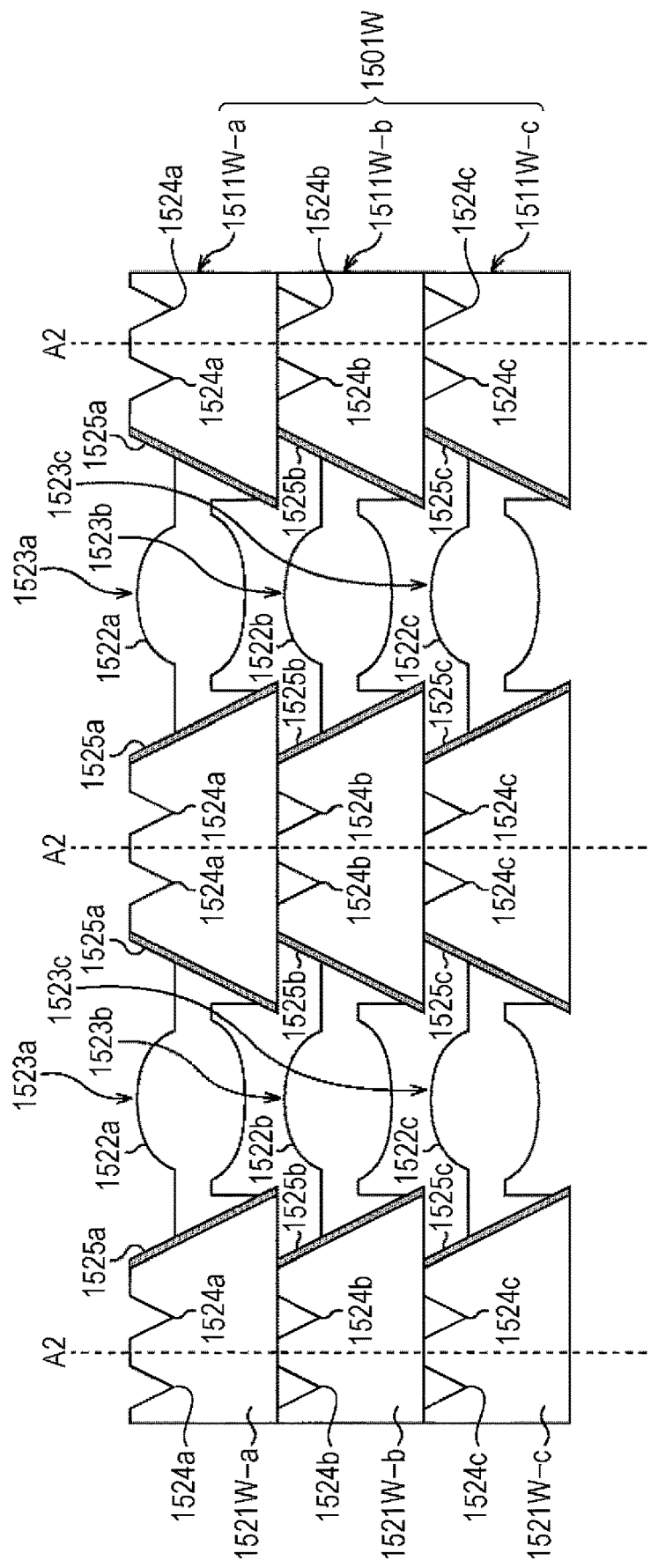
FIG. 62 is a diagram for explaining a manufacturing method for the stacked lens structure of FIG. 59.

Next, as illustration in FIG. 62, a plurality of the stacked lens structures 1501 are obtained by dicing the substrate-state stacked lens structure 1501W into units by using a blade, a laser, or the like. At this time, as indicated by a dotted line A2 of FIG. 62, areas between adjacent grooves 1524a to 1524c are cut along the dicing lines (not shown). Therefore, in each of the lens-attached substrates 1511, the chipping generated by the cutting is stopped at the grooves 1524a to 1524c to be prevented from reaching the through-holes 1523a to 1523c. As a result, the flexural strength of the lens-attached substrates is decreased, so that the stacked lens structure is prevented from being broken at the time of assembling a camera module or the like.

<Third Chipping Countermeasure>

Next, third chipping countermeasure will be described with reference to FIGS. 63 to 66.

Figure 63:
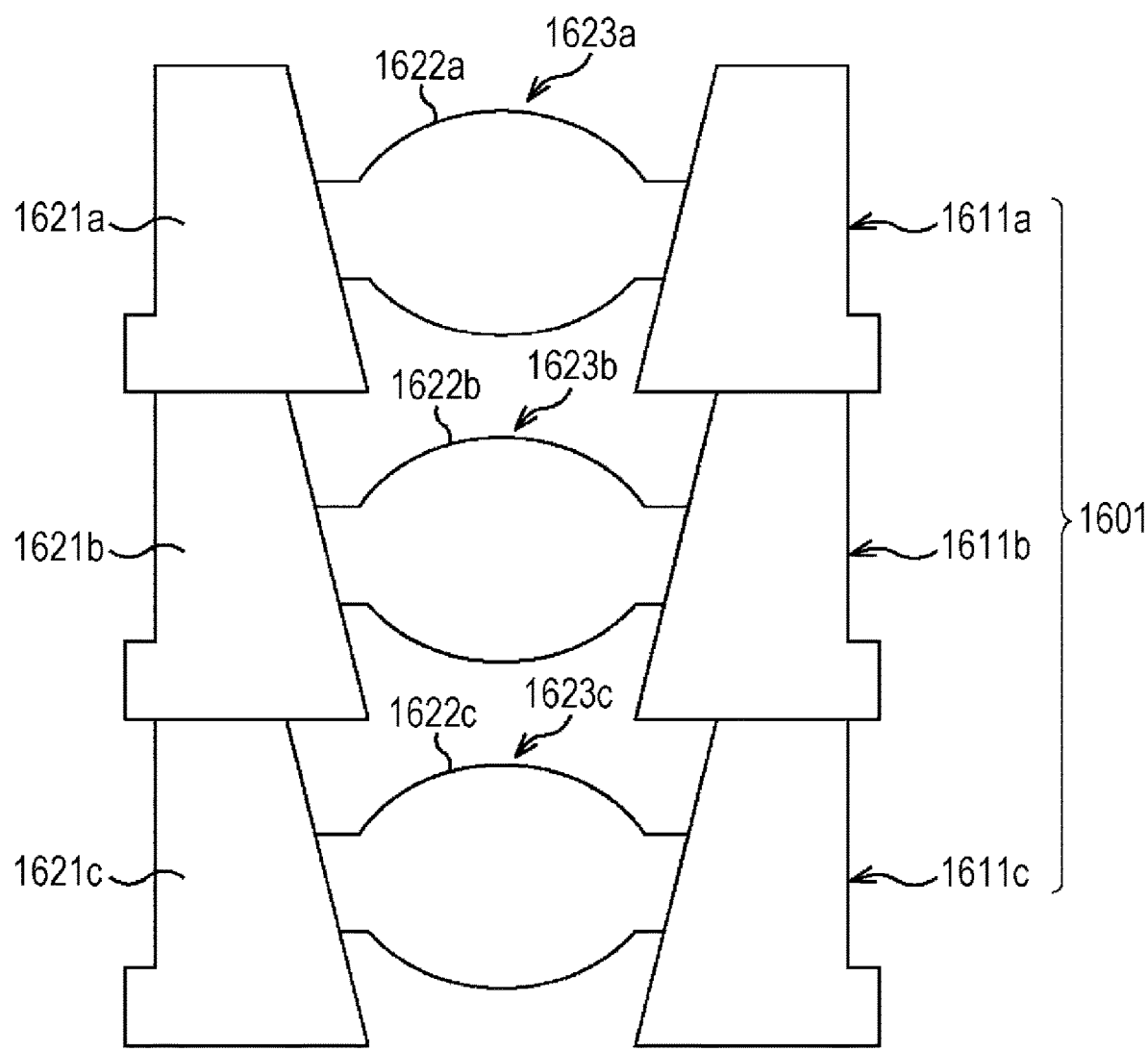
FIG. 63 is a schematic cross-sectional diagram illustrating a stacked lens structure according to an embodiment of the present technology.

FIG. 63 is a schematic cross-sectional diagram illustrating the stacked lens structure 1601. In addition, in FIG. 63, only components necessary for description are mainly illustrated, but components unnecessary for description are appropriately omitted in illustration.

In a stacked lens structure 1601, three layers of lens-attached substrates 1611a to 1611c are stacked. A lens resin portion 1622a is formed in an inner side of a through-hole 1623a of a carrier substrate 1621a of the lens-attached substrate 1611a.

The lens-attached substrates 1611b and 1611c have the same configuration as that of the lens-attached substrate 1611a, and thus, the description thereof is omitted. In addition, in FIG. 63, for the simplification of illustration, an example where the shapes of the lens resin portions 1622a to 1622c are the same is illustrated, but the shapes of the lens resin portions 1622a to 1622c may be arbitrarily set.

In addition, hereinafter, in the case where there is no need to individually distinguish the lens-attached substrates 1611a to 1611c, the lens-attached substrates are simply referred to as a lens-attached substrate 1611. Hereinafter, in the case where there is no need to individually distinguish the carrier substrates 1621a to 1621c, the carrier substrates are simply referred to as a carrier substrate 1621. Hereinafter, in the case where there is no need to individually distinguish the lens resin portions 1622a to 1622c, the lens resin portions are simply referred to as a lens resin portion 1622. Hereinafter, in the case where there is no need to individually distinguish the through-holes 1623a to 1623c, the through-holes are simply referred to as a through-hole 1623.

<Manufacturing Method for Stacked Lens Structure 1601>

Figure 64:
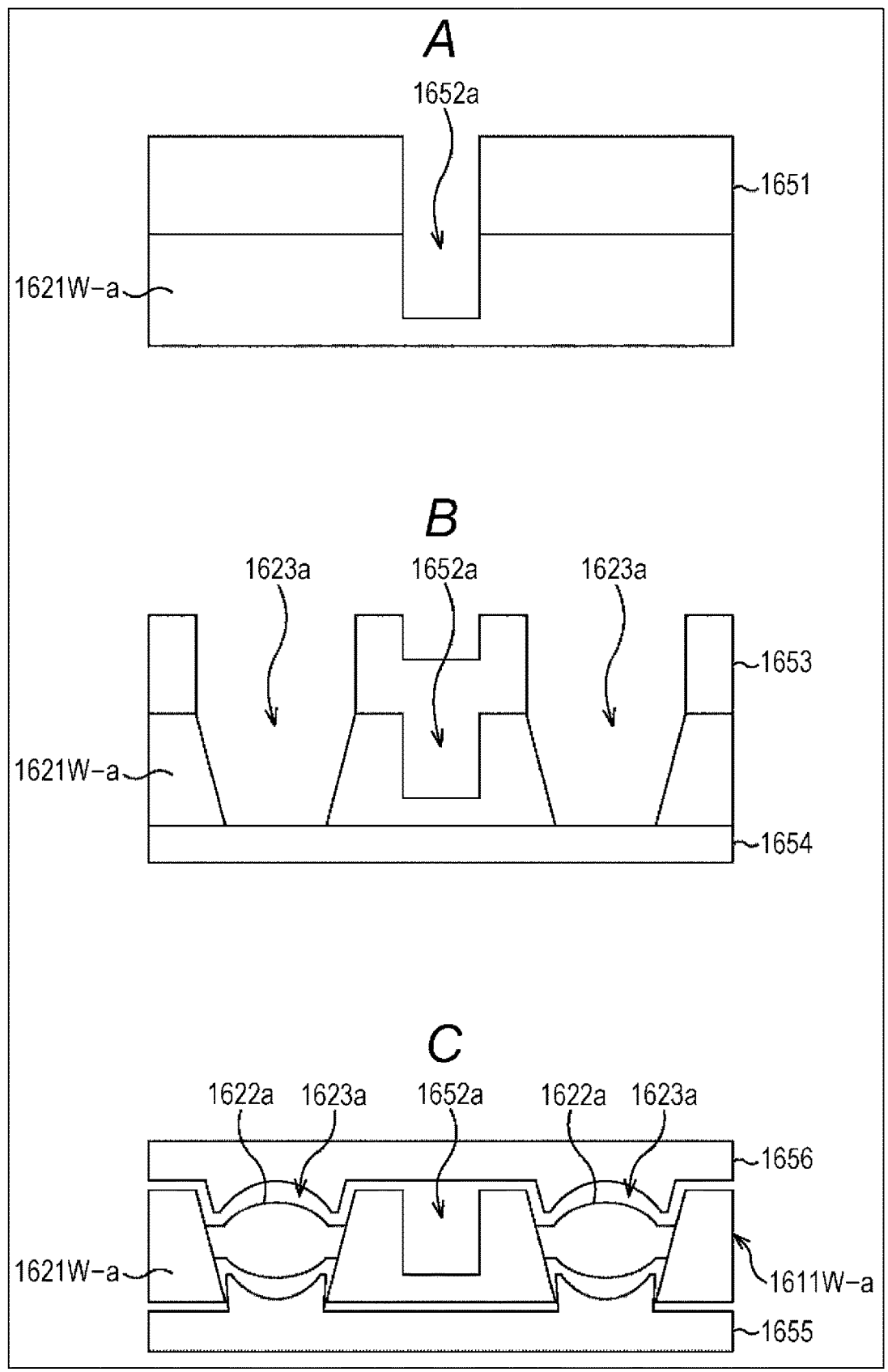
FIG. 64 is a diagram for explaining a manufacturing method for the stacked lens structure of FIG. 63.

Next, a manufacturing method for the stacked lens structure 1601 will be described with reference to FIGS. 64 to 66.

First, as illustrated in FIG. 64A, an etching mask 1651 is formed on the top surface of a substrate-state carrier substrate 1621W-a. An opening portion for forming a groove 1652a is formed in the etching mask 1651. Next, by dry etching or wet etching, the groove 1652a used as a dicing line is formed in the carrier substrate 1621W-a.

Next, after the etching mask 1651 is removed, as illustrated in FIG. 64B, a resin sheet 1654 for reinforcement is adhered to the lower surface of the carrier substrate 1621W-a. In addition, an etching mask 1653 is formed on the upper surface of the carrier substrate 1621W-a. The etching mask 1653 is formed to block the groove 1652a, and an opening portion for forming the through-hole 1623a is formed. Next, by dry etching or wet etching, the through-hole 1623a is formed. In addition, in FIGS. 64A to 64C, although only the two through-holes 1623a are illustrated for lack of space in the paper, actually, a plurality of the through-holes 1623a are formed in the planar directions of the carrier substrate 1621W-a.

Next, as illustrated in FIG. 64C, according to the above-described method, the lens resin portion 1622a is formed inside each through-hole 1623a by using a lower mold frame 1655 and an upper mold frame 1656.

In this manner, the substrate-state lens-attached substrate 1611W-a is manufactured. In addition, by the same processes, the substrate-state lens-attached substrates 1611W-b and 1611W-c are manufactured.

Figure 65:
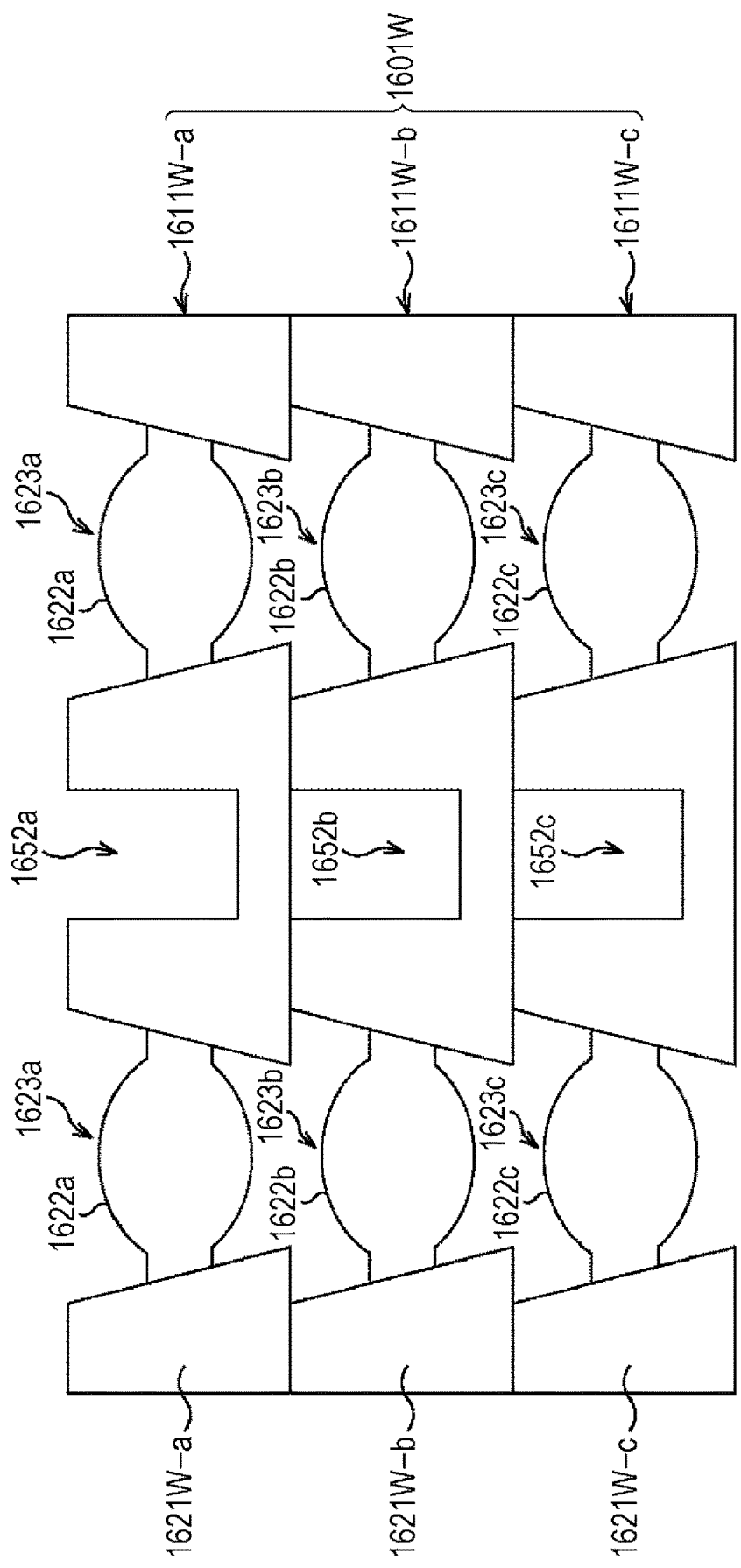
FIG. 65 is a diagram for explaining a manufacturing method for the stacked lens structure of FIG. 63.

Next, by the above-described method, as illustrated in FIG. 65, the lens-attached substrates 1611W-a to 1611W-b are directly joined, so that the substrate-state stacked lens structure 1601W is manufactured. In the stacked lens structure 1601W, the grooves 1652a to 1652c of the lens-attached substrates 1611W-a to 1611W-c substantially overlap each other in the up-down direction.

Figure 66:
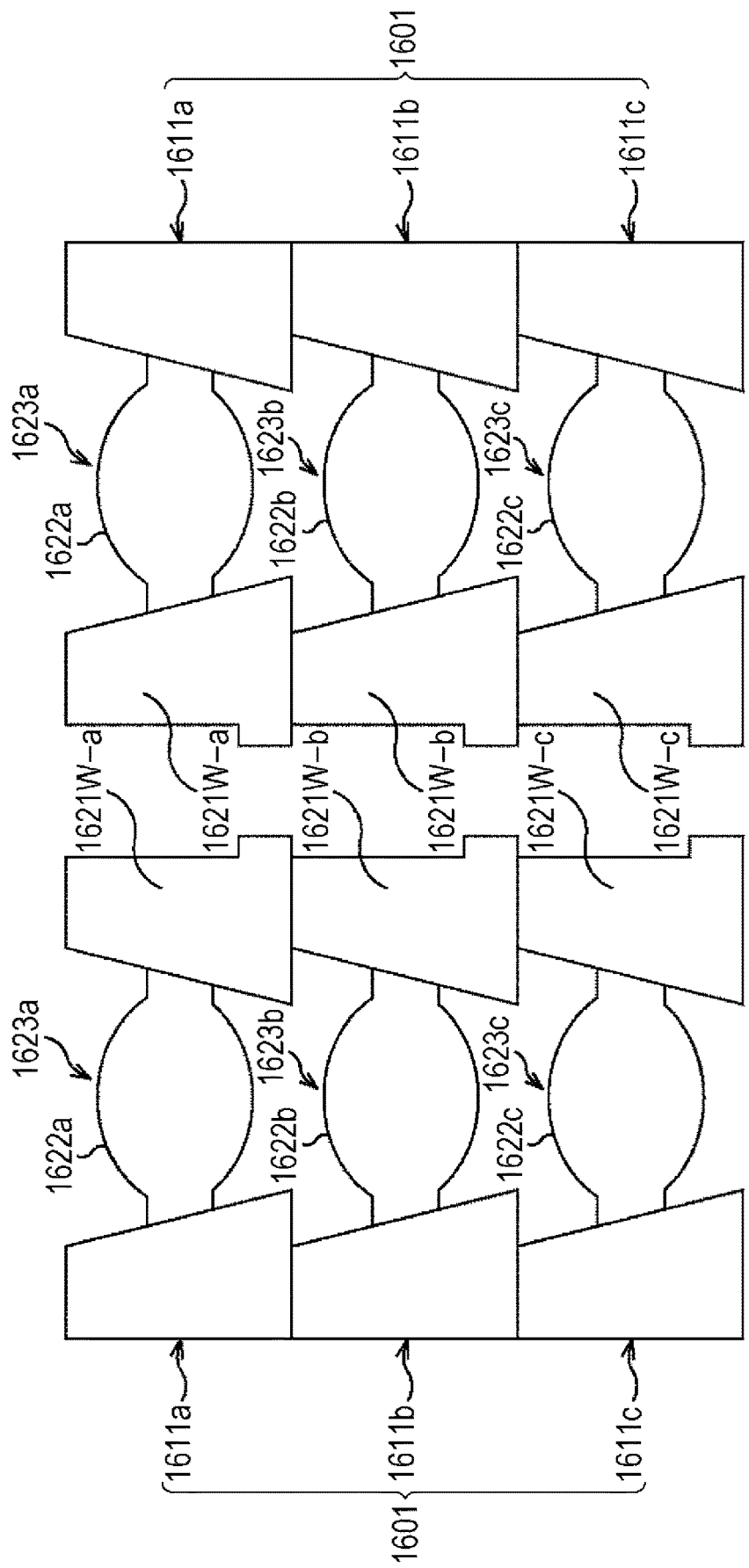
FIG. 66 is a diagram for explaining a manufacturing method for the stacked lens structure of FIG. 63.

Next, as illustrated in FIG. 66, a plurality of the stacked lens structures 1601 are manufactured by cutting the substrate-state stacked lens structure 1601W along the grooves 1652a to 1652c by using a blade, a laser, or the like to be diced into units. At this time, the stacked lens structure 1601W is cut along the grooves 1652a to 1652c, so that the load of dicing is decreased, and thus, it is possible to improve chipping yield and to decrease production cost.

In addition, according to the stacked structure of the lens-attached substrates, dicing is not performed, but the substrate may be diced by cleavage or the like.

<Modified Example of Manufacturing Method for Stacked Lens Structure 1601>

Next, Modified Example of a manufacturing method for the stacked lens structure 1601 will be described.

Figure 67:
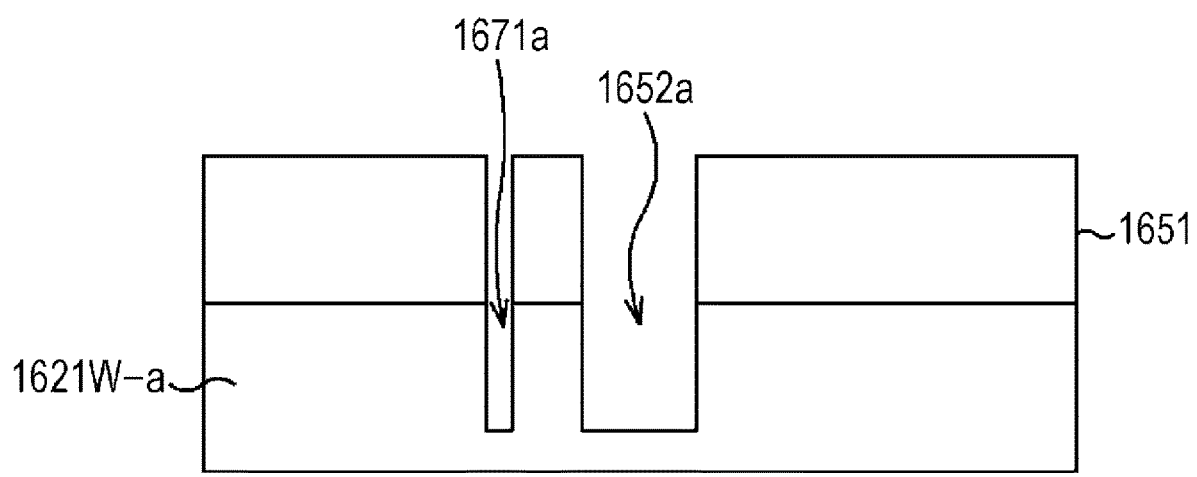
FIG. 67 is a diagram for explaining a first modified example of the manufacturing method for the stacked lens structure of FIG. 63.

For example, as illustrated in FIG. 67, at the time of forming the grooves 1652a for dicing lines, the grooves 1671a for alignment marks may be allowed to be simultaneously formed. Therefore, it is possible to reduce the number of processes.

In addition, for example, as illustrated FIGS. 68A and 68B, processing of through-holes 1623a and a groove 1682a for dicing may be simultaneously performed.

More specifically, as illustrated in FIG. 68A, an etching mask 1681 is formed on the upper surface of a substrate-state carrier substrate 1621W-a. An opening portion for forming the through-hole 1623a and the groove 1682a are formed in the etching mask 1681. Next, by dry etching or wet etching, the groove 1682a is formed, and the through-hole 1623a is formed in the meantime.

Next, after the etching mask 1681 is removed, as illustrated in FIG. 64B, a resin sheet 1684 for reinforcement is adhered to the lower surface of the carrier substrate 1621W-a. In addition, an etching mask 1683 is formed on the upper surface of the carrier substrate 1621W-a. The etching mask 1683 is formed to block the groove 1682a, and an opening portion for forming the through-hole 1623a is formed. Next, by dry etching or wet etching, processing is performed until the through-hole 1623a penetrates the carrier substrate 1621W-a.

In this manner, the processing of the through-hole 1623a and the processing of the groove 1682a are simultaneously performed, it is possible to shorten the processing time.

Figure 69:
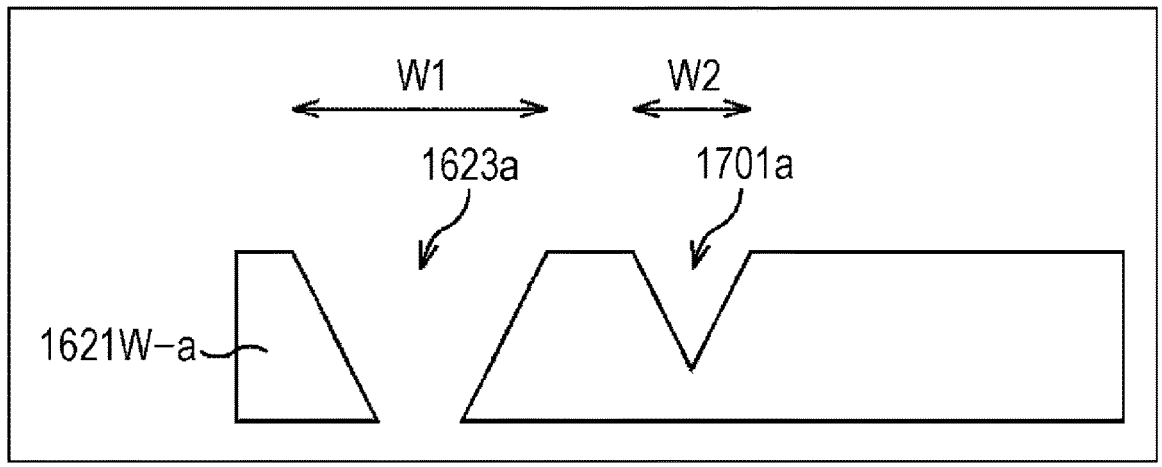
FIG. 69 is a diagram for explaining a third modified example of the manufacturing method for the stacked lens structure of FIG. 63.
Figure 70:
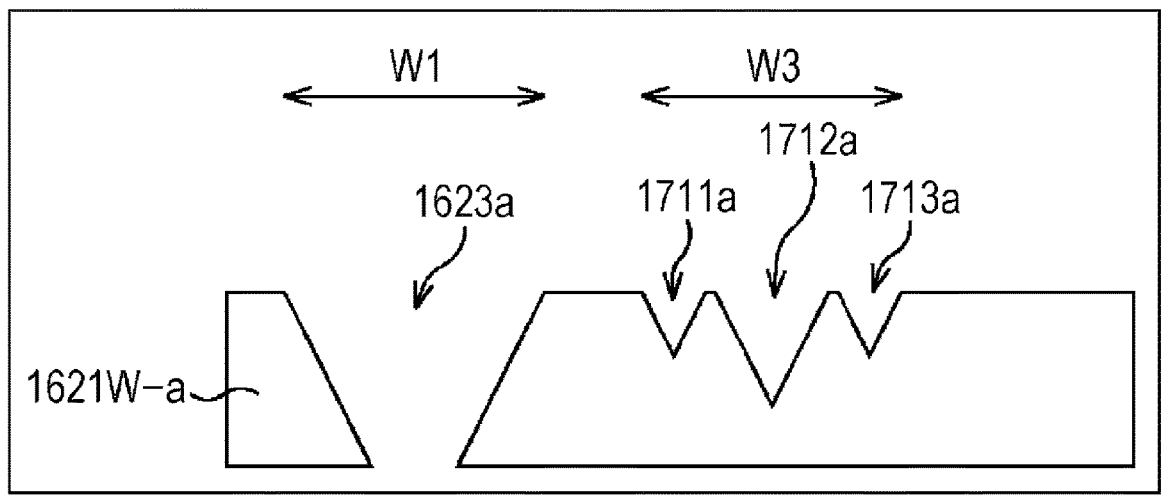
FIG. 70 is a diagram for explaining a third modified example of the manufacturing method for the stacked lens structure of FIG. 63.

In addition, for example, as illustrated in FIGS. 69 and 70, by crystal anisotropic wet etching, the processing of the through-hole 1623a and the processing of the dicing line may be simultaneously performed. In this case, with respect to a relationship between the width of the through-hole 1623a and the width of the dicing line, the width and number of grooves for the dicing line are adjusted so that the groove for the dicing line does not penetrate the carrier substrate 1621W-a.

For example, as illustrated in FIG. 69, in the case where the width W1 of the through-hole 1623a is larger than the width W2 of the dicing line, one groove 1701a is formed in the dicing line.

On the other hand, as illustrated in FIG. 70, in the case where the width W1 of the through-hole 1623a is the same as the width W3 of the dicing line or is smaller than the width W3 of the dicing line, a plurality of the grooves are formed in the dicing line. In case of this example, three grooves of the grooves 1711a to 1713a are formed. In addition, the number of grooves in a dicing line is determined according to thickness of the carrier substrate 1621W, the width of the dicing line, a desired depth of the groove, and the like.

In addition, the first to third chipping countermeasures described above are not limited to the stacked lens structure, but these countermeasures can be applied to the case of manufacturing a semiconductor device by stacking the carrier substrates and cutting the stacked substrate. For example, by stacking a substrate where a plurality of pixel array portions are disposed and a substrate where a plurality of control circuits performing control or the like of the pixel array portions are disposed and cutting the stacked substrate, these countermeasures can be applied to the case of manufacturing a solid-state imaging device where a pixel substrate and a control substrate are stacked.

In addition, for example, in the first or second chipping countermeasure, in the case where a plurality of patterns configured with predetermined circuits or parts are disposed in the carrier substrate, it is preferable that a groove surrounding each pattern is formed within an area surrounded by a dicing line.

17. Example of Application to Electronic Apparatus

The above-described camera module 1 can be used in a form where the camera module is incorporated into an electronic apparatus using a solid-state image device in an image acquisition unit (photoelectric conversion unit), for example, an imaging apparatus such as a digital still camera or a video camera, a mobile terminal apparatus having an imaging function, a copier using a solid-state imaging device in an image reading unit, or the like.

Figure 71:
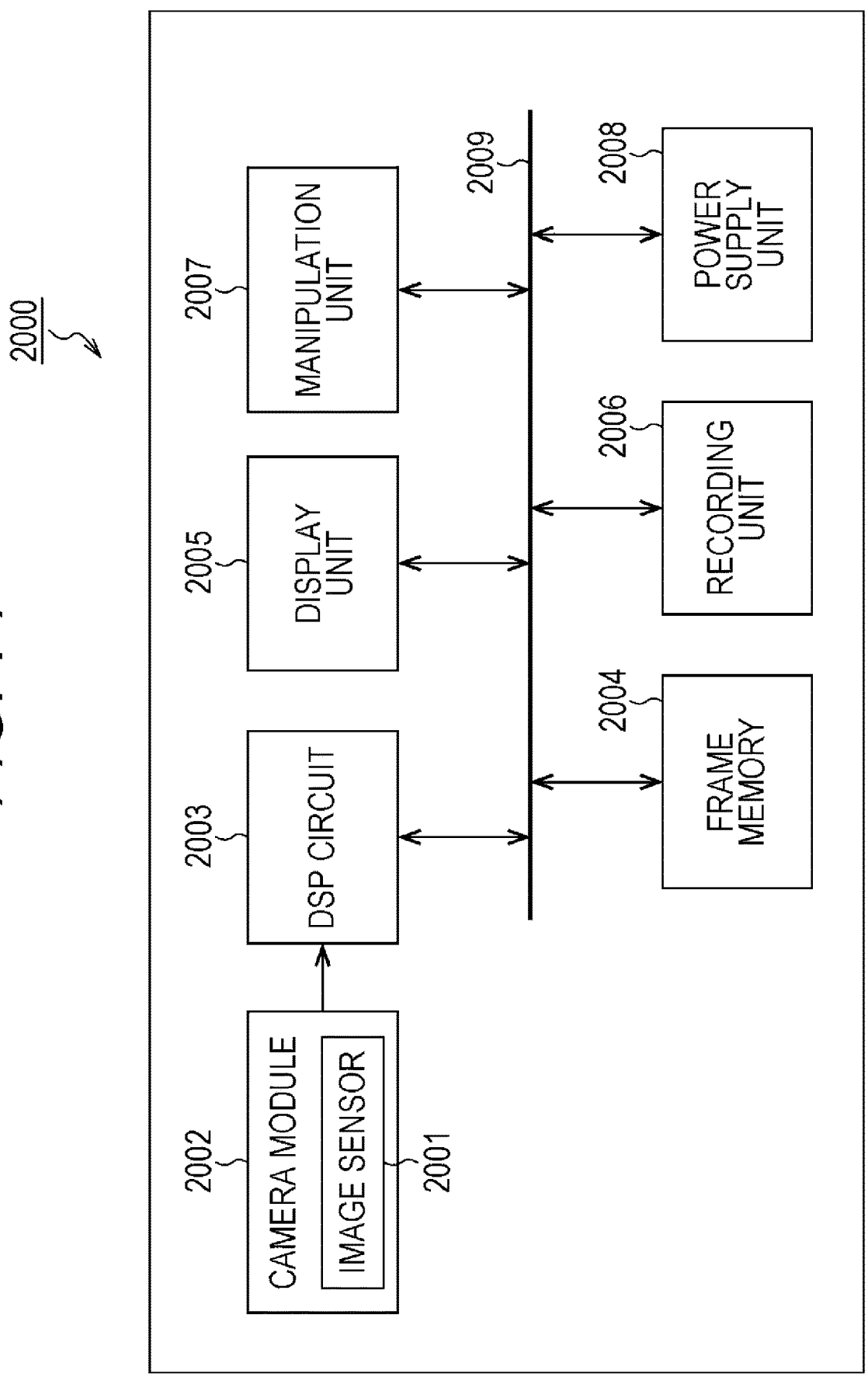
FIG. 71 is a block diagram illustrating an example of a configuration of an imaging apparatus as an electronic apparatus employing the present technology.

FIG. 71 is a block diagram illustrating an example of a configuration of an imaging apparatus as an electronic apparatus employing the present technology.

An imaging apparatus 2000 of FIG. 71 is configured to include a camera module 2002 and a digital signal processor (DSP) circuit 2003 which is a camera signal processing circuit. In addition, the imaging apparatus 2000 is configured to further include a frame memory 2004, a display unit 2005, a recording unit 2006, a manipulation unit 2007, and a power supply unit 2008. The DSP circuit 2003, the frame memory 2004, the display unit 2005, the recording unit 2006, the manipulation unit 2007, and the power supply unit 2008 are connected to each other via a bus line 2009.

The image sensor 2001 in the camera module 2002 receives incident light (image light) from a subject and converts a light amount of the incident light focused on an imaging plane into an electrical signal in units of a pixel to output a pixel signal. The above-described camera module 1 is employed as the camera module 2002, and the image sensor 2001 corresponds to the above-described light-receiving device 12.

The display unit 2005 is configured with, for example, a panel-type display device such as a liquid crystal panel or an organic electro luminescence (EL) and displays a moving picture or a still image captured by the image sensor 2001. The recording unit 2006 records the moving picture or the still image captured by the image sensor 2001 in a recording medium such as a hard disk or a semiconductor memory.

The manipulation unit 2007 issues manipulation commands with respect to various functions of the imaging apparatus 2000 according to user's manipulation. The power supply unit 2008 appropriately supplies various powers which are operating powers of the DSP circuit 2003, the frame memory 2004, the display unit 2005, the recording unit 2006 and the manipulation unit 2007 to the respective components.

As described above, the camera module 1 equipped with the stacked lens structure 11 which are position-aligned at a high accuracy and joined (stacked) is used as the camera module 2002, so that it is possible to implement high image quality and miniaturization. Therefore, with respect to the imaging apparatus 2000 such as a video camera, a digital still camera, or a camera module for a mobile device such as a mobile phone, both of the miniaturization of a semiconductor package and the high quality of captured image can be achieved.

18. Use Example of Image Sensor

The technology according to an embodiment of the present disclosure may be applied to various products. For example, the technology according to an embodiment of the present disclosure may be applied to an internal information acquisition system for a patient, which uses an endoscopic capsule.

Figure 72:
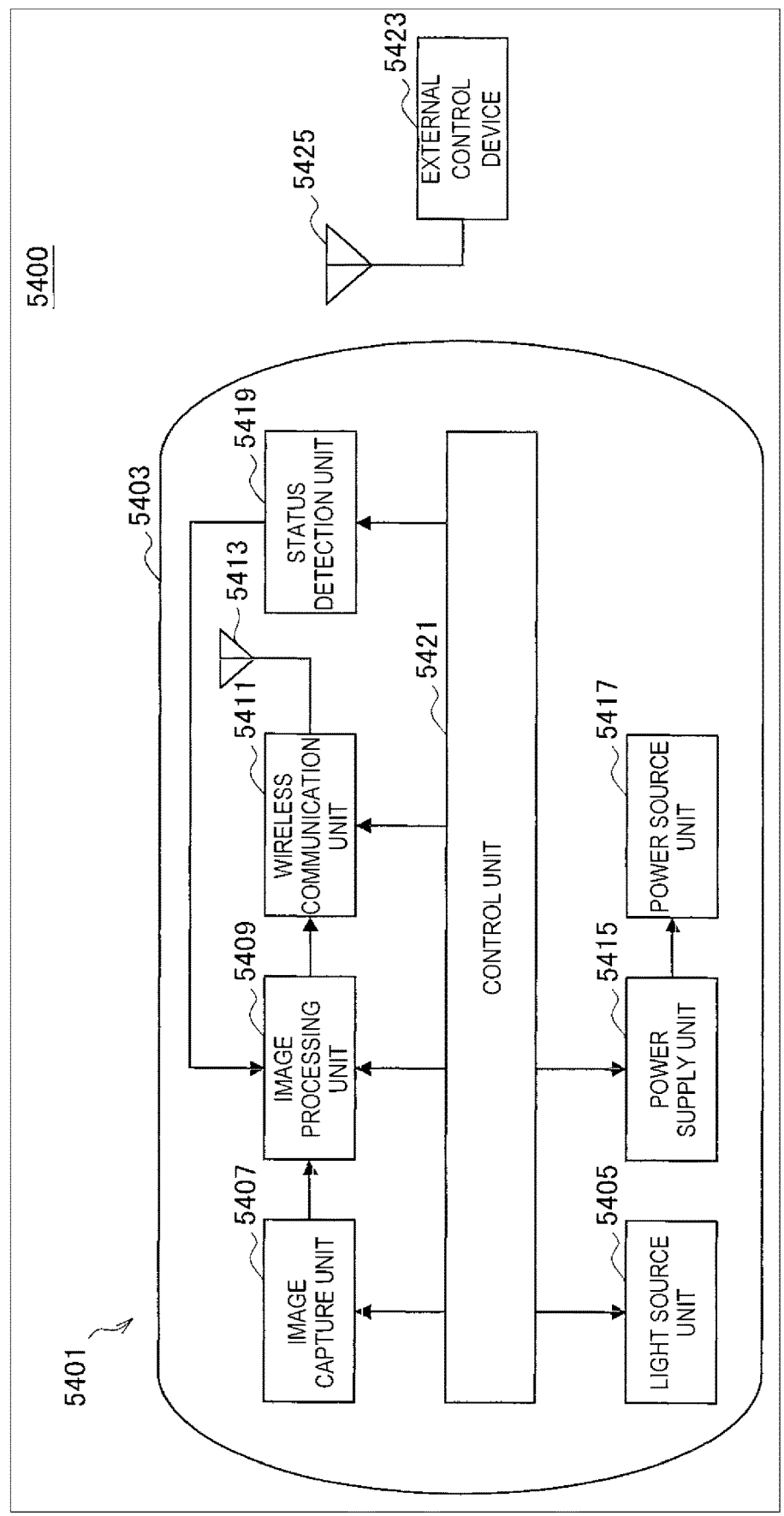
FIG. 72 is a block diagram illustrating an example of a schematic configuration of an internal information acquisition system.

FIG. 72 is a diagram illustrating an example of a schematic configuration of an internal information acquisition system 5400 to which the technology according to an embodiment of the present disclosure may be applied. Referring to FIG. 72, the internal information acquisition system 5400 includes an endoscopic capsule 5401, and an external control device 5423 that centrally controls the operation of the internal information acquisition system 5400. The endoscopic capsule 5401 is swallowed by a patient in an examination. The endoscopic capsule 5401 has an image capture function and a wireless communication function. The endoscopic capsule 5401 moves through the interior of organs such as the stomach and the intestines by peristaltic movement or the like until being excreted naturally from the patient, while also successively capturing images (hereinafter also called internal images) of the interior of the relevant organs at predetermined intervals, and successively wirelessly transmitting information about the internal images to the external control device 5423 outside the body. Based on the received information about the internal images, the external control device 5423 generates image data for displaying the internal images on a display device (not illustrated). In this way, with the internal information acquisition system 5400, images depicting the patient's internal conditions can be obtained continually from the time the endoscopic capsule 5401 is swallowed to the time the endoscopic capsule 5401 is excreted.

The configurations and functions of the endoscopic capsule 5401 and the external control device 5423 will be described in further detail. As illustrated in FIG. 72, the endoscopic capsule 5401 has the functions of a light source unit 5405, an image capture unit 5407, an image processing unit 5409, a wireless communication unit 5411, a power supply unit 5415, a power source unit 5417, a status detection unit 5419, and a control unit 5421 built in a capsule-shaped housing 5403.

The light source unit 5405 includes a light source such as a light-emitting diode (LED), for example, and irradiates the imaging field of the image capture unit 5407 with light.

The image capture unit 5407 includes an image sensor, and an optical system made up of multiple lenses provided in front of the image sensor. Reflected light (hereinafter called observation light) from the light used to irradiate a body tissue which is the object of observation is condensed by the optical system and incident on the image sensor. The image sensor receives and photoelectrically converts the observation light to thereby generate an electrical signal corresponding to the observation light, or in other words, an image signal corresponding to the observed image. The image signal generated by the image capture unit 5407 is provided to the image processing unit 5409. Note that various known image sensors such as a complementary metal-oxide-semiconductor (CMOS) image sensor or a charge-coupled device (CCD) image sensor may be used as the image sensor of the image capture unit 5407.

The image processing unit 5409 includes a processor such as a central processing unit (CPU) or a graphics processing unit (GPU), and performs various types of signal processing on the image signal generated by the image capture unit 5407. This signal processing may be a minimal level of processing (such as image data compression, frame rate conversion, data rate conversion, and/or format conversion, for example) for transmitting the image signal to the external control device 5423. Configuring the image processing unit 5409 to perform only a minimal necessary level of processing makes it possible to realize the image processing unit 5409 in a more compact form with lower power consumption, which is preferable for the endoscopic capsule 5401. However, if there is extra space or available power inside the housing 5403, additional signal processing (such as a noise removal process or other image quality-improving processes, for example) may also be performed by the image processing unit 5409. The image processing unit 5409 provides the image signal subjected to the signal processing to the wireless communication unit 5411 as raw data. Note that if information about the status (such as movement or orientation) of the endoscopic capsule 5401 is acquired by the status detection unit 5419, the image processing unit 5409 may also provide the image signal to the wireless communication unit 5411 in association with the information. This makes it possible to associate the position inside the body where an image is captured, the direction in which the image is captured and the like with the captured image.

The wireless communication unit 5411 includes a communication device capable of transmitting and receiving various types of information to and from the external control device 5423. This communication device includes, for example, an antenna 5413 and a processing circuit that performs processing such as modulation processing for transmitting and receiving signals. The wireless communication unit 5411 performs predetermined processing such as modulation processing on the image signal that was subjected to the signal processing by the image processing unit 5409, and transmits the image signal to the external control device 5423 via the antenna 5413. In addition, the wireless communication unit 5411 receives, from the external control device 5423 via the antenna 5413, a control signal related to driving control of the endoscopic capsule 5401. The wireless communication unit 5411 provides the received control signal to the control unit 5421.

The power supply unit 5415 includes, for example, an antenna coil for receiving power, a power regeneration circuit for regenerating power from a current produced in the antenna coil, and a voltage step-up circuit. In the power supply unit 5415, the principle of what is called contactless or wireless charging is used to generate power. Specifically, an external magnetic field (electromagnetic wave) of a predetermined frequency provided to the antenna coil of the power supply unit 5415 produces an induced electromotive force in the antenna coil. This electromagnetic wave may be a carrier wave transmitted from the external control device 5423 via an antenna 5425, for example. Power is regenerated from the induced electromotive force by the power regeneration circuit, and the electric potential of the power is suitably adjusted in the voltage step-up circuit, thereby generating power for power storage. The power generated by the power supply unit 5415 is stored in the power source unit 5417.

The power source unit 5417 includes a secondary battery, and stores power generated by the power supply unit 5415. FIG. 72 omits arrows or the like indicating the recipients of power from the power source unit 5417 for brevity, but power stored in the power source unit 5417 is supplied to the light source unit 5405, the image capture unit 5407, the image processing unit 5409, the wireless communication unit 5411, the status detection unit 5419, and the control unit 5421, and may be used to drive these components.

The status detection unit 5419 includes a sensor such as an acceleration sensor and/or a gyro sensor for detecting the status of the endoscopic capsule 5401. The status detection unit 5419 can acquire information about the status of the endoscopic capsule 5401 from detection results from the sensor. The status detection unit 5419 provides the acquired information about the status of the endoscopic capsule 5401 to the image processing unit 5409. As discussed earlier, in the image processing unit 5409, the information about the status of the endoscopic capsule 5401 may be associated with the image signal.

The control unit 5421 includes a processor such as a CPU, and centrally controls the operation of the endoscopic capsule 5401 by operating in accordance with a predetermined program. The control unit 5421 appropriately controls the driving of the light source unit 5405, the image capture unit 5407, the image processing unit 5409, the wireless communication unit 5411, the power supply unit 5415, the power source unit 5417, and the status detection unit 5419 in accordance with a control signal transmitted from the external control device 5423, thereby realizing the function of each component as described above.

The external control device 5423 may be a processor such as a CPU or GPU, or a device such as a microcontroller or a control board on which a processor and a storage element such as memory are mounted. The external control device 5423 includes the antenna 5425, and is capable of transmitting and receiving various types of information to and from the endoscopic capsule 5401 via the antenna 5425. Specifically, the external control device 5423 controls the operation of the endoscopic capsule 5401 by transmitting a control signal to the control unit 5421 of the endoscopic capsule 5401. For example, a light irradiation condition under which the light source unit 5405 irradiates a target of observation with light may be changed by a control signal from the external control device 5423. In addition, an image capture condition (such as the frame rate and the exposure level in the image capture unit 5407, for example) may be changed by a control signal from the external control device 5423. In addition, the content of processing in the image processing unit 5409 and a condition (such as the transmission interval and the number of images to transmit, for example) under which the wireless communication unit 5411 transmits the image signal may be changed by a control signal from the external control device 5423.

In addition, the external control device 5423 performs various types of image processing on the image signal transmitted from the endoscopic capsule 5401, and generates image data for displaying a captured internal image on a display device. For the image processing, various known signal processing, such as a development process (demosaicing process), an image quality-improving process (such as a band enhancement process, a super-resolution process, a noise reduction (NR) process, and/or a shake correction process), and/or an enlargement process (electronic zoom process), may be performed. The external control device 5423 controls the driving of a display device (not illustrated), and causes the display device to display a captured internal image on the basis of the generated image data. Alternatively, the external control device 5423 may also cause a recording device (not illustrated) to record the generated image data, or cause a printing device (not illustrated) to make a printout of the generated image data.

The above describes an example of the internal information acquisition system 5400 to which the technology according to an embodiment of the present disclosure may be applied. Among the configurations described in the foregoing, the technology according to an embodiment of the present disclosure may be applied favorably to an endoscopic capsule. Specifically, this invention is effective for downsizing an imaging device and reducing the burden on patients applying technology according to an embodiment of the present.

Figure 73:
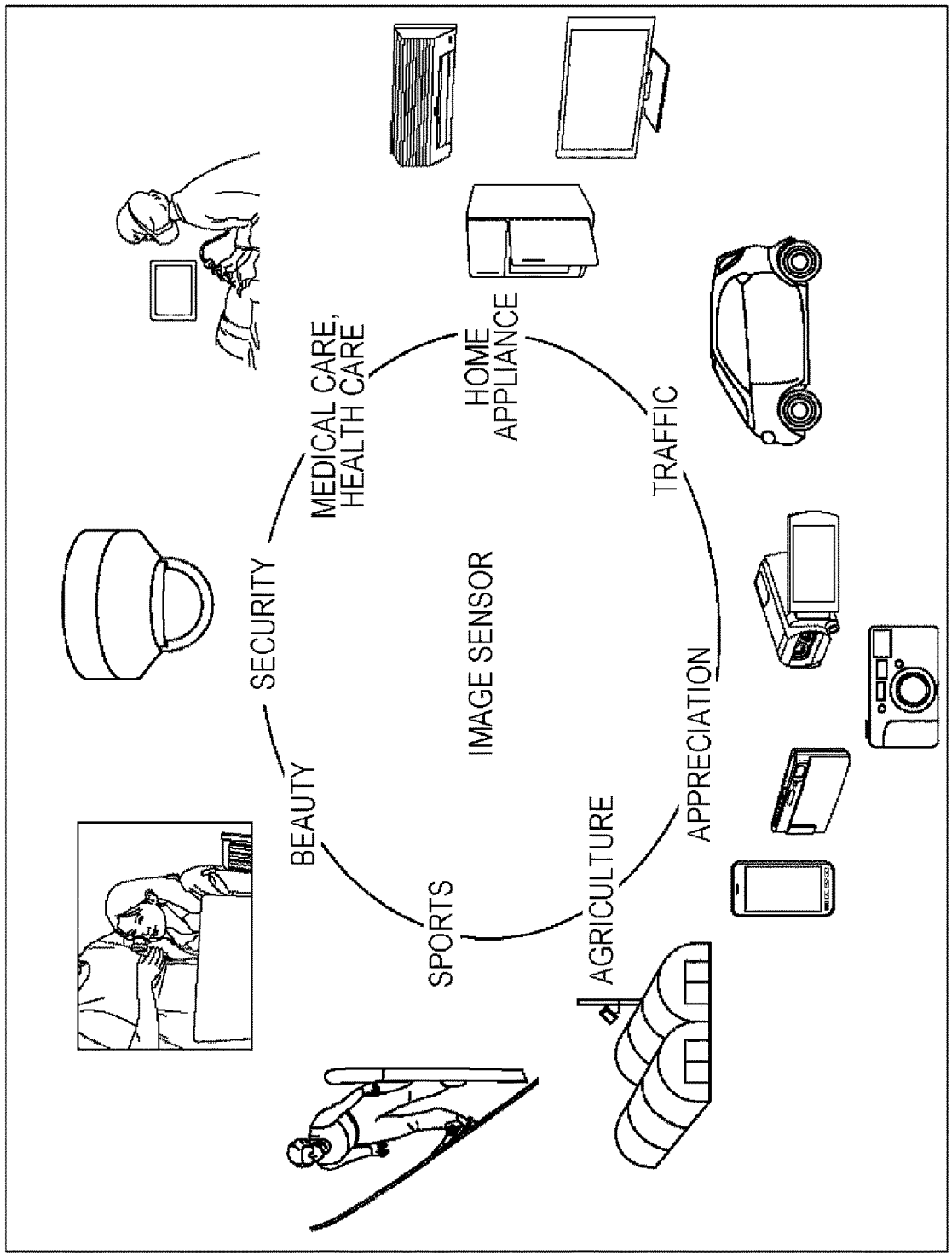
FIG. 73 is a diagram for explaining an example of use of an image sensor.

FIG. 73 is a diagram illustrating a use example using an image sensor configured as a camera module 1.

The image sensor configured as the camera module 1 can be used for various cases of sensing light such as visible light, infrared light, ultraviolet light, X-rays, for example, as follows.

Apparatuses capturing images provided for the use in appreciation such as a digital camera or a mobile apparatus with a camera function Apparatuses provided for the use in traffic such as an on-vehicle sensor imaging front and rear sides, surroundings, inside of a vehicle, a surveillance camera monitoring running vehicles and roads, or a distance measuring sensor measuring distances between vehicles for the purpose of safe driving such as automatic stop or recognition of driver's state or the like Apparatuses provided to home appliance such as a TV set, a refrigerator, or an air-conditioner to image user's gesture and manipulate the home appliance according to the gesture Apparatuses provided for the use in medical care or health care such as an endoscope or an apparatus performing angiography by receiving infrared light Apparatuses provided for the use in security such as a surveillance camera for crime prevention or a camera for person authentication Apparatuses provided for the use in beauty such as a skin measurement instrument imaging skin or a microscope imaging scalp Apparatuses provided for the use in sports such as an action camera dedicated to sports applications or a wearable camera Apparatuses provided for the use in agriculture such as a camera for monitoring states of fields or crops The embodiment of the present technique are not limited the above-described embodiments, but various changes are available within the scope without departing from the spirit of the present technique.

For example, the present technology is not limited to the application to the solid-state imaging device which detects a distribution of an incident amount of visible light and captures an image, but the present technology can be applied to a solid-state imaging device which captures a distribution of an incident amount of infrared light, X-rays, or particles or a solid-state imaging device (physical quantity distribution detection device) such as a fingerprint detection sensor which detects other physical quantities such as pressure or electrostatic capacitance and captures an image in a broad sense.

For example, the present technology may employ a combination of all or some of the above-described embodiments.

In addition, the effects disclosed in this specification are exemplary ones but not limited ones, and thus, there may be effects other than the effects disclosed in this specification.

In addition, the present technology may have the configurations as follows.

(1) A semiconductor device, wherein a substrate, in which a groove surrounding a pattern configured with a predetermined circuit or part is formed, is stacked.

(2) The semiconductor device disclosed in (1),
wherein a through-hole is formed in the pattern,
wherein a lens is disposed in an inner side of the through-hole, and
wherein the groove surrounds the through-hole.

(3) The semiconductor device disclosed in (2), wherein a slanted angle of the through-hole is equal to a slanted angle of the groove.

(4) The semiconductor device disclosed in (3), wherein the through-hole and the groove are formed by wet etching.

(5) The semiconductor device disclosed in any one of (1) to (4), wherein the substrates are joined by direct joining.

(6) The semiconductor device disclosed in (5), wherein the direct joining is plasma joining.

(7) A manufacturing method for a semiconductor device, including:
forming a groove surrounding a pattern configured with a predetermined circuit or part within an area surrounded by a dicing line, in a plurality of substrates;
stacking a plurality of the substrates by joining; and
dicing the stacked substrates along the dicing line.

(8) An electronic apparatus including a semiconductor device, wherein a substrate, in which a groove surrounding a pattern configured with a predetermined circuit or part is formed, is stacked in the semiconductor device.

(9) A manufacturing method for a semiconductor device, including:
forming a groove in each dicing line of a plurality of substrates;
stacking the plurality of substrates by joining; and
dicing the stacked substrates along the dicing line.

(10) The manufacturing method for a semiconductor device disclosed in (9),
wherein a through-hole is formed within an area surrounded by the dicing line in each substrate,
wherein a lens is formed in an inner side of each through-hole, and
wherein the plurality of substrates where the lens is formed are stacked by joining.

(11) The manufacturing method for a semiconductor device disclosed in (10), wherein processing of the through-hole and processing of the groove are simultaneously performed.

(12) The manufacturing method for a semiconductor device disclosed in (11), wherein the through-hole and the groove are formed by wet etching.

(13) The manufacturing method for a semiconductor device disclosed in (12), wherein the number of grooves and a width of the groove are adjusted based on a thickness of the substrate and a width of the dicing line.

(14) The manufacturing method for a semiconductor device disclosed in any one of (9) to (13), wherein processing of the groove and processing of an alignment mark are simultaneously performed.

(15) The manufacturing method for a semiconductor device disclosed in any one of (9) to (14), wherein the substrates are joined by direct joining.

(16) The manufacturing method for a semiconductor device disclosed in (15), wherein the direct joining is plasma joining.

(17) A semiconductor device manufactured by:
forming a groove in each dicing line of a plurality of substrates;

stacking the plurality of substrates by joining; and
dicing the stacked substrates along the dicing line.

(18) An electronic apparatus including a semiconductor device manufactured by:
forming a groove in each dicing line of a plurality of substrates;
stacking the plurality of substrates by joining; and
dicing the stacked substrates along the dicing line.

(19) A lens substrate comprising:
a substrate having a through-hole;
a lens disposed in the through-hole; and
a groove disposed adjacent to the through-hole in a cross-section view.

(20) The lens substrate according to (19), wherein the groove surrounds the through-hole in a plan view.

(21) The lens substrate according to (20), wherein an angle of a sidewall of the through-hole with respect to a surface of the substrate and an angle of a sidewall of the groove with respect to the surface of the substrate are substantially equal.

(22) The semiconductor device according to (21), wherein the through-hole and the groove are formed by wet etching.

(23) The semiconductor device according to (21) or (22), wherein both angles are less than or equal to ninety degrees.

(24) The semiconductor device according to any one of (19) to (23), wherein the substrate and a second substrate including a second through-hole with a second lens disposed therein are directly bonded to each other.

(25) The semiconductor device according to (24), wherein the substrate and the second substrate are directly bonded to each other using plasma bonding.

(26) The semiconductor device according to (24) or (25), wherein the groove in the substrate overlaps a groove formed in the second substrate in a direction perpendicular to a light-incident surface of the substrate.

(27) The semiconductor device according to (19), further comprising:
a second groove formed in the substrate, wherein the second groove is adjacent to the groove; and
a third groove formed in the substrate, wherein the third groove is adjacent to the second groove.

(28) The semiconductor device according to (19), the substrate further including:
a second through-hole,
a second lens disposed in the second through-hole, and
a second groove disposed adjacent to the second through-hole in a cross-section view.

(29) The semiconductor device according to (28), wherein the groove is adjacent to the second groove.

(30) The semiconductor device according to (29), wherein a dicing area separates the groove and the second groove.

(31) The semiconductor device according to any one of (19) to (30), wherein a width of the groove is greater than a depth of the groove.

(32) The semiconductor device according to (31), wherein a ratio of the width of the groove to the depth of the groove is approximately 1.4.

(33) The semiconductor device according to any one of (19) to (32), wherein the groove is formed at a same time as the through-hole is formed.

(34) The semiconductor device according to any one of (19) to (33), wherein the substrate further includes:
a second through-hole; and
a second lens disposed in the second through-hole, wherein the groove is disposed between the through-hole and the second through-hole.

(35) The semiconductor device according to (34), wherein a width of a dicing area is less than a width of the groove.

(36) The semiconductor device according to any one of (19) to (35), wherein a width of the through-hole is greater than a width of the groove.

(37) A method of manufacturing a semiconductor device, the method comprising:
forming a through-hole in a substrate;
forming a lens in the through-hole; and
forming a groove adjacent to the through-hole in a cross-section view.

(38) An electronic apparatus comprising:
a camera module including a stacked lens structure, the stacked lens structure including:
a plurality of substrates, each substrate of the plurality of substrates including:
a through-hole with a lens disposed therein; and
a groove disposed adjacent to the through-hole in a cross-section view.

REFERENCE SIGNS LIST

1 Camera module
11 Stacked lens structure
12 Light-receiving device
13 Optical unit
21 Lens
41 (41a to 41e) Lens-attached substrate
43 Sensor substrate
51 Aperture stop plate
52 Aperture portion
81 Carrier substrate
82 Lens resin portion
83 Through-hole
121 Light-shielding film
122 Upper surface layer
123 Lower surface layer
141 Etching mask
142 Protective film
1401 Stacked lens structure
1411a to 1411c Lens-attached substrate
1421a to 1421c Carrier substrate
1422a to 1422c Lens resin portion
1423a to 1423c Through-hole
1424a to 1424c Groove
1501 Stacked lens structure
1511a to 1511c Lens-attached substrate
1521a to 1521c Carrier substrate
1522a to 1522c Lens resin portion
1523a to 1523c Through-hole
1524a to 1524c Groove
1601 Stacked lens structure
1611a to 1611c Lens-attached substrate
1621a to 1621c Carrier substrate
1622a to 1622c Lens resin portion
1623a to 1623c Through-hole
1652a to 1652c, 1671a, 1682a, 1701a, 1711a to 1713a Groove
2000 Imaging apparatus
2001 Image sensor
2002 Camera module

What is claimed is:
1. A lens substrate, comprising:
a substrate having a through-hole;
a lens disposed in the through-hole; and
a plurality of grooves disposed adjacent to the through-hole in a cross-sectional view, wherein the plurality of grooves is arranged in a zigzag configuration with each groove of the plurality of grooves tapering from a top portion of the substrate towards a bottom portion of the substrate, and wherein a width of the plurality of grooves is greater than a width of the through-hole.

2. The lens substrate according to claim 1, wherein the plurality of grooves is formed at a same time as the through-hole is formed.

3. The lens substrate according to claim 1, wherein at least one of the plurality of grooves is tapered further towards the bottom portion of the substrate than a remainder of the plurality of grooves.

4. The lens substrate according to claim 1, wherein a width of one of the plurality of groove is greater than a depth of the one of the plurality of grooves.

5. The lens substrate according to claim 4, wherein a ratio of the width of the one of the plurality of grooves to the depth of the one of the plurality of grooves is 1.4.

6. The lens substrate according to claim 1, the substrate further including:
a second through-hole; and
a second lens disposed in the second through-hole, wherein the plurality of grooves is disposed between the through-hole and the second through-hole.

7. The lens substrate according to claim 6, wherein a width of a dicing area is less than a width of the plurality of grooves.

8. The lens substrate according to claim 1, wherein the substrate and a second substrate including a second through-hole with a second lens disposed therein are directly bonded to each other.

9. The lens substrate according to claim 8, wherein the substrate and the second substrate are directly bonded to each other using plasma bonding.

10. The lens substrate according to claim 8, wherein the plurality of grooves in the substrate overlaps a plurality of grooves formed in the second substrate in a direction perpendicular to a light-incident surface of the substrate.

11. The lens substrate according to claim 1, wherein the plurality of grooves surrounds the through-hole in a plan view.

12. The lens substrate according to claim 11, wherein an angle of a sidewall of the through-hole with respect to a surface of the substrate and angles of sidewalls of the plurality of grooves with respect to the surface of the substrate are all less than or equal to ninety degrees.

13. The lens substrate according to claim 12, wherein the through-hole and the plurality of grooves are formed by wet etching.

14. The lens substrate according to claim 1, the substrate further including:
a second through-hole,
a second lens disposed in the second through-hole, and
a second plurality of grooves disposed adjacent to the second through-hole in a cross-sectional view.

15. The lens substrate according to claim 14, wherein the plurality of grooves is adjacent to the second plurality of grooves.

16. The lens substrate according to claim 15, wherein a dicing area separates the plurality of grooves and the second plurality of grooves.

17. A method of manufacturing a semiconductor device, the method comprising:
forming a through-hole in a substrate;
forming a lens in the through-hole; and
forming a plurality of grooves adjacent to the through-hole in a cross-sectional view,
wherein the plurality of grooves is arranged in a zigzag configuration with each groove of the plurality of grooves tapering from a top portion of the substrate towards a bottom portion of the substrate, and
wherein a width of the plurality of grooves is greater than a width of the through-hole.

18. The method of manufacturing a semiconductor device according to claim 17, wherein at least one of the plurality of grooves is tapered further towards the bottom portion of the substrate than a remainder of the plurality of grooves.

19. An electronic apparatus comprising:
a camera module including a stacked lens structure, the stacked lens structure including:
a plurality of substrates, each substrate of the plurality of substrates including:
a through-hole with a lens disposed therein; and
a plurality of grooves disposed adjacent to the through-hole in a cross-sectional view,
wherein the plurality of grooves is arranged in a zigzag configuration with each groove of the plurality of grooves tapering from a top portion of the substrate towards a bottom portion of the substrate, and
wherein a width of the plurality of grooves is greater than a width of the through-hole.

20. The electronic apparatus according to claim 19, wherein at least one of the plurality of grooves is tapered further towards the bottom portion of the substrate than a remainder of the plurality of grooves.

* * * * *